(12) United States Patent
Furutani et al.

(10) Patent No.: US 10,303,058 B2
(45) Date of Patent: May 28, 2019

(54) PATTERN FORMING METHOD, TREATING AGENT, ELECTRONIC DEVICE, AND METHOD FOR MANUFACTURING THE SAME

(71) Applicant: FUJIFILM Corporation, Tokyo (JP)

(72) Inventors: Hajime Furutani, Haibara-gun (JP); Michihiro Shirakawa, Haibara-gun (JP); Akiyoshi Goto, Haibara-gun (JP); Masafumi Kojima, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 119 days.

(21) Appl. No.: 15/216,777

(22) Filed: Jul. 22, 2016

(65) Prior Publication Data

US 2016/0327866 A1    Nov. 10, 2016

Related U.S. Application Data

(63) Continuation of application No. PCT/JP2015/054161, filed on Feb. 16, 2015.

(30) Foreign Application Priority Data

Feb. 28, 2014  (JP) .................................. 2014-038764
Feb. 9, 2015   (JP) .................................. 2015-023657

(51) Int. Cl.
*G03F 7/16*   (2006.01)
*G03F 7/38*   (2006.01)
(Continued)

(52) U.S. Cl.
CPC .............. *G03F 7/16* (2013.01); *G03F 7/0397* (2013.01); *G03F 7/11* (2013.01); *G03F 7/2041* (2013.01);
(Continued)

(58) Field of Classification Search
CPC ..................................... G03F 7/16; G03F 7/38
See application file for complete search history.

(56) References Cited

U.S. PATENT DOCUMENTS

2007/0092843 A1* 4/2007 Yang .......................... G03F 7/11
                                                                    430/322
2008/0187860 A1   8/2008 Tsubaki et al.
(Continued)

FOREIGN PATENT DOCUMENTS

EP    2 530 525 A1   12/2012
JP    10-63001 A      3/1998
(Continued)

OTHER PUBLICATIONS

Machine translation of JP 2015045836 (Apr. 18, 2018).*
(Continued)

*Primary Examiner* — Kathleen Duda
(74) *Attorney, Agent, or Firm* — Sughrue Mion, PLLC

(57) ABSTRACT

A pattern forming method includes, in this order: a step (1) of forming a film on a substrate by using an actinic ray-sensitive or radiation-sensitive resin composition containing at least a resin having a group that is decomposed due to an action of an acid so as to generate a polar group; a step (2) of exposing the film; a step (3) of causing the exposed film to come into contact with a component that performs any one interaction of an ionic bond, a hydrogen bond, a chemical bond, and a dipole interaction with a polar group generated in the exposed film without substantially dissolving the exposed film; and a step (4) of forming a pattern by developing the exposed film by using a developer including an organic solvent and removing an area of the film having a small exposure amount.

8 Claims, 1 Drawing Sheet

(51) Int. Cl.
*G03F 7/039* (2006.01)
*G03F 7/11* (2006.01)
*G03F 7/20* (2006.01)
*G03F 7/32* (2006.01)
*G03F 7/26* (2006.01)

(52) U.S. Cl.
CPC ................ *G03F 7/26* (2013.01); *G03F 7/325* (2013.01); *G03F 7/38* (2013.01)

(56) References Cited

U.S. PATENT DOCUMENTS

2011/0250543 A1  10/2011  Tsubaki
2013/0164694 A1  6/2013  Wang et al.
2014/0349225 A1  11/2014  Yamamoto et al.
2016/0033870 A1  2/2016  Nakamura et al.

FOREIGN PATENT DOCUMENTS

| JP | 2006-3526 A | 1/2006 |
|---|---|---|
| JP | 2010-244062 A | 10/2010 |
| JP | 2012042531 A | 3/2012 |
| JP | 5056974 B1 | 10/2012 |
| JP | 2013-190784 A | 9/2013 |
| JP | 2014-211490 A | 11/2014 |
| JP | 2015-45836 A | 3/2015 |

OTHER PUBLICATIONS

International Preliminary Report on Patentability dated Sep. 6, 2016, in International Application No. PCT/JP2015/054161, with English translation of the Written Opinion, 15 pages in English and Japanese.
Communication dated May 23, 2017 from the Korean Intellectual Property Office in counterpart Application No. 10-2016-7020561.
Communication dated Jan. 10, 2017, from the Japanese Patent Office in counterpart Japanese application No. 2015-023657.
International Search Report for PCT/JP2015/054161 dated Apr. 14, 2015.
Office Action dated Jan. 8, 2018 from the Taiwanese Intellectual Property Office in counterpart Taiwanese Application No. 104106132.

* cited by examiner

PATTERN FORMING METHOD, TREATING AGENT, ELECTRONIC DEVICE, AND METHOD FOR MANUFACTURING THE SAME

CROSS-REFERENCE TO RELATED APPLICATIONS

This application is a Continuation of PCT International Application No. PCT/JP2015/541.61, filed on Feb. 16, 2015, which claims priority under 35 U.S.C. § 119(a) to Japanese Patent Application No. 2014-038764, filed on Feb. 28, 2014 and Japanese Patent Application No. 2015-023657, filed on Feb. 9, 2015. Each of the above application(s) is hereby expressly incorporated by reference, in its entirety, into the present application.

BACKGROUND OF THE INVENTION

1. Field of the Invention

The present invention relates to a pattern forming method used in a step of manufacturing a semiconductor such as an IC, manufacturing of a circuit substrate such as liquid crystal or a thermal head, and further other photo application lithography steps, a treatment agent used in the pattern forming method, a method for manufacturing an electronic device including the pattern forming method, and the electronic device. Specifically, the invention relates to a pattern forming method which is preferable in the exposure in an ArF exposure apparatus and an ArF liquid immersion-type projection exposure apparatus using a far ultraviolet ray having a wavelength of 300 nm or lower as a light source, a treating agent used in the pattern forming method, a method for manufacturing an electronic device, and an electronic device.

2. Description of the Related Art

A pattern forming method using chemical amplification, so as to compensate for desensitization due to light absorption after a resist for a KrF excimer laser (248 nm) has been used.

For example, JP5056974B discloses a pattern forming method in which a developer includes a nitrogen-containing compound in order to form a resist pattern that exhibits excellent lithography characteristics together with suppressing film thickness reduction of a resist film.

SUMMARY OF THE INVENTION

From an industrial point of view, conditions when a resist pattern is formed are preferably the same between lots, but may somewhat vary according to manufacturing conditions (temperature and humidity) or the like. Particularly, in the developing step when the resist pattern is formed, in order to change the viscosity of the developer or the like according to environmental conditions in the temperature, the humidity, or the like or change the supply amount of the developer depending on the state of a device used, the contact time between the resist pattern and the developer is varied between lots in some cases. Therefore, it is preferable that, even if the contact time between the resist pattern and the developer is changed, the shape of the formed pattern rarely changes, that is, the dependency of pattern forming properties on the developing process is low.

Considering production on an industrial scale, the developer when the resist pattern is formed is once stored and then is used, in many cases. Therefore, even after the developer is stored for a long period of time, it is desirable that developing properties which are the same as those before the storage are exhibited.

The present inventors performed pattern forming in the method disclosed in JP5056974B and found that shapes of the formed patterns are greatly different according to the fluctuation of the developing time. The present inventors also found that, if pattern forming was performed by using a developer after the developer including the nitrogen containing compound was stored for a certain period of time, the shape thereof were different from that of the pattern obtained by using the developer before the storage.

That is, in the pattern forming method disclosed in JP5056974B, the influence of the developing time on the pattern forming properties is large, and the developing properties in the case where the developer is used after being stored for a certain period of time are inferior. Therefore, from an industrial point of view, the pattern forming method disclosed in JP5056974B is not a method that can be necessarily satisfactory.

In view of these circumstances, the invention is for providing a pattern forming method in which the influence of the developing time on the pattern forming properties is suppressed, and in which, even after the developer is stored for a certain period of time, pattern forming properties which are the same as those before the storage are exhibited.

An object of the invention is for providing a treating agent used in the pattern forming method, a method for manufacturing an electronic device including the pattern forming method, an electronic device manufactured using the manufacturing method, and a developer used in the pattern forming method.

The present inventors have diligently studied the problems in the related art, and have thereby found that the problems can be solved by causing a predetermined component to come into contact with a film before the developing step.

That is, the present inventors have found that the objects above can be achieved by configurations described below.

(1) A pattern forming method comprising, in this order: a step (1) of forming a film on a substrate by using an actinic ray-sensitive or radiation-sensitive resin composition containing at least a resin having a group that decomposes due to an action of an acid so as to generate a polar group;

a step (2) of exposing the film;

a step (3) of causing the exposed film to come into contact with a component that performs any one interaction of an ionic bond, a hydrogen bond, a chemical bond, and a dipole interaction with a polar group generated in the exposed film without substantial dissolving the exposed film; and a step (4) of forming a pattern by developing the exposed film by using a developer including an organic solvent and removing an area of the film having a small exposure amount.

(2) The pattern forming method according to (1), in which the step (3) is a step of causing a treatment fluid including the component and a solvent that does not substantially dissolve the exposed film to come into contact with the exposed film.

(3) The pattern forming method according to (1) or (2), in which the component is a basic organic compound.

(4) The pattern forming method according to any one of (1) to (3), in which the component is a compound represented by Formula (3).

(5) The pattern forming method according to any one of claims (2) to (4), in which the solvent in the treatment fluid contains an alcohol-based solvent.

(6) The pattern forming method according to any one of (1) to (5), further comprising: a step (5) of developing the exposed film by using an alkali developer between the step (3) and the step (4) or after the step (4).

(7) A treating agent that is used in the pattern forming method according to any one of (1) to (6), comprising: components that performs any one interaction of an ionic bond, a hydrogen bond, a chemical bond, and a dipole interaction with a polar group generated in the exposed film, without substantially dissolving the exposed film.

(8) The treating agent according to (7), in which the component is a compound represented by Formula (3).

(9) The treating agent according to (7) or (8), further comprising: an alcohol-based solvent.

(10) A method for manufacturing an electronic device, comprising: the pattern forming method according to any one of (1) to (6).

(11) An electronic device manufactured by the method for manufacturing an electronic device according to (10).

According to the invention, it is possible to provide a pattern forming method in which the influence of the developing time on the pattern forming properties is suppressed, and in which, even after the developer is stored for a certain period of time, pattern forming properties which are the same as those before the storage are exhibited.

According to the invention, it is possible to provide a treating agent used in the pattern forming method, a method for manufacturing an electronic device including the pattern forming method, an electronic device manufactured by the manufacturing method, and a developer used in the pattern forming method.

DESCRIPTION OF THE PREFERRED EMBODIMENTS

Hereinafter, the embodiments of the invention are described in detail.

With respect to an expression of a group (atomic group) in this specification, expressions without "substituted" or "unsubstituted" include a group not having a substituent or a group having a substituent. For example, an expression "alkyl group" includes an alkyl group not having a substituent (unsubstituted alkyl group) and also an alkyl group having a substituent (substituted alkyl group).

An "active light ray" or "radiation" in the specification means, for example, a bright line spectrum of a mercury lamp, or a far ultraviolet ray, an extreme ultraviolet ray (EUV ray), an X ray, or an electron beam (EB) represented by an excimer laser. According to the invention, light refers to an active light ray or radiation.

With respect to the "exposure" in this specification, unless described otherwise, in addition to exposure by a mercury lamp or a far ultraviolet ray, an extreme ultraviolet ray (EUV ray), and an X ray represented by an excimer laser, drawing by a particle ray such as an electron beam, or an ion beam.

In this specification, the numerical range indicated by using "to" means a range including numerical values before and after "to" as minimum and maximum values.

In the specification, "(meth)acrylate" represents acrylate and methacrylate, "(meth)acryl" represents acryl and methacryl, and "(meth)acryloyl" represents acryloyl and methacryloyl.

Characteristics of the invention include a step of causing a predetermined component and an exposed film to come into contact with each other and then a step of developing an exposed film in a developer including an organic solvent. Hereinafter, with reference to the drawings, characteristics of the invention are described.

First, in the method disclosed in the related art (JP5056974B), since the nitrogen containing compound is included in the developer, when the film is developed, insolubilization due to a nitrogen containing compound in an exposure area of a film and development in an unexposed area progress at the same time. Therefore, easiness of the development varies according to the contact time between the developer and the film. Accordingly, it is necessary to strictly control the contact time between the developer and the film. Since the nitrogen containing compound is contained in the developer, in the method of JP5056974B, if the developer is left for a predetermined period of time, a nitrogen containing compound easily occurs reaction with the component in the developer, the component changes, and as a result, pattern forming properties before or after the storage of the developer change.

Figure 1A:
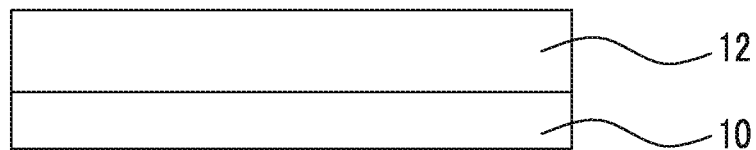
FIGS. 1A to 1D are sectional views illustrating one form of a pattern forming method according to the invention, in an order of steps.
Figure 1B:
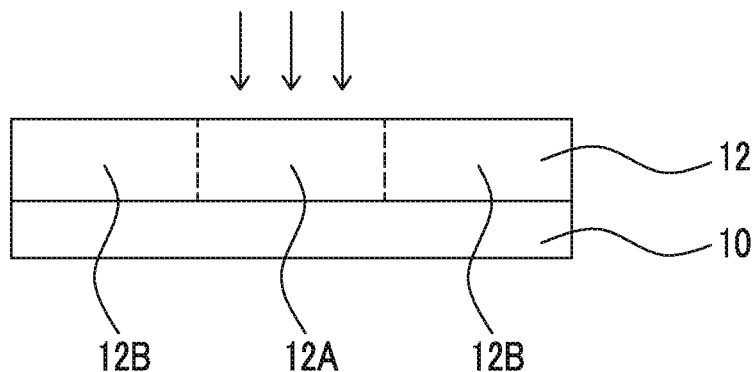
Figure 1C:
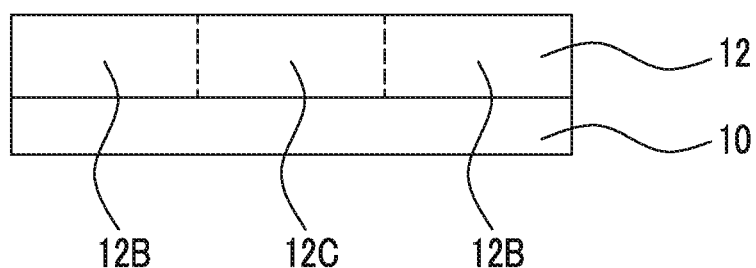
Figure 1D:
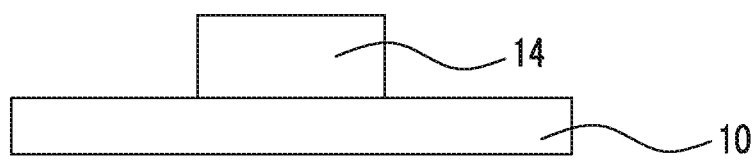

Meanwhile, according to the invention, first, as illustrated in FIG. 1A, the actinic ray-sensitive or radiation-sensitive resin composition containing at least a resin having a group that is decomposed due to an action of an acid so as to generate a polar group is used so as to form a film 12 including the resin on a substrate 10 and subsequently exposure is performed in a direction indicated by an arrow as illustrated in FIG. 1B. At this point, an exposure area 12A and an unexposed area 12B are formed on the film 12. In the exposure area 12A, a polar group is generated. Subsequently, the exposed film 12 is brought into contact with the component for forming a predetermined interaction with the polar group. At this point, as illustrated in FIG. 1C, in the exposure area 12A of the film 12, an area 12C in which an interaction between a polar group and the component is formed, and dissolving properties to the developer decrease is formed. Subsequently, as illustrated in FIG. 1D, if the film 12 is developed using a developer including an organic solvent, a portion corresponding to the area 12C in FIG. 1C remains, so as to form a pattern 14. According to the invention, since the insolubilization of the exposure area and the development of the unexposed area are performed in different steps as described above, influence of the developing time on the pattern forming properties is small, differently from the related art. Developer components such as the nitrogen containing compounds and components that easily perform reaction are not included in the developer. Therefore, even after the developer is stored for a long period of time, pattern forming properties which are the same as those before the storage are exhibited.

The pattern forming method according to the invention comprises has at least four steps as below:

(1) a step of forming a film on a substrate by using an actinic ray-sensitive or radiation-sensitive resin composition containing at least a resin having a group that is decomposed due to an action of an acid so as to generate a polar group, (2) a step of exposing the film, (3) a step of causing the exposed film and a component that performs any one interaction of an ionic bond, a hydrogen bond, a chemical bond, and a dipole interaction, with a polar group in the exposed film, without substantially dissolving the exposed film to come into contact with each other, and (4) a step of forming a pattern by developing the exposed film using a developer including an organic solvent and removing an area of the film with a small exposure amount.

Hereinafter, respective steps are described.

[Step (1): Film Forming Step]

Step (1) is a step of forming a film (hereinafter, also referred to as a resist film) on a substrate by using an actinic ray-sensitive or radiation-sensitive resin composition.

First, materials used in this step are described, and then a sequence of Step (1) is described.

<Actinic Ray-Sensitive or Radiation-Sensitive Resin Composition>

Hereinafter, the actinic ray-sensitive or radiation-sensitive resin composition (hereinafter, referred to as "composition" or "composition for forming resist film") used in the invention is described.

An actinic ray-sensitive or radiation-sensitive resin composition is typically a resist composition and a negative resist composition (that is, a resist composition for developing an organic solvent). An actinic ray-sensitive or radiation-sensitive resin composition is typically a chemical amplification-type resist composition.

A resin (A) (hereinafter, referred to as a "acid-decomposable resin" or a "resin (A)") that is decomposed due to an action of an acid so as to generate a polar group is included in the composition. The resin (A) may have a polar group at a timing of immediately before the exposure treatment.

First, the resin (A) and other arbitrary components are described in detail.

[1] Resin Having Group that is Decomposed Due to Action of Acid so as to Generate Group Having Polar Group Examples of the resin (A) having a group that is contained in the composition used in the invention and is decomposed due to an action of an acid so as to generate a polar group include a resin having a group that is decomposed due to an action of an acid so as to generate a polar group (hereinafter, referred to as an "acid-decomposable group") on a main chain or a side chain of the resin, or both of the main chain and the side chain.

The acid-decomposable group is a group that is decomposed due to an action of an acid and released and preferably have a structure in which a polar group is protected. Preferable examples of the polar group include a carboxyl group, a phenolic hydroxyl group, an alcoholic hydroxyl group (alcoholic properties refer to properties not exhibiting acidity similarly as a so-called phenolic hydroxyl group), and a sulfonic acid group.

A group preferable as the acid-decomposable group is a group substituted with a group of which a hydrogen atom is released due to an acid.

Examples of the groups that are released by an acid include —C($R_{36}$)($R_{37}$)($R_{38}$), —C($R_{36}$)($R_{37}$)(O$R_{39}$), and —C($R_{01}$)($R_{02}$)(O$R_{39}$).

In the formula, each of $R_{36}$ to $R_{39}$ independently represents a (monocyclic or polycyclic) alkyl group, a cycloalkyl group, an aryl group, an aralkyl group, or an alkenyl group. $R_{36}$ and $R_{37}$ may be bonded to each other to form a ring.

Each of $R_{01}$ and $R_{02}$ independently represents a hydrogen atom, an (monocyclic or polycyclic) alkyl group, a cycloalkyl group, an aryl group, an aralkyl group, or an alkenyl group.

The acid-decomposable group is preferably a cumyl ester group, an enol ester group, an acetal ester group, a tertiary alkyl ester group, or the like, and more preferably a tertiary alkyl ester group. In the case where the pattern forming method of the invention is performed by exposure with KrF light or EMT light, or irradiation with electron beams, it is preferable to use an acid-decomposable group having a phenolic hydroxyl group protected by an acid releasable group.

The resin (A) preferably has a repeating unit having an acid-decomposable group.

Examples of this repeating unit include the followings.

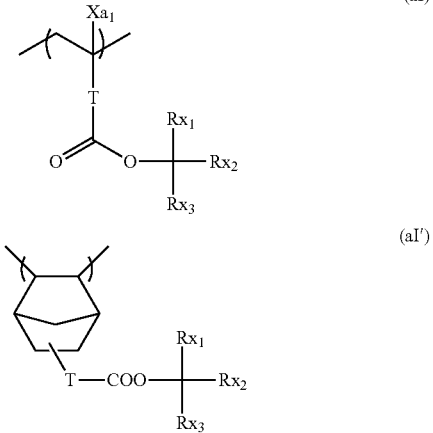

In General Formulae (aI) and (aI'), $Xa_1$ represents a hydrogen atom, an alkyl group, cyano group, or a halogen atom.

T represents a single bond or a bivalent linking group.

Each of $Rx_1$ to $Rx_3$ independently represents an alkyl group or a cycloalkyl group. Two of $Rx_1$ to $Rx_3$ may be bonded to form a ring structure. This ring structure may include a hetero atom such as an oxygen atom in the ring.

Examples of the bivalent linking group of T include an alkylene group, a —COO-Rt-group, a —O-Rt-group, and a phenylene group. In the formula, Rt represents an alkylene group or a cycloalkylene group.

In view of insolubilization of the resist with respect to an organic solvent-based developer, T in General Formula (aI) is preferably a single bond or a —COO-Rt-group and more preferably a —COO-Rt-group. Rt is preferably an alkylene group having 1 to 5 carbon atoms, and a —$CH_2$— group, a —$(CH_2)_2$— group, and a —$(CH_2)_3$— group are more preferable.

T in General Formula (aI') is preferably a single bond.

An alkyl group as $Xa_1$ may have a substituent, and examples of the substituent include a hydroxyl group, and a halogen atom (preferably, a fluorine atom).

The alkyl group as $Xa_1$ is preferably a group having 1 to 4 carbon atoms, and a methyl group is preferable.

$X_{a1}$ is preferably a hydrogen atom or a methyl group.

The alkyl groups as $Rx_1$, $Rx_2$, and $Rx_3$ may have a linear shape or a branched shape.

The cycloalkyl groups as $Rx_1$, $Rx_2$, and $Rx_3$ are preferably a monocyclic cycloalkyl group such as a cyclopentyl group, and a cyclohexyl group, and a polycyclic cycloalkyl group such as a norbornyl group, a tetracyclodecanyl group, a tetracyclododecanyl group, and an adamantyl group.

The ring structure formed by bonding two of $Rx_1$, $Rx_2$, and $Rx_3$ is preferably a monocyclic cycloalkane ring such as a cyclopentyl ring, and a cyclohexyl ring, and a polycyclic cycloalkane ring such as a norbornane ring, a tetracyclodecane ring, a tetracyclododecane ring, and an adamantane ring. A monocyclic cycloalkane ring having 5 or 6 carbon atoms is particularly preferable.

Each of $Rx_1$, $Rx_2$, and $Rx_3$ independently is preferably an alkyl group, and more preferably a straight chain or branched alkyl group having 1 or 4 carbon atoms.

The respective groups described above may have a substituent. Examples of the substituent include an alkyl group (having 1 to 4 carbon atoms), a cycloalkyl group (having 3 to 8 carbon atoms), a halogen atom, an alkoxy group (having 1 to 4 carbon atoms), a carboxyl group, and an alkoxycarbonyl group (having 2 to 6 carbon atoms), and a group having 8 or less carbon atoms is preferable. Among them, in view of further enhancing dissolution contrast with respect to the developer including the organic solvent before and after acid decomposition, it is more preferable that the substituent is a group not having a heteroatom such as an oxygen atom, a nitrogen atom, and a sulfur atom (for example, it is preferable that the group is not an alkyl group or the like that is substituted with a hydroxyl group), it is even more preferable that the substituent is a group formed of a hydrogen atom and a carbon atom only, and it is particularly preferable that the substituent is a straight chain or branched alkyl group or a cycloalkyl group.

Hereinafter, specific examples of the repeating unit having an acid-decomposable group are described below, but the invention is not limited to the specific examples.

In the specific examples, Rx represents a hydrogen atom, $CH_3$, $CF_3$, or $CH_2OH$. Rxa and Rxb respectively represent an alkyl group having 1 to 4 carbon atoms. $Xa_1$ represents a hydrogen atom, $CH_3$, $CF_3$, or $CH_2OH$. Z represents a substituent, and in the case where there are plural Z's, the plural Z's may be identical to or different from each other. p represents 0 or a positive integer. Specific examples and preferred examples of Z are identical to specific examples and preferred examples of the substituents that may be included in respective groups such as $Rx_1$ to $Rx_3$.

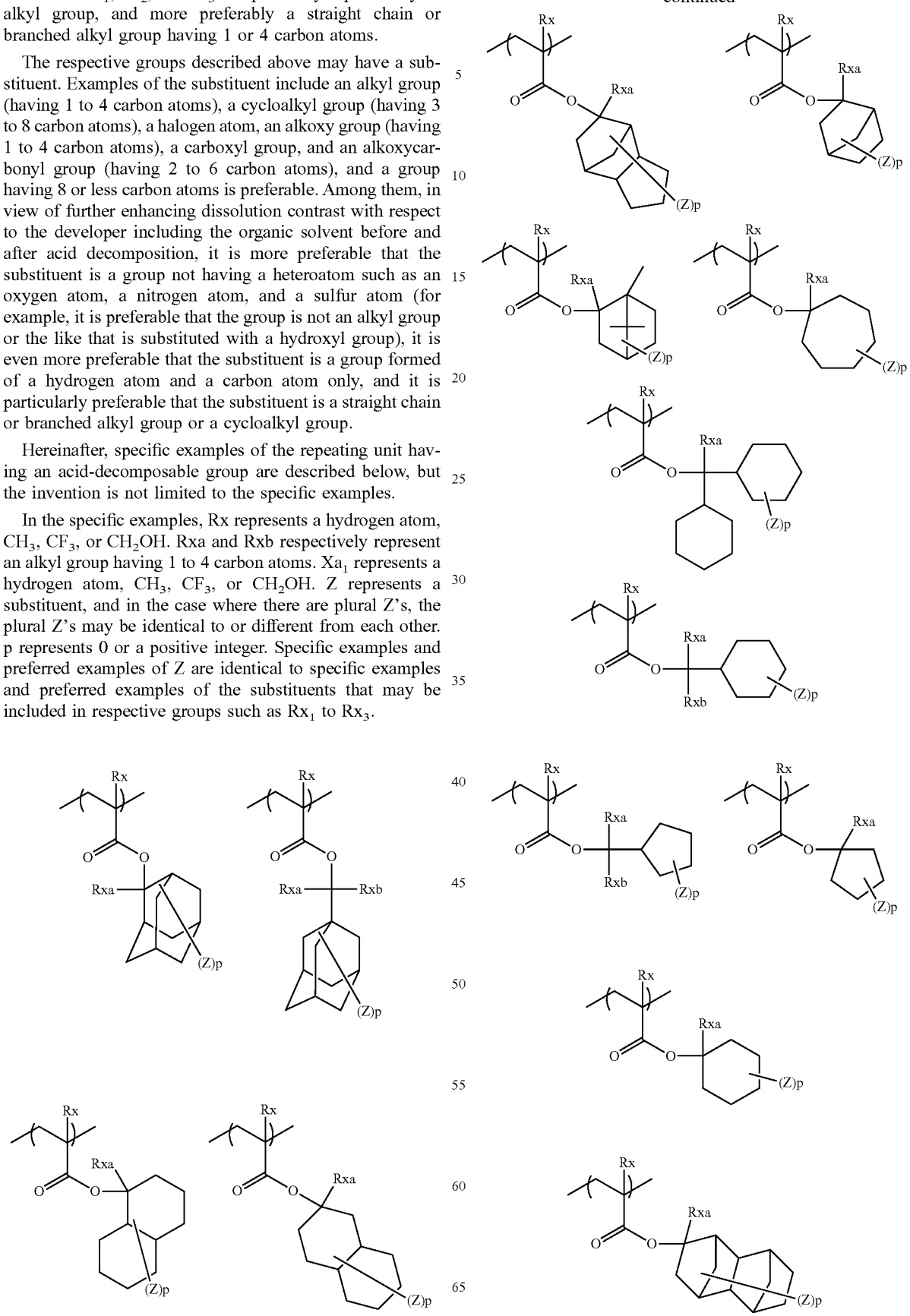

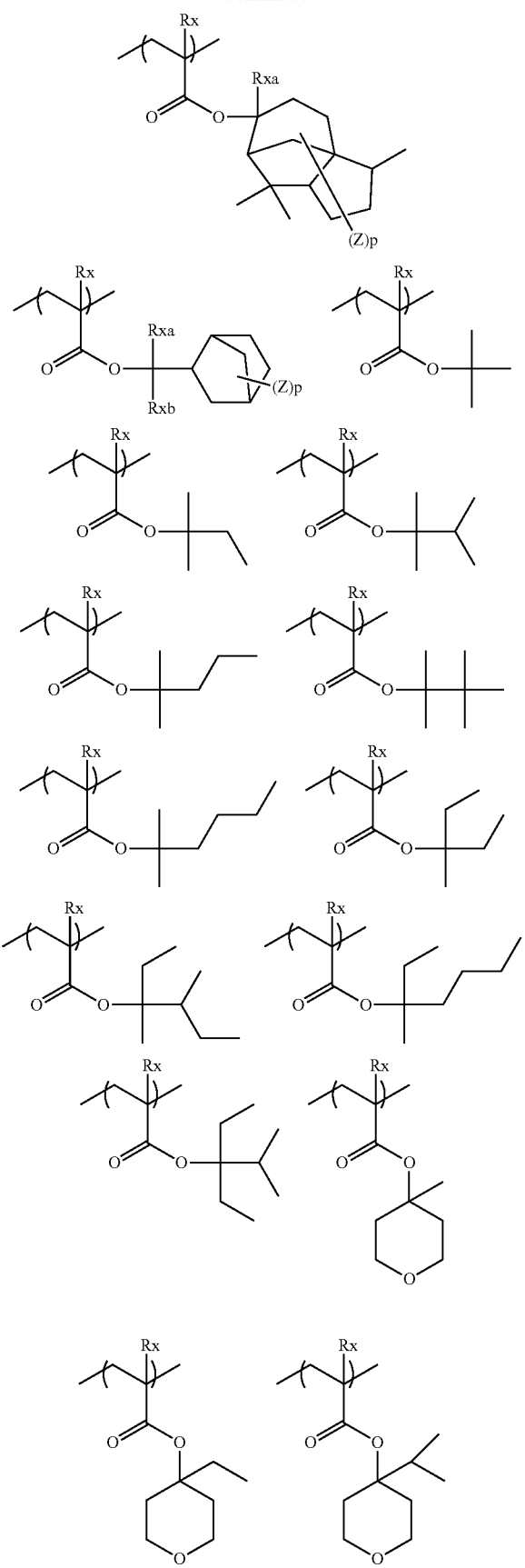
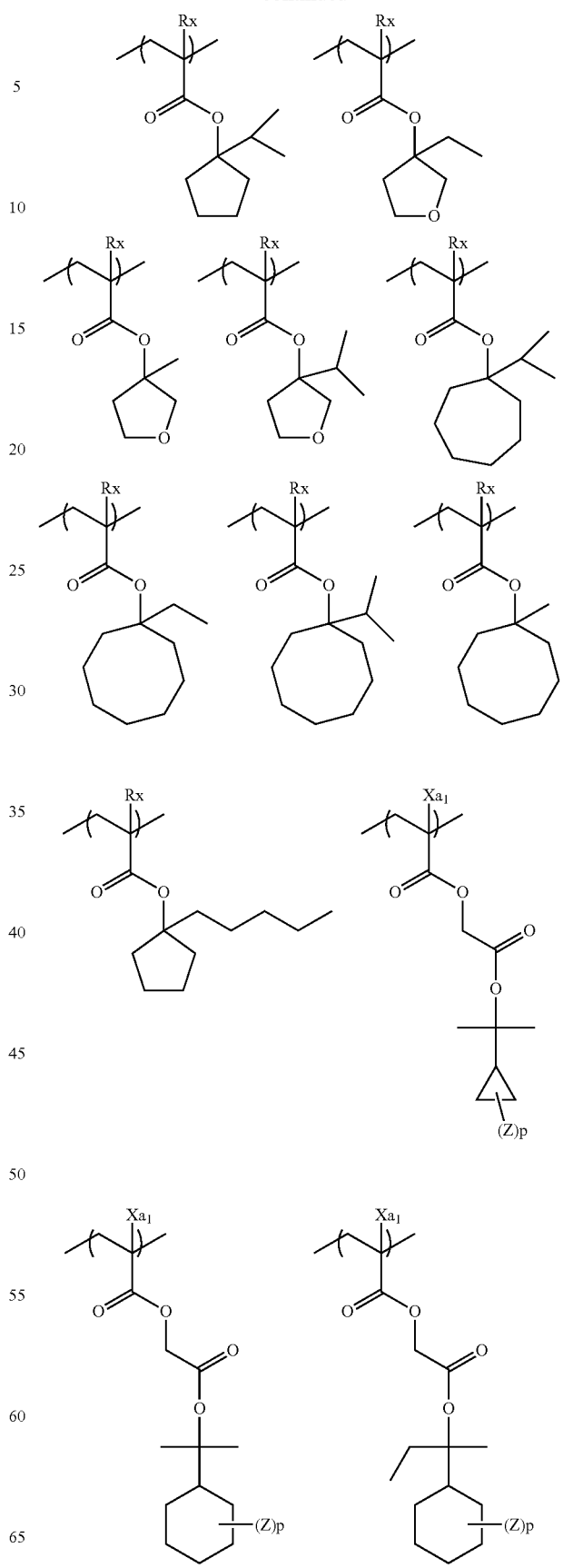

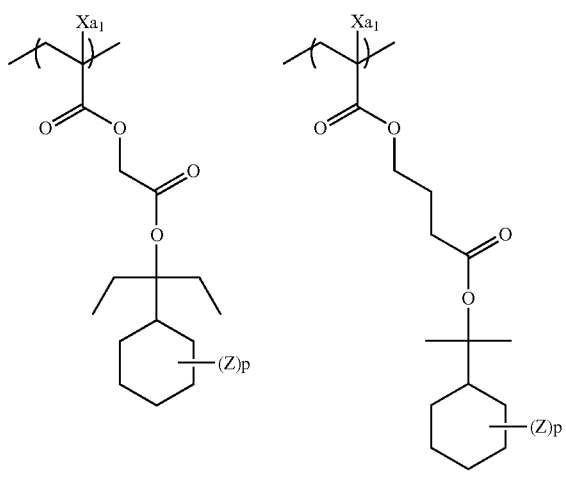
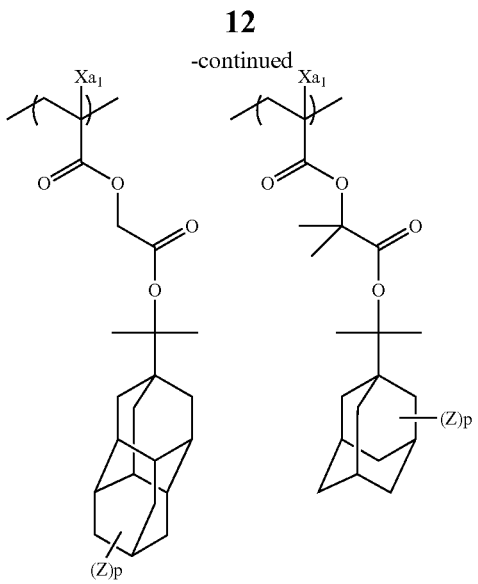
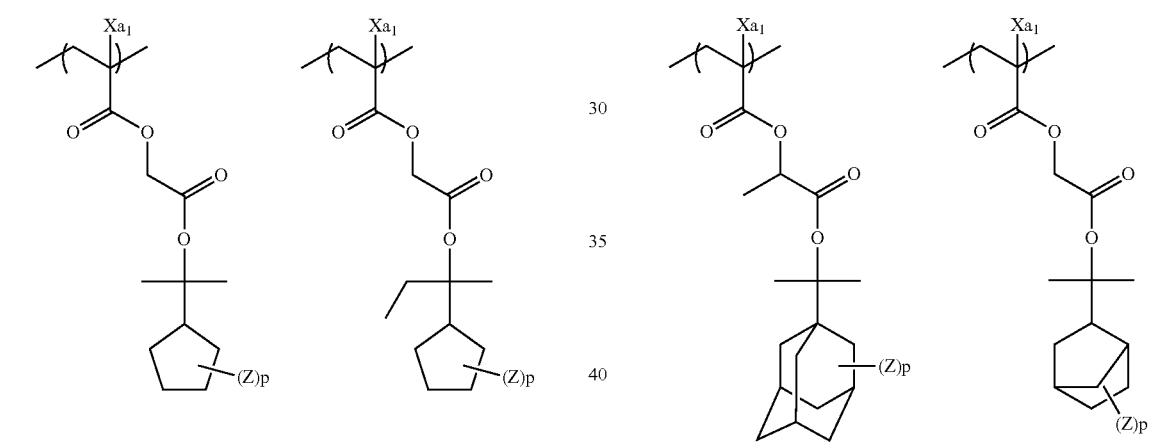
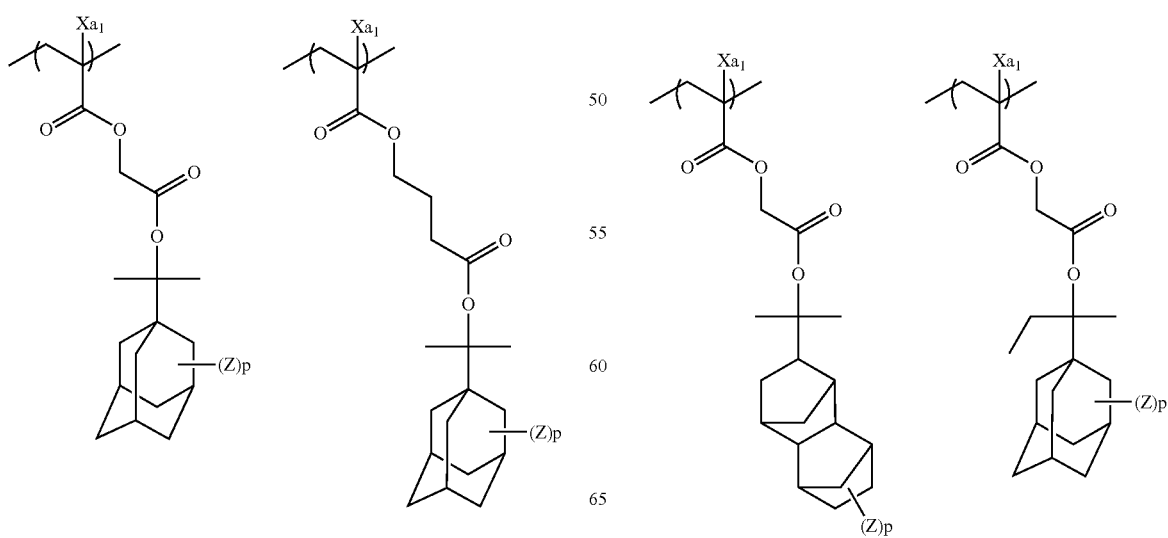

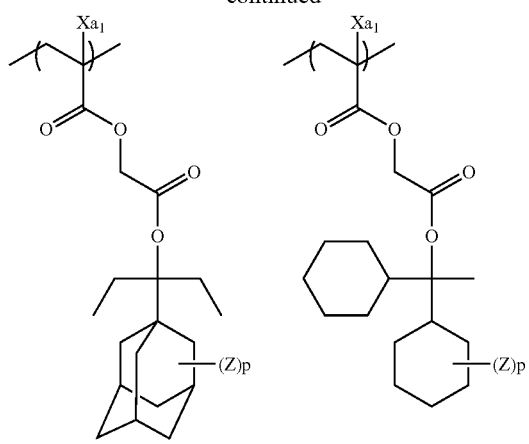
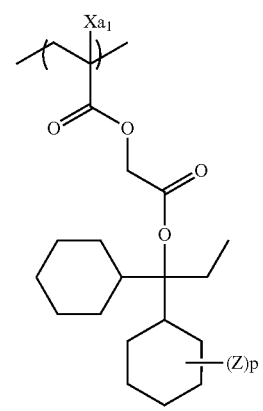
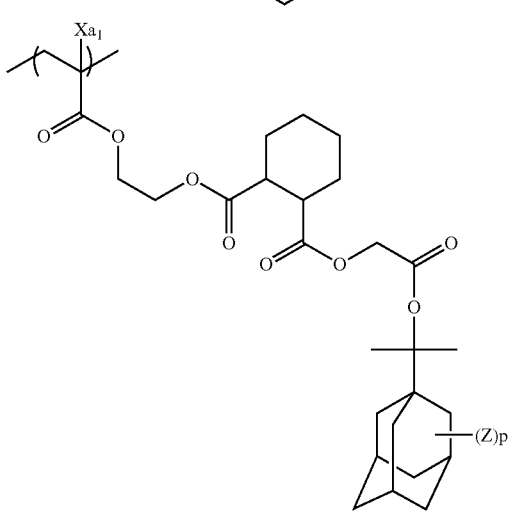
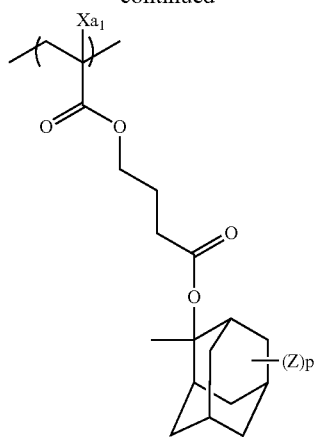
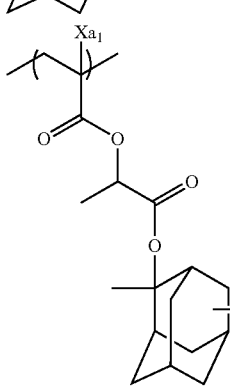
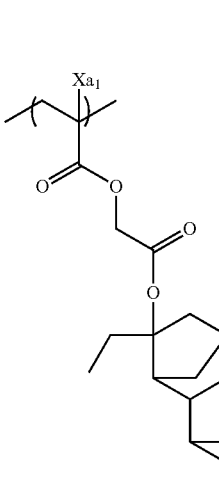

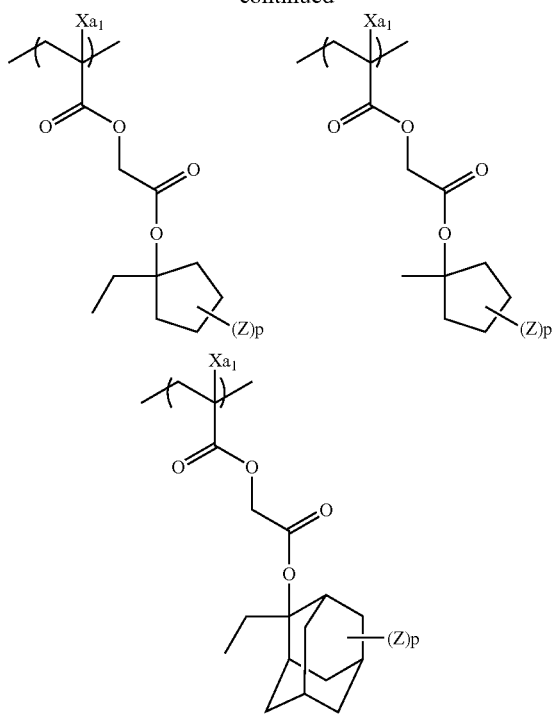
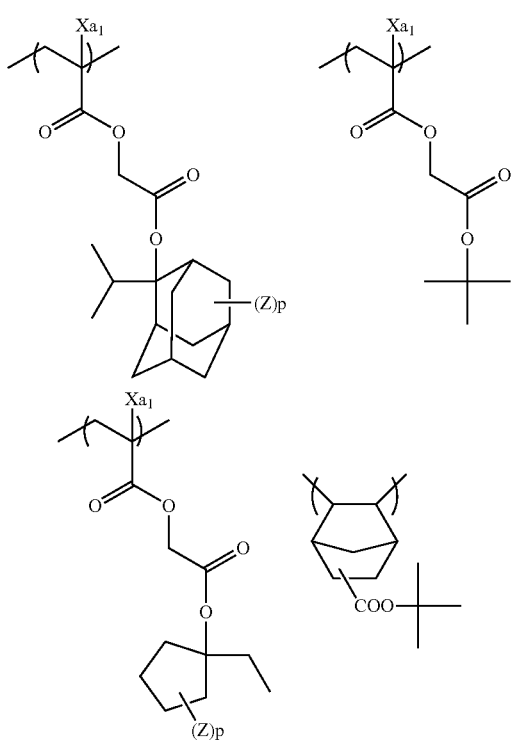
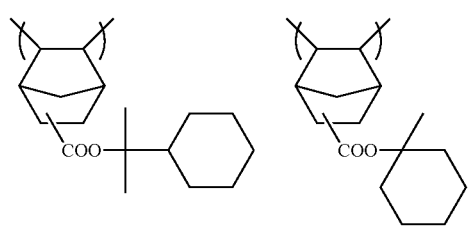
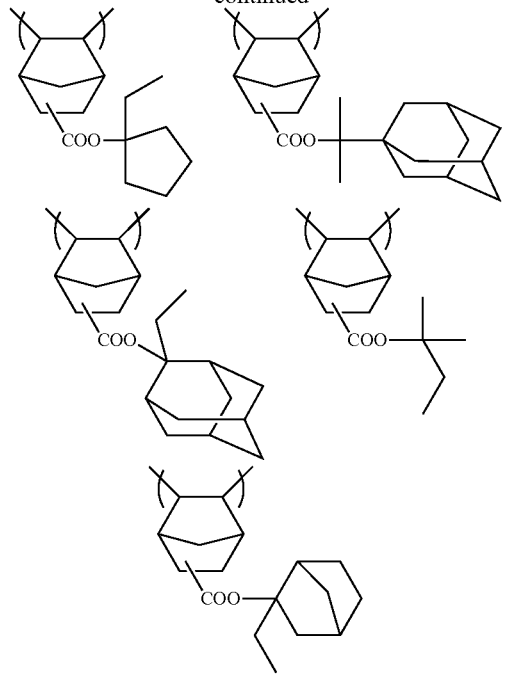
In the specific examples below, Xa represents a hydrogen atom, an alkyl group, a cyano group, or a halogen atom.
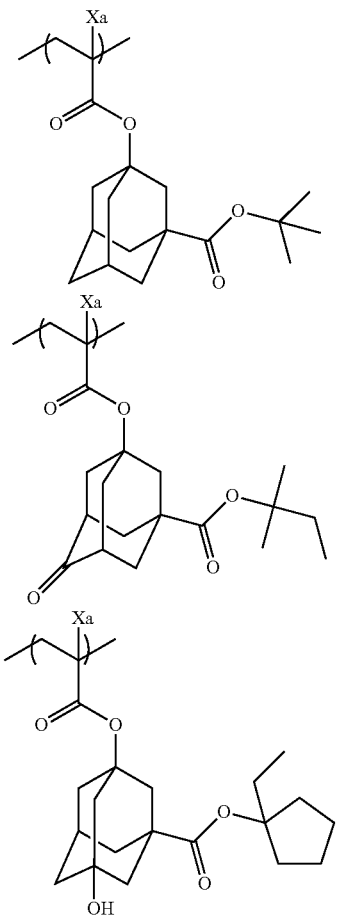

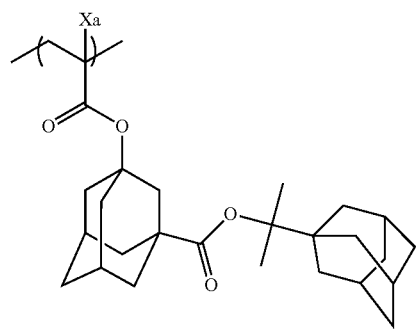
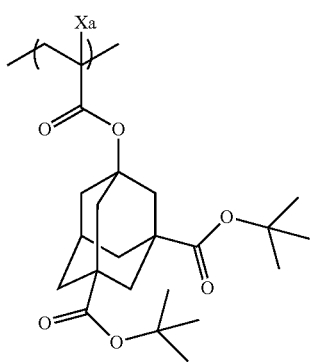
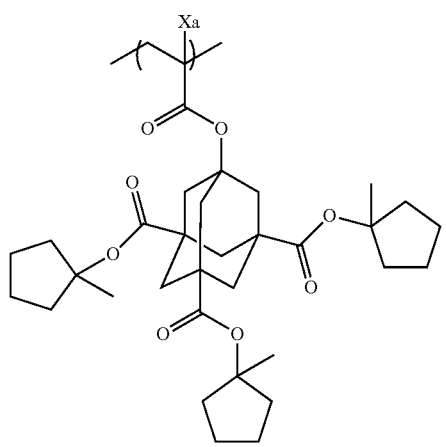
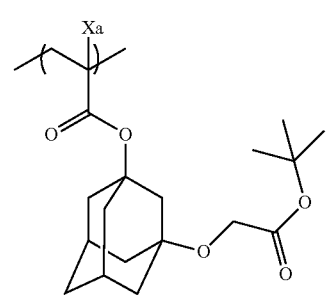
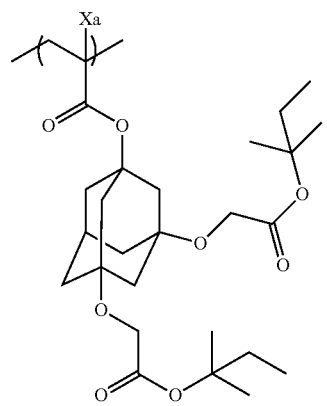
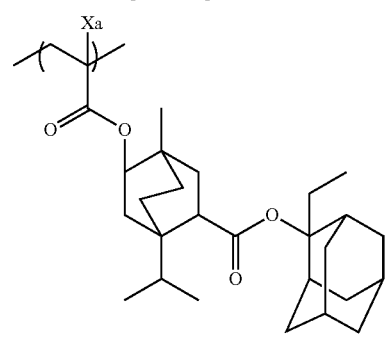
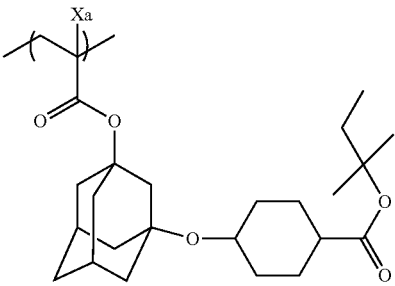
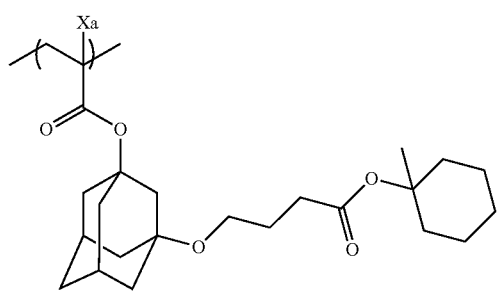
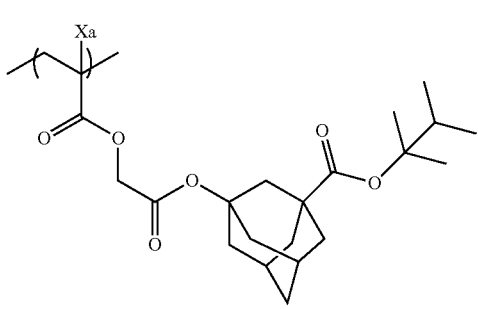

-continued
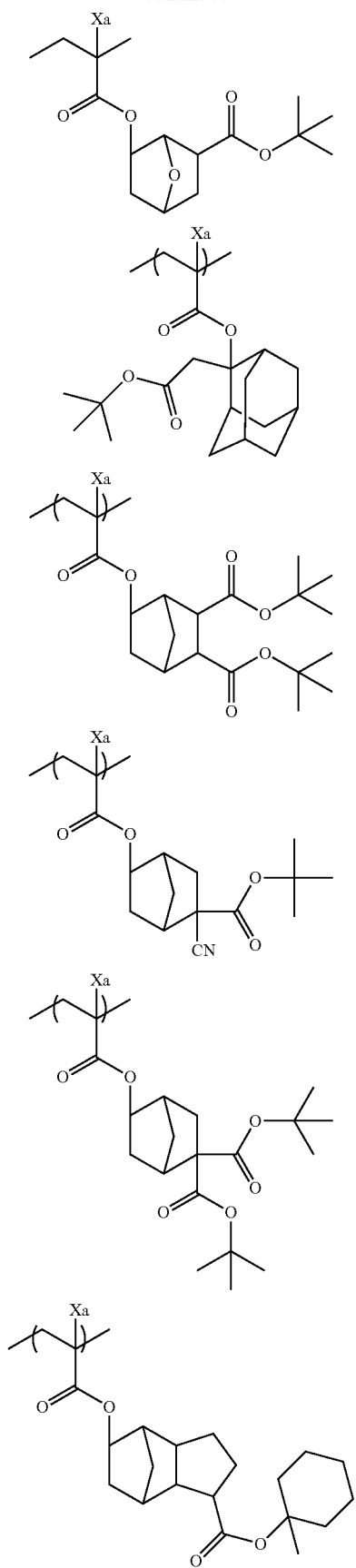
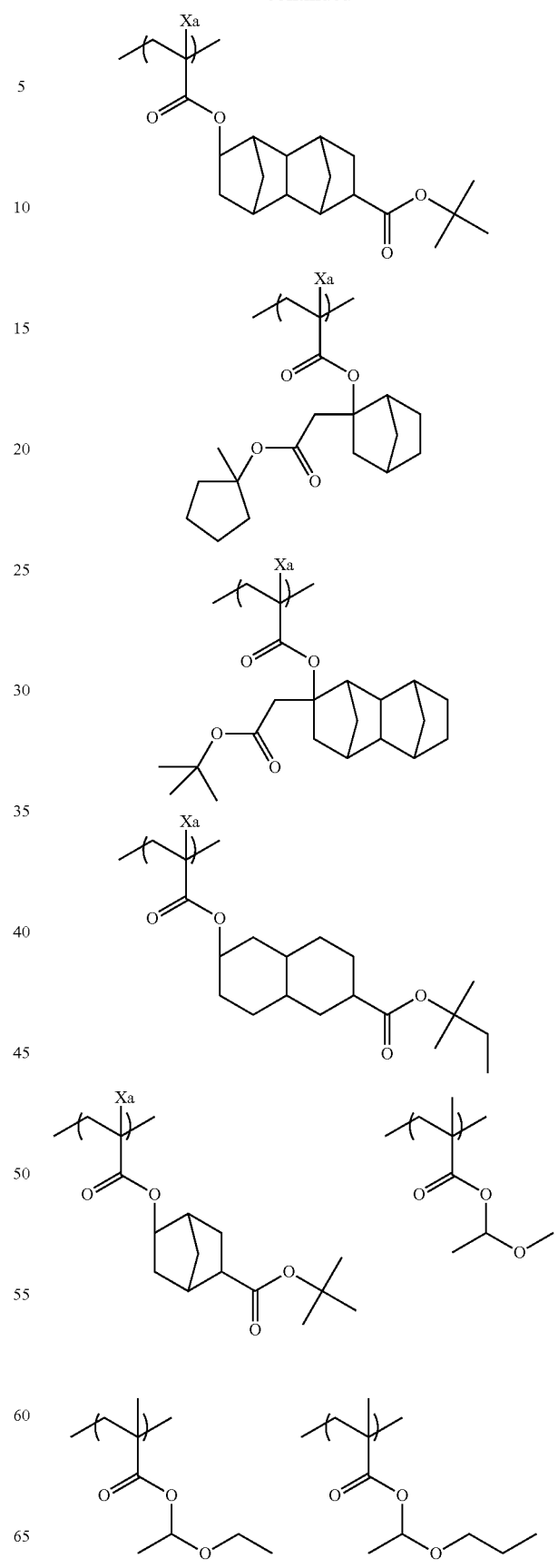

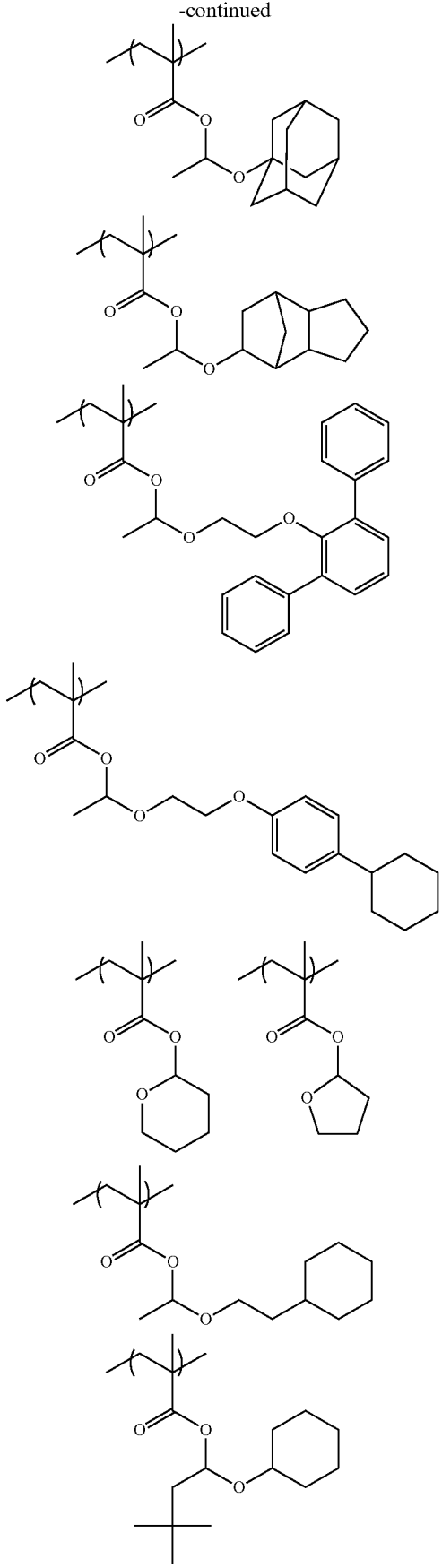
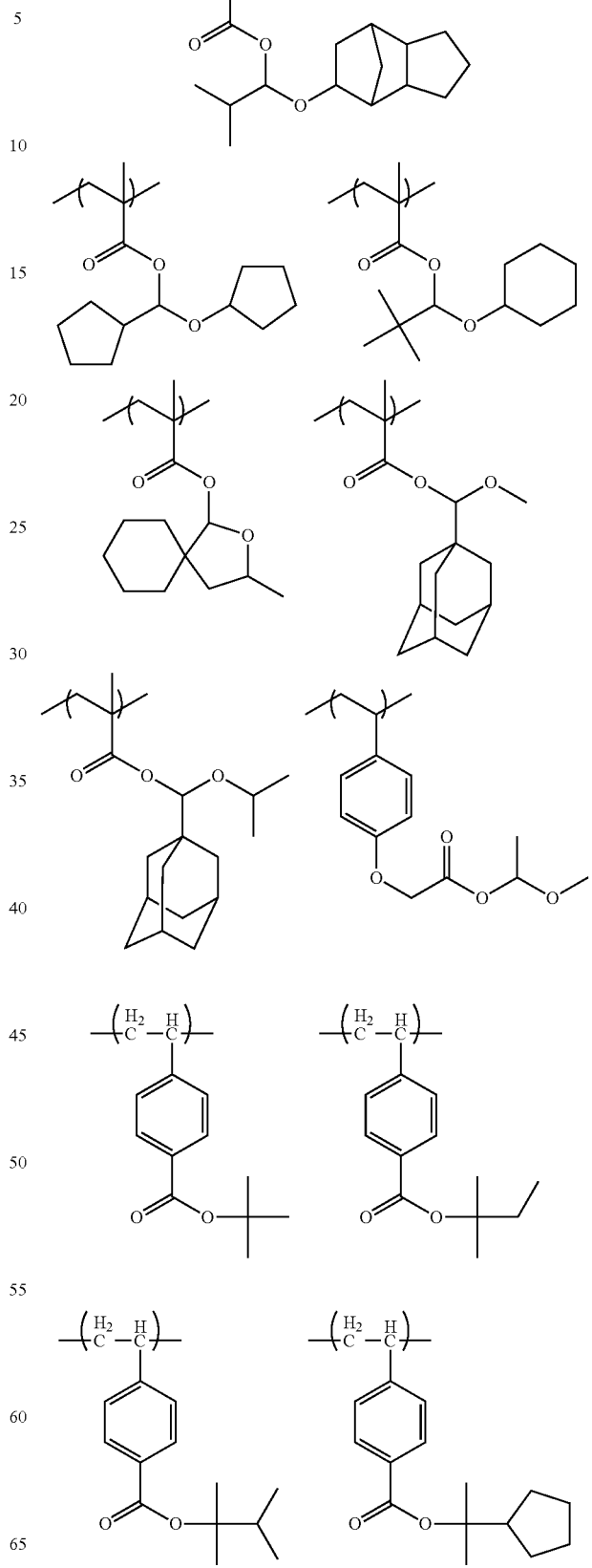

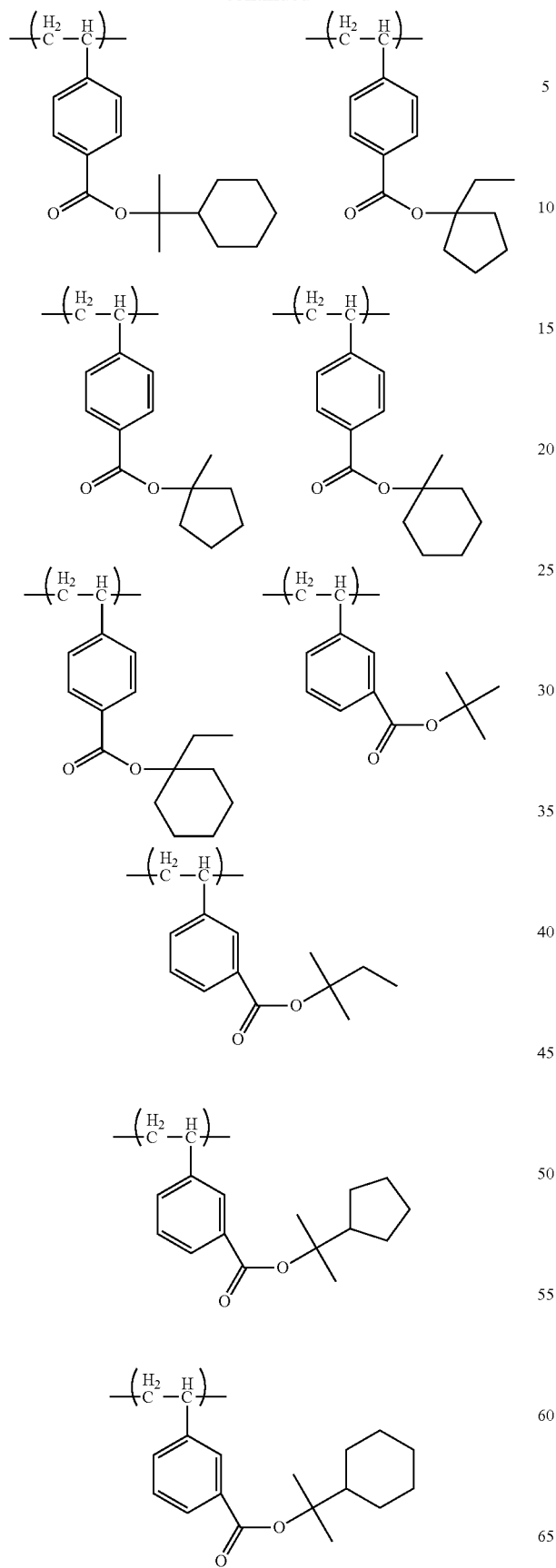
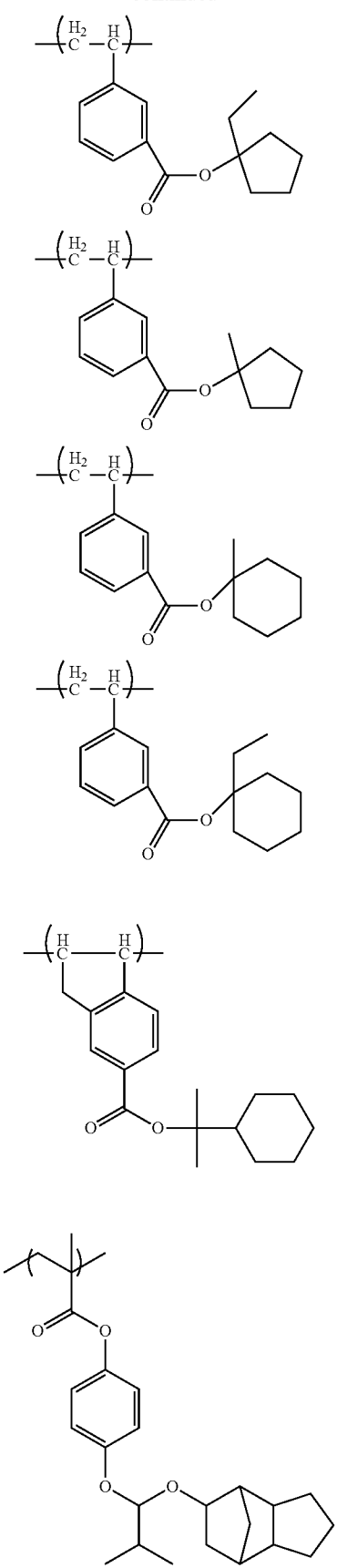

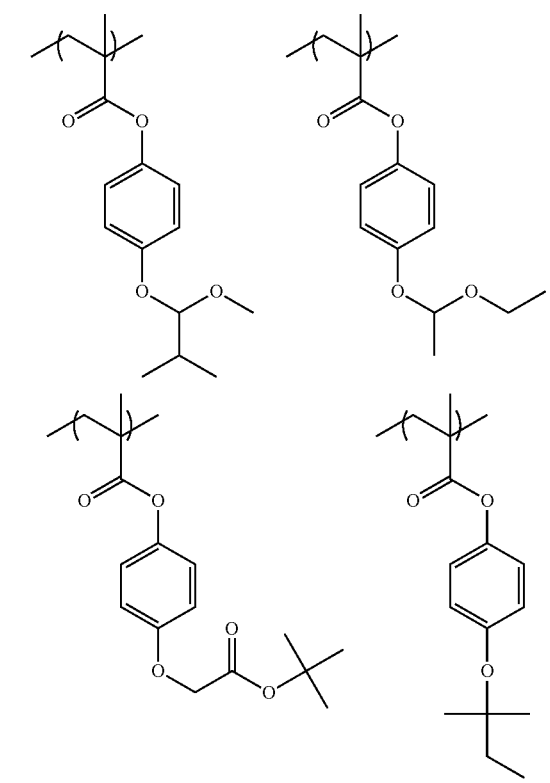
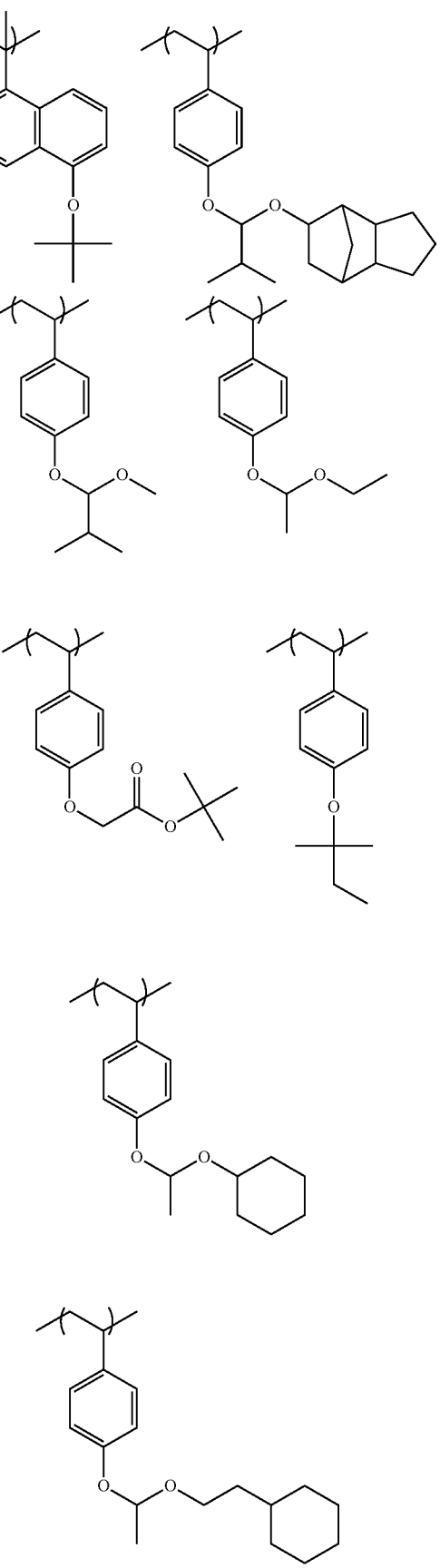

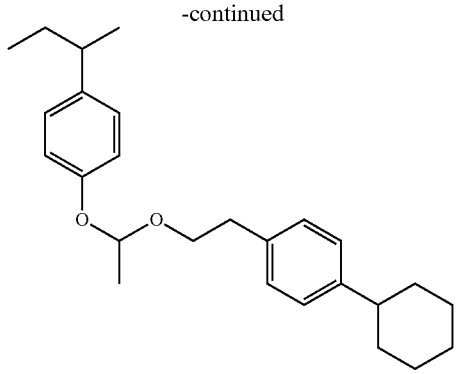
Specific examples as below are repeating units having structures in which alcoholic hydroxyl groups are protected with groups that are decomposed due to an action of an acid and released. In specific examples, $Xa_1$ represents a hydrogen atom, $CH_3$, $CF_3$, or $CH_2OH$.
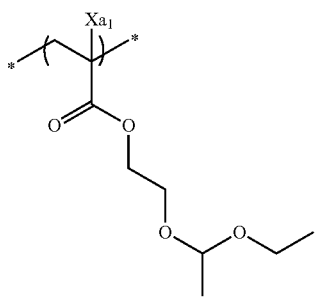
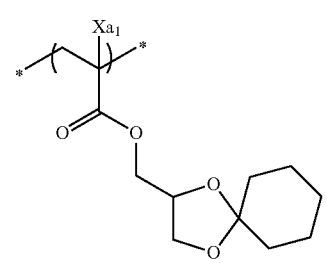
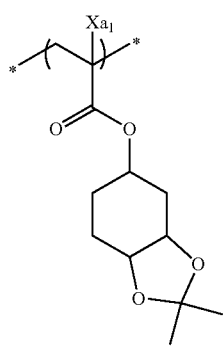
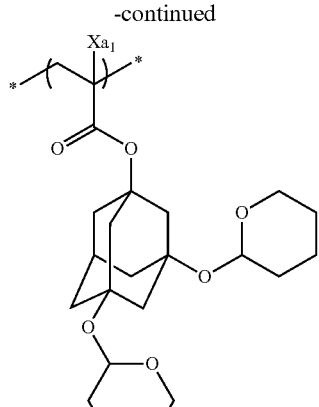
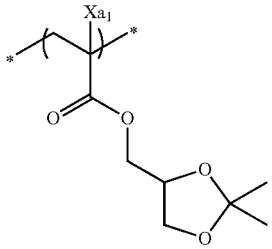
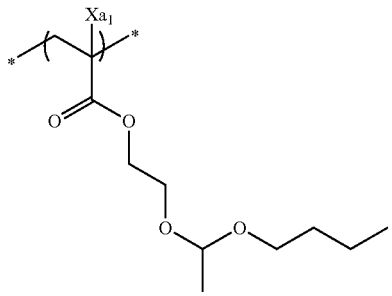
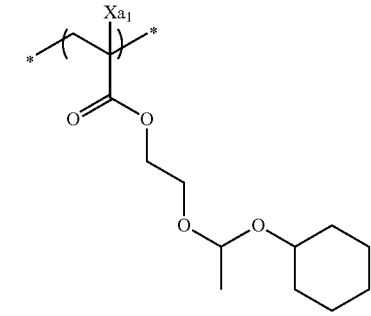
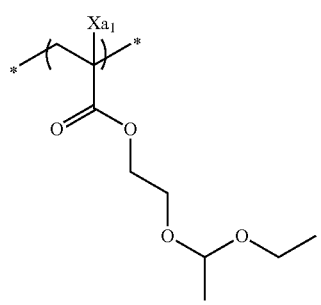

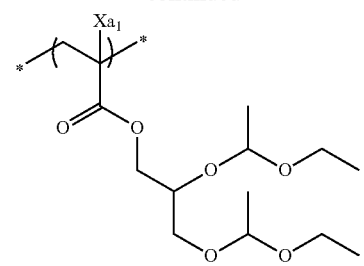
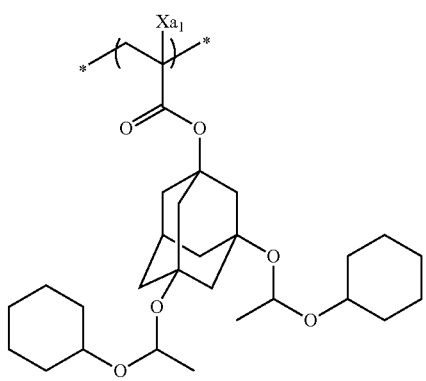
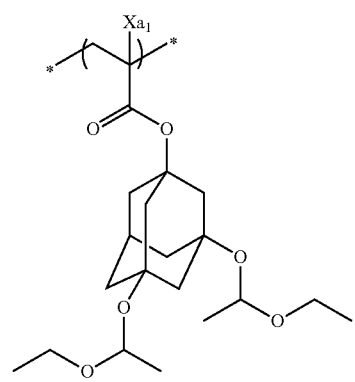
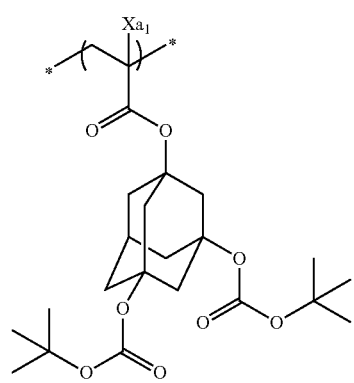

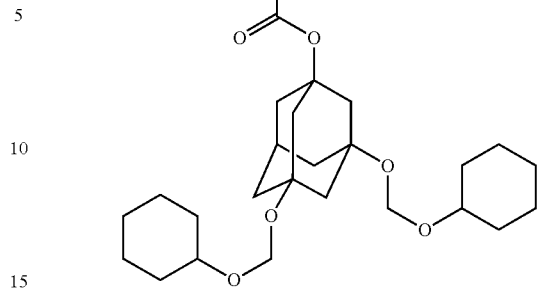
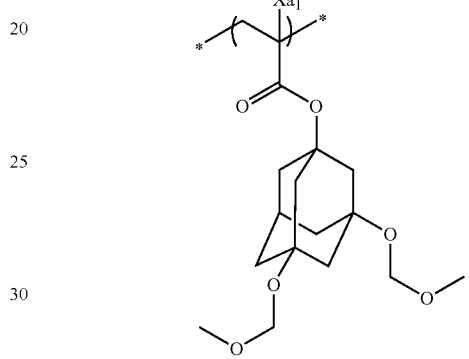
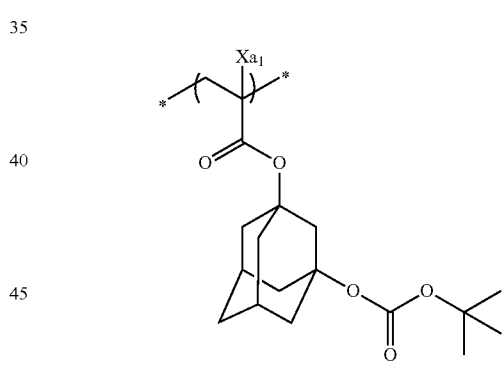

The repeating unit having an acid-decomposable group may be used singly or two or more types thereof may be used in combination. In the case where two or more types thereof are used in combination, the combination thereof is not particularly limited. Examples thereof include (1) a combination of a repeating unit that is decomposed due to an action of an acid so as to generate a carboxyl group and a repeating unit that is decomposed due to an action of an acid so as to generate an alcoholic hydroxyl group, (2) a combination of a repeating unit that is decomposed due to an action of an acid so as to generate a carboxyl group and a repeating unit that is decomposed due to an action of an acid so as to generate a phenolic hydroxyl group, and (3) a combination of two types of repeating units that are decomposed due to an action of an acid so as to generate carboxyl groups (having different structures). Among these, preferable combinations in the case of (3) are exemplified as references.

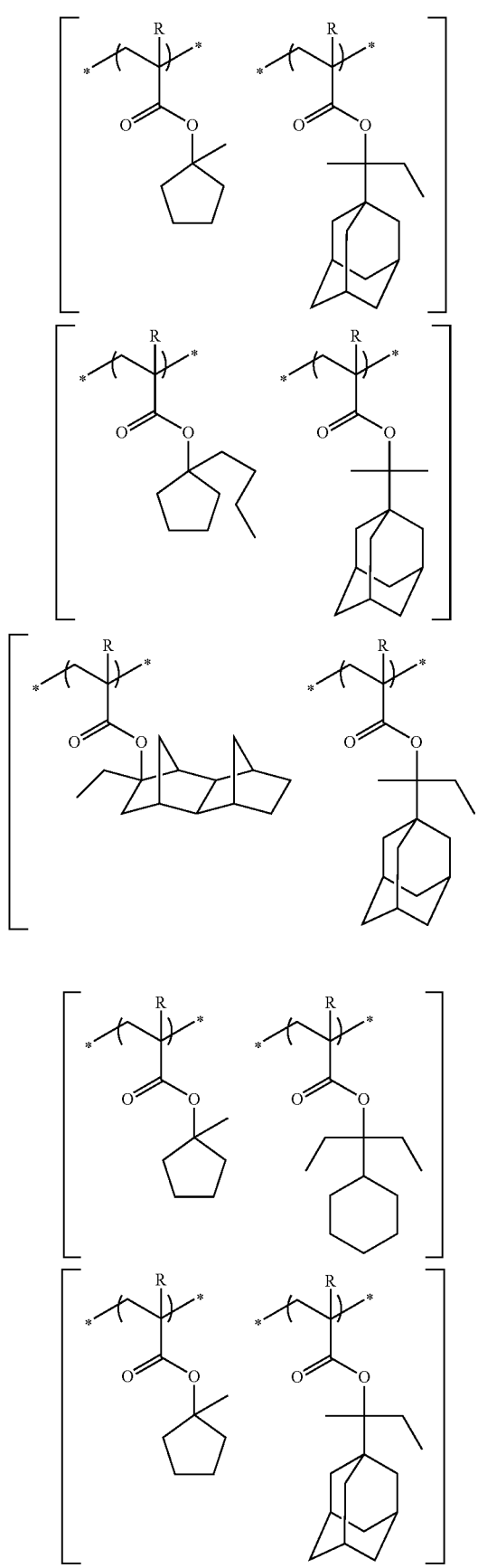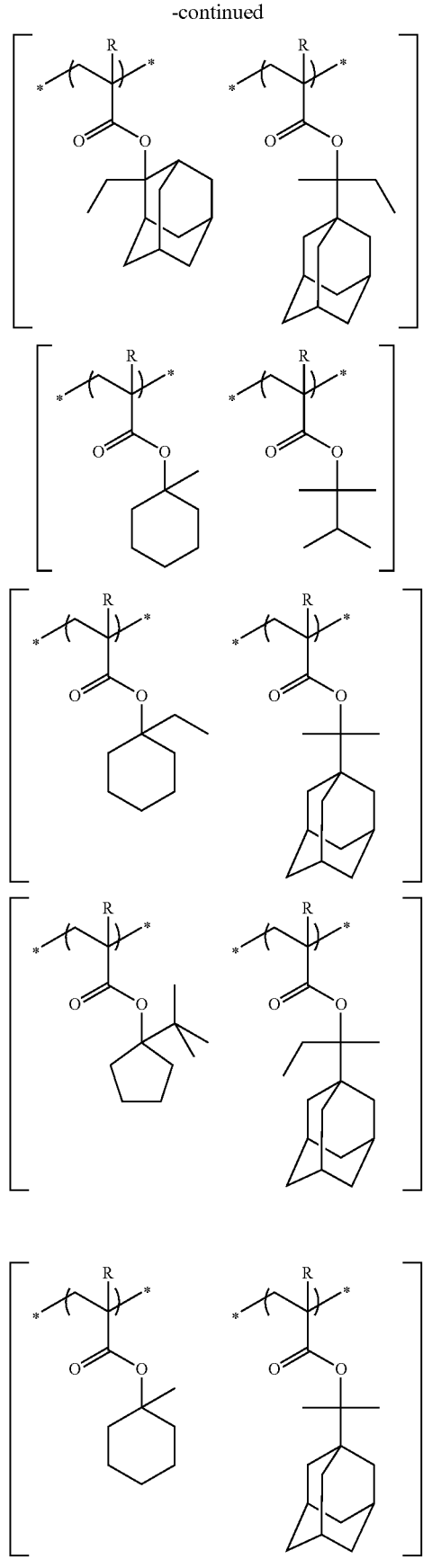
-continued

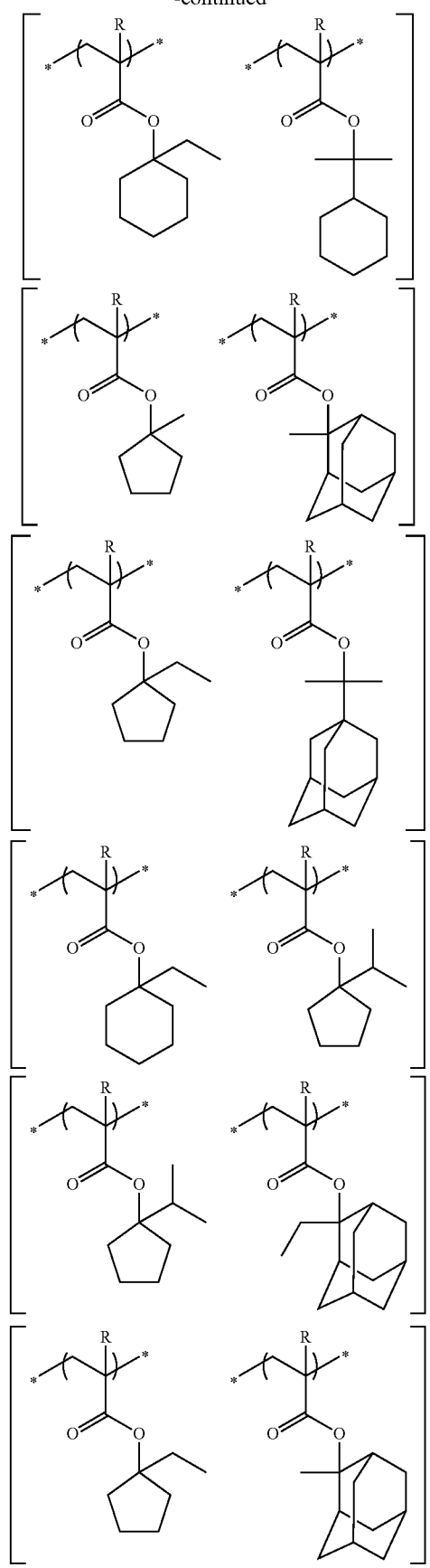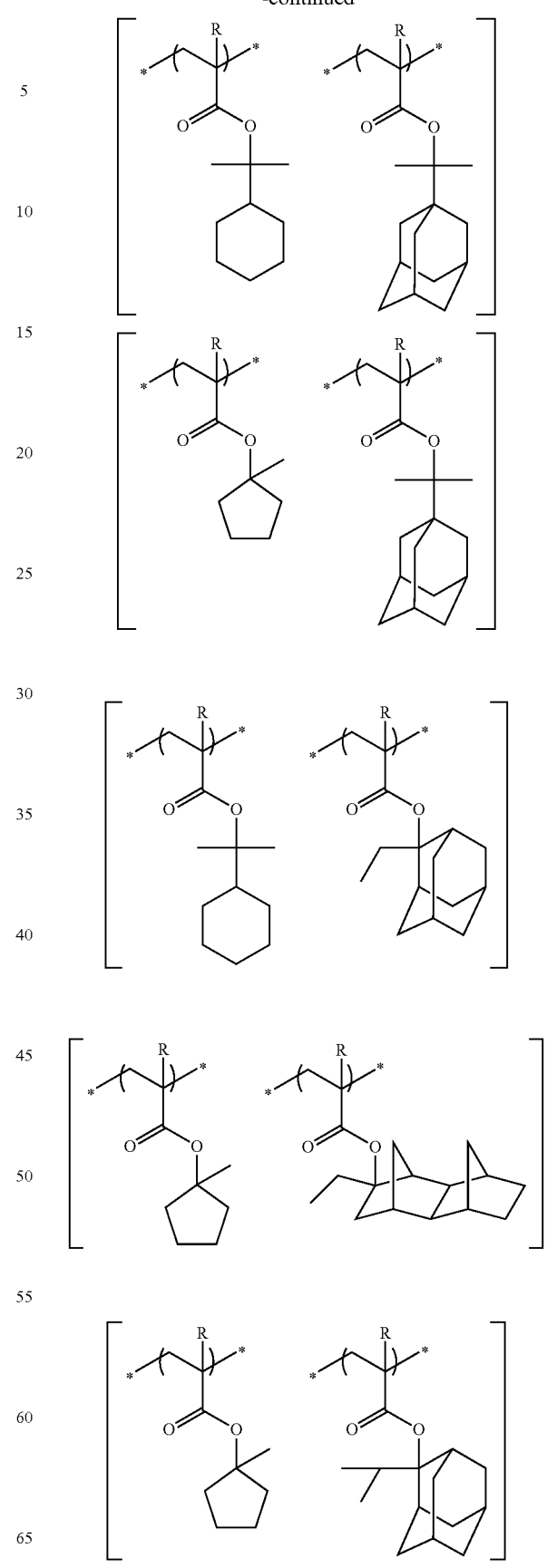

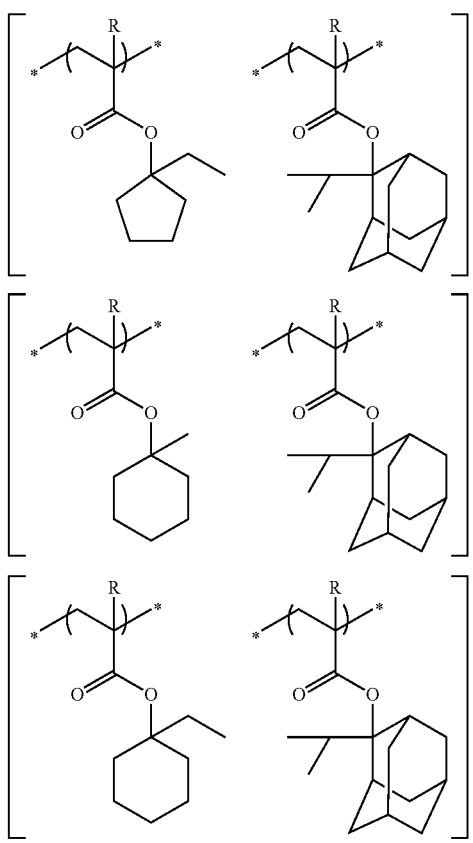

The content (in the case where plural repeating units having acid-decomposable groups exist, a total content thereof) of the repeating unit having the acid-decomposable group included in the resin (A) is not particularly limited, but the lower limit thereof is preferably 15 mol % or greater, more preferably 20 mol % or greater, even more preferably 25 mol % or greater, and particularly preferably 40 mol % or greater with respect to the entire repeating units of the resin (A). The upper limit thereof is preferably 90 mol % or less, more preferably 75 mol % or less, and more preferably 65 mol % or less.

The resin (A) may contain a repeating unit having a lactone structure or a sultone structure.

Specific examples of the repeating unit having the group having the lactone structure and the sultone structure are described below, but the invention is not limited thereto.

(In formulae, Rx indicates H, CH$_3$, CH$_2$OH, or CF$_3$.)

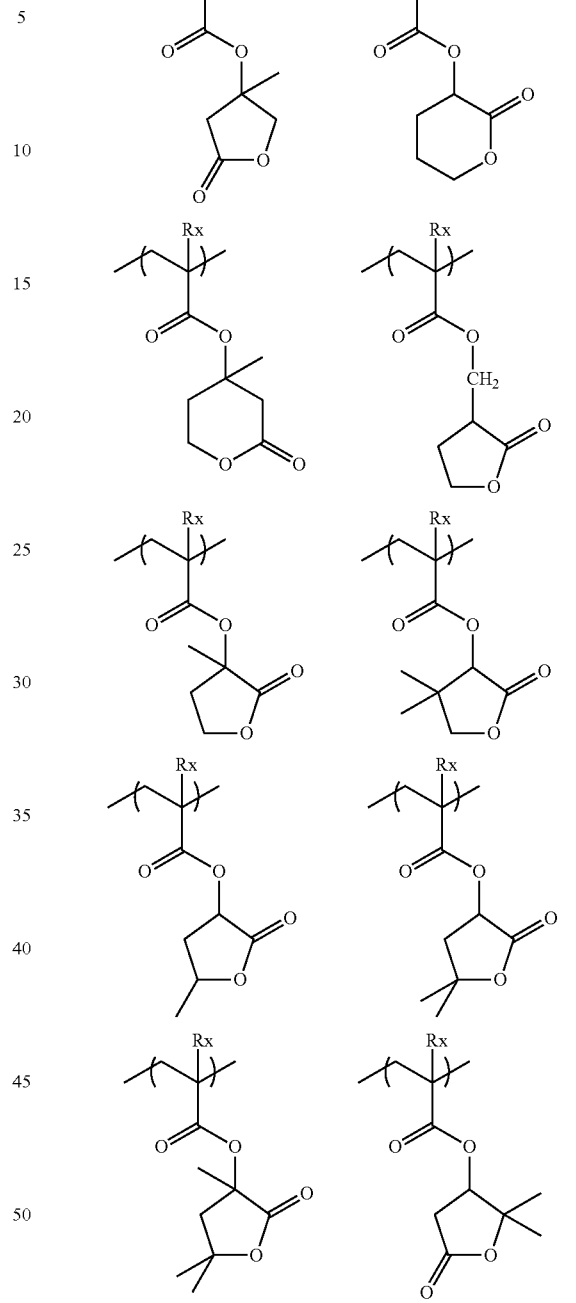

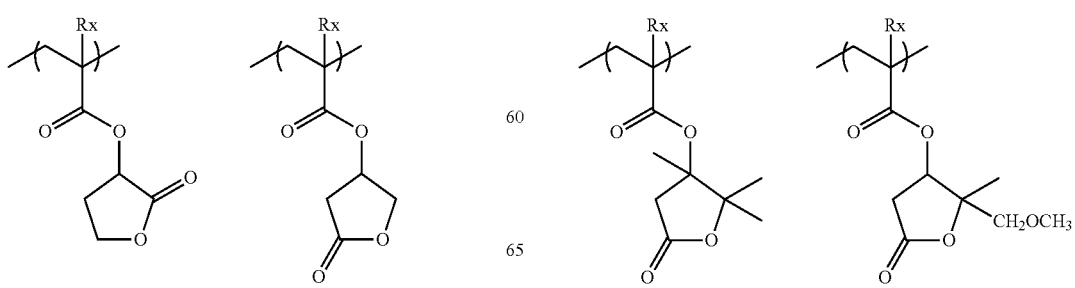

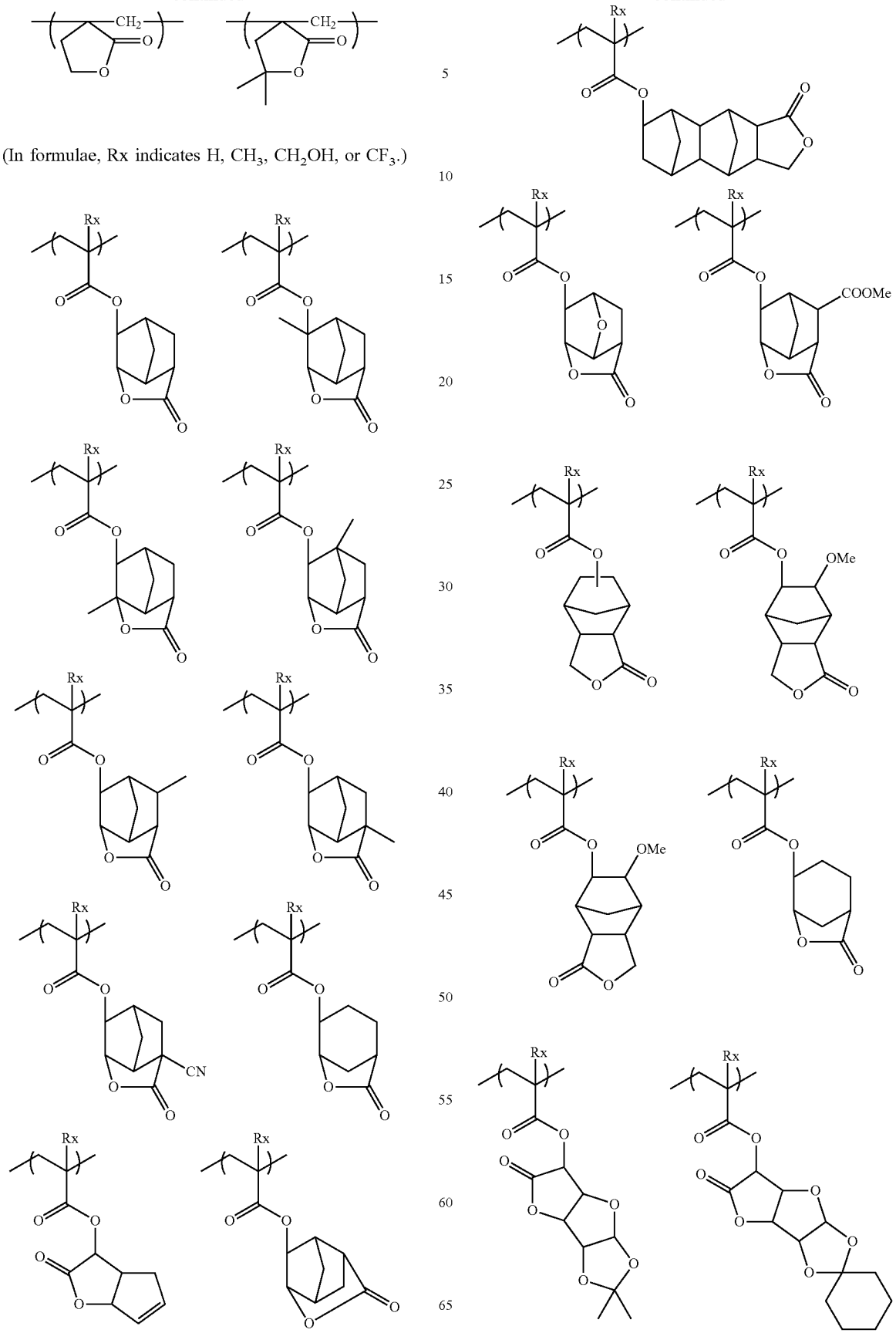
(In formulae, Rx indicates H, CH₃, CH₂OH, or CF₃.)

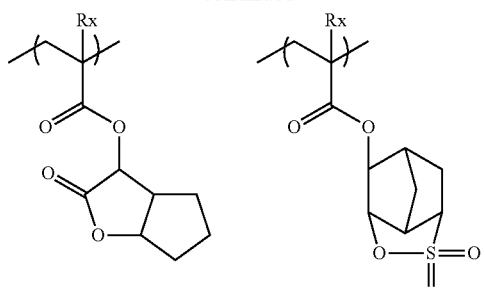
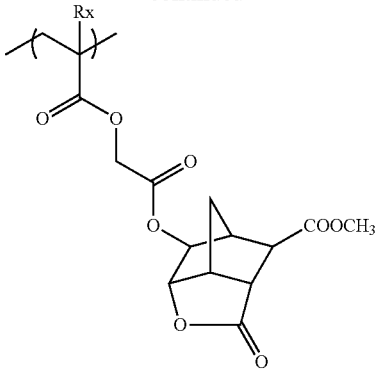
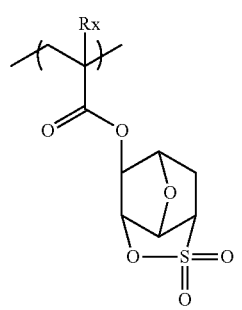
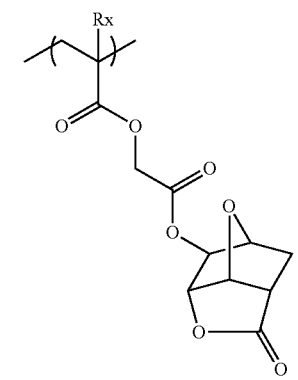
(In formulae, Rx indicates H, CH₃, CH₂OH or CF₃)
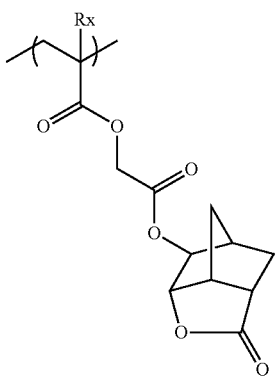
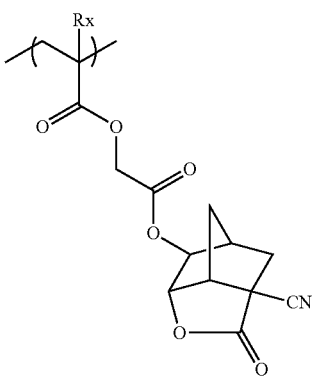
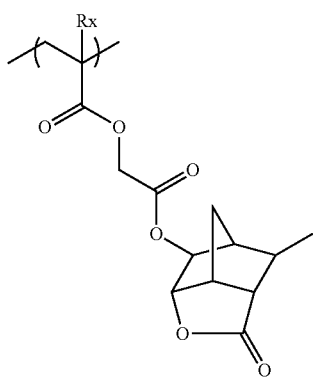

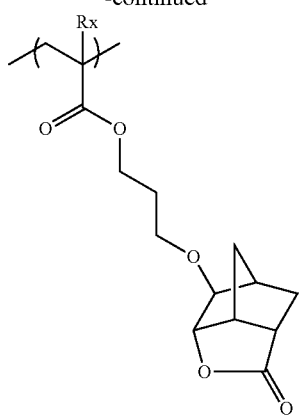
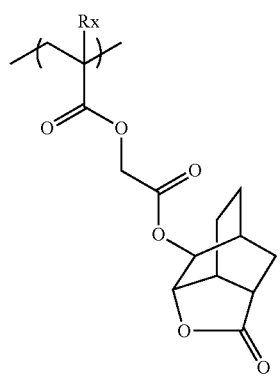
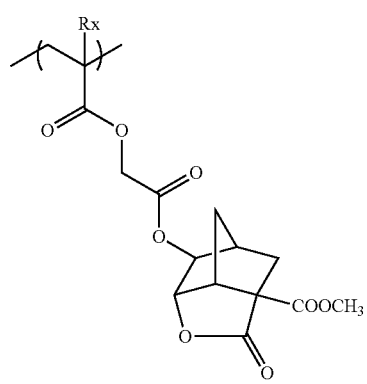
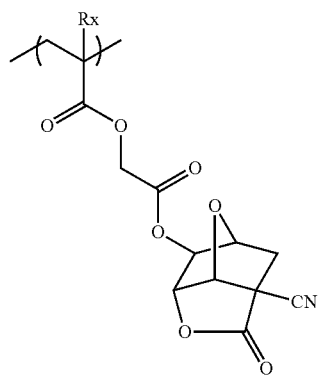
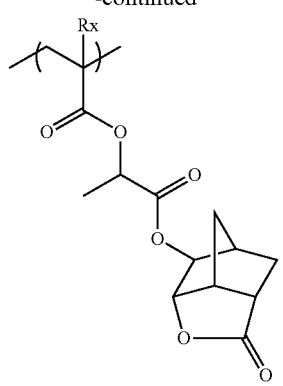
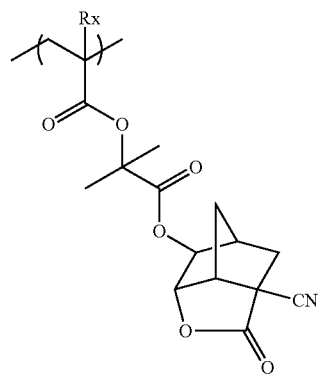
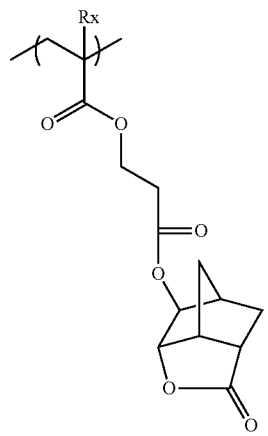
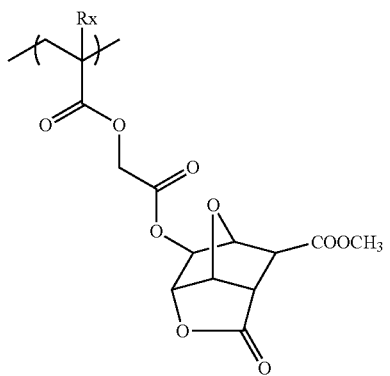

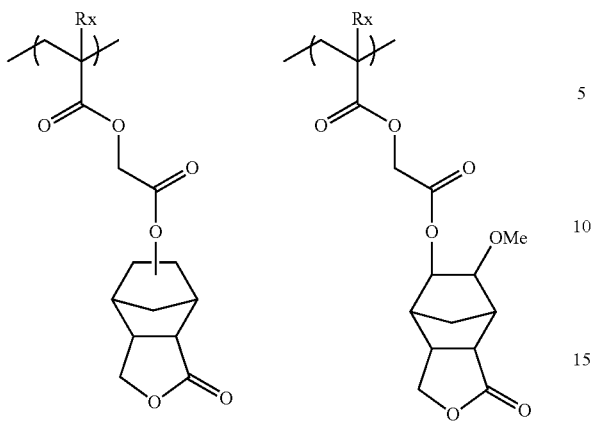

It is possible to use repeating units having two or more types of lactone structures or sultone structures in combination.

In the case where the resin (A) contains the repeating unit having the lactone structure or the sultone structure, the content of the repeating unit having the lactone structure or the sultone structure is preferably 5 mol % to 60 mol %, more preferably 5 mol % to 55 mol %, and even more preferably 10 mol % to 50 mol % with respect to the entire repeating units in the resin (A).

The resin (A) may have a repeating unit having a cyclic carbonate ester structure. Specific examples thereof are described below, but the invention is not limited thereto.

$R_A^1$ in the following specific examples represents a hydrogen atom or an alkyl group (preferably a methyl group).

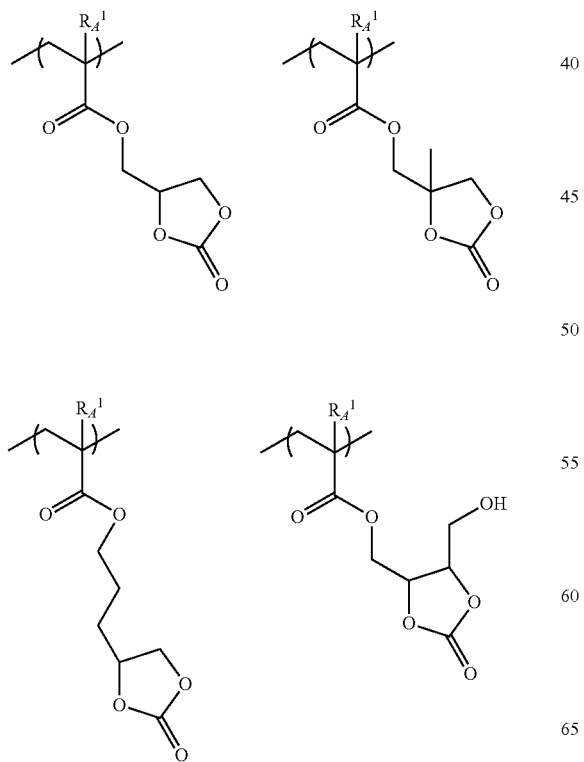

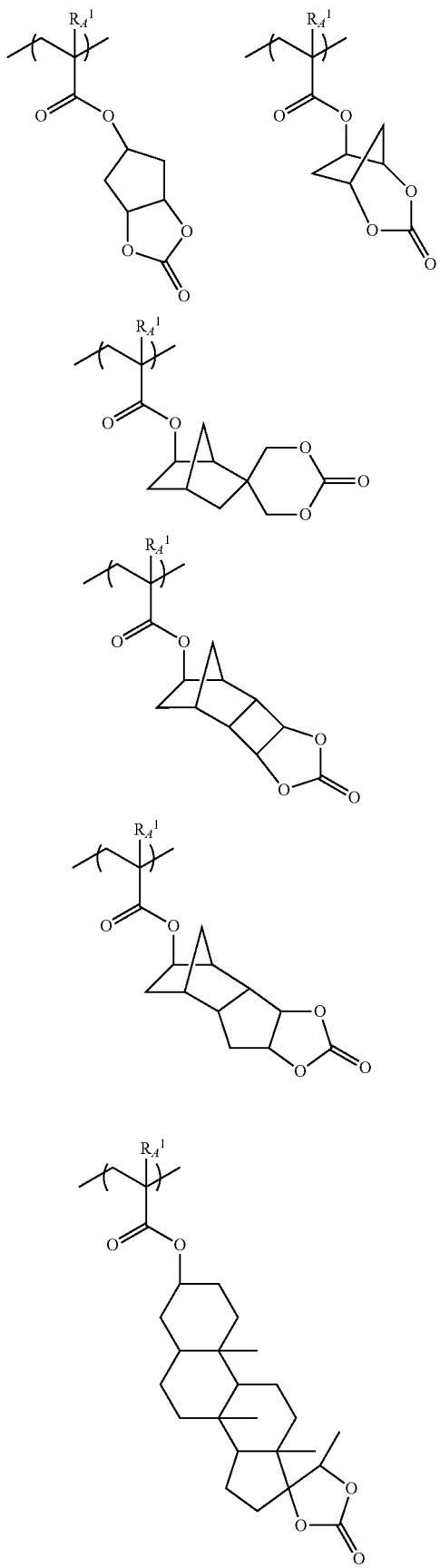

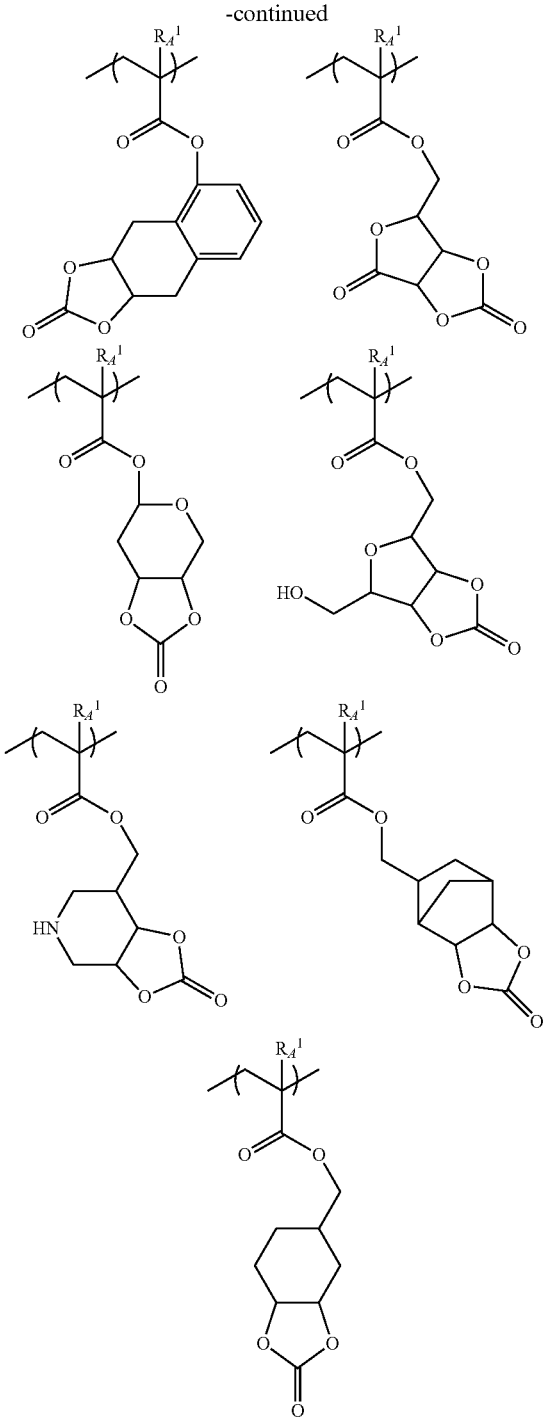
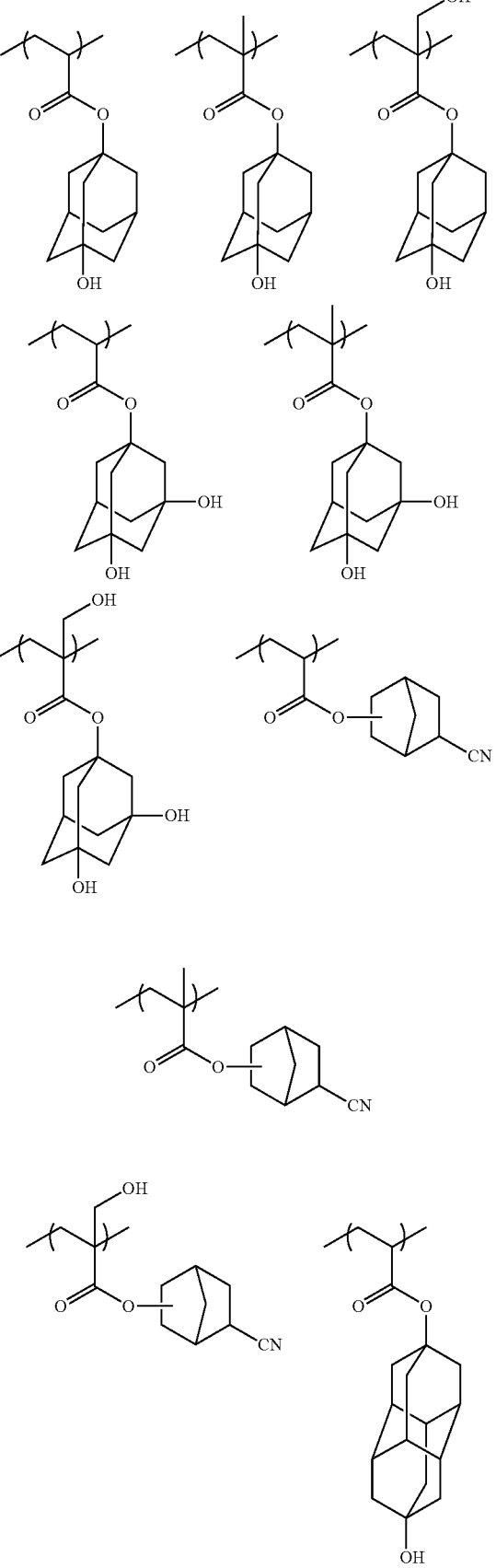

In the case where the resin (A) contains a repeating unit having a cyclic carbonic acid ester structure, the content of the repeating unit having acyclic carbonic acid ester structure is preferably 5 mol % to 60 mol %, more preferably 5 mol % to 55 mol %, and even more preferably 10 mol % to 50 mol % with respect to the total repeating unit in the resin (A).

The resin (A) may contain a repeating unit having a hydroxyl group or a cyano group.

Specific examples of the repeating unit having the hydroxyl group or the cyano group are described below, but the invention is not limited thereto.

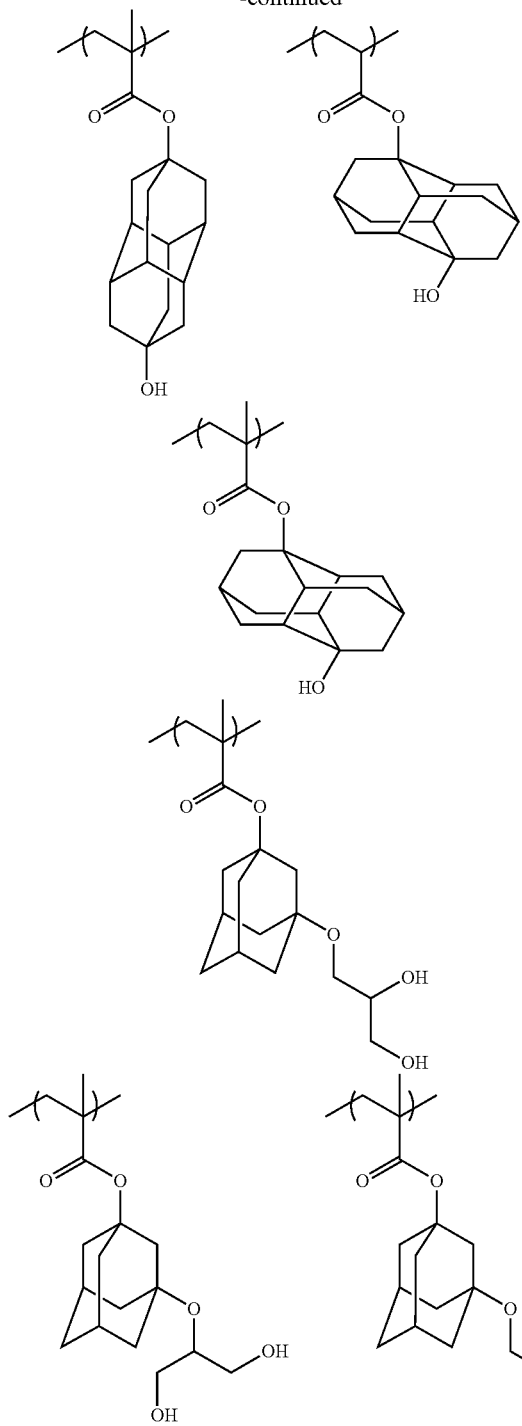

In the case where the resin (A) contains a repeating unit having a hydroxyl group or a cyano group, the content of the repeating unit having the hydroxyl group or the cyano group is preferably 3 mol % to 25 mol %, and even more preferably 5 mol % to 15 mol % with respect to the entire repeating units in the resin (A).

The resin (A) may contain the repeating unit having the acid group.

The resin (A) may not contain the repeating unit having the acid group, but in the case where the acid group is contained, the content of the repeating unit having the acid group is preferably 25 mol % or less and more preferably 20 mol % or less with respect to the entire repeating units in the resin (A). In the case where the resin (A) contains the repeating unit having the acid group, the content of the repeating unit having the acid group in the resin (A) is generally 1 mol % or greater.

Specific examples of the repeating unit having the acid group are described below, but the invention is not limited thereto.

In the specific examples, Rx represents H, $CH_3$, $CH_2OH$, or $CF_3$.

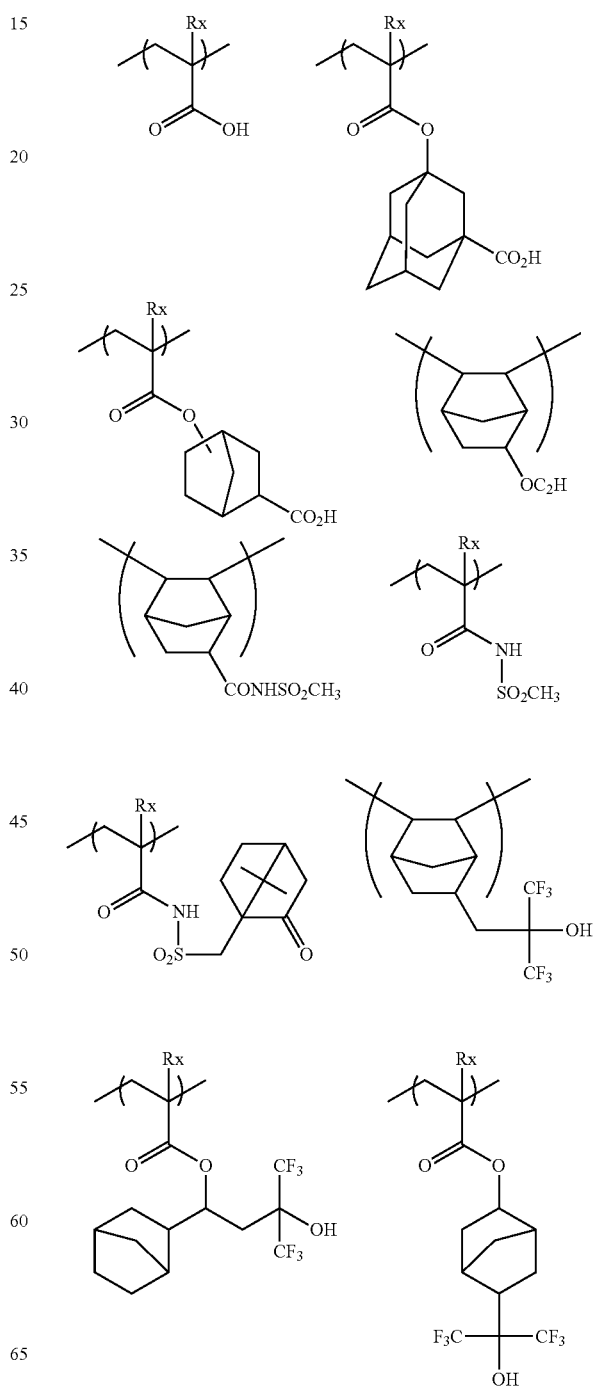

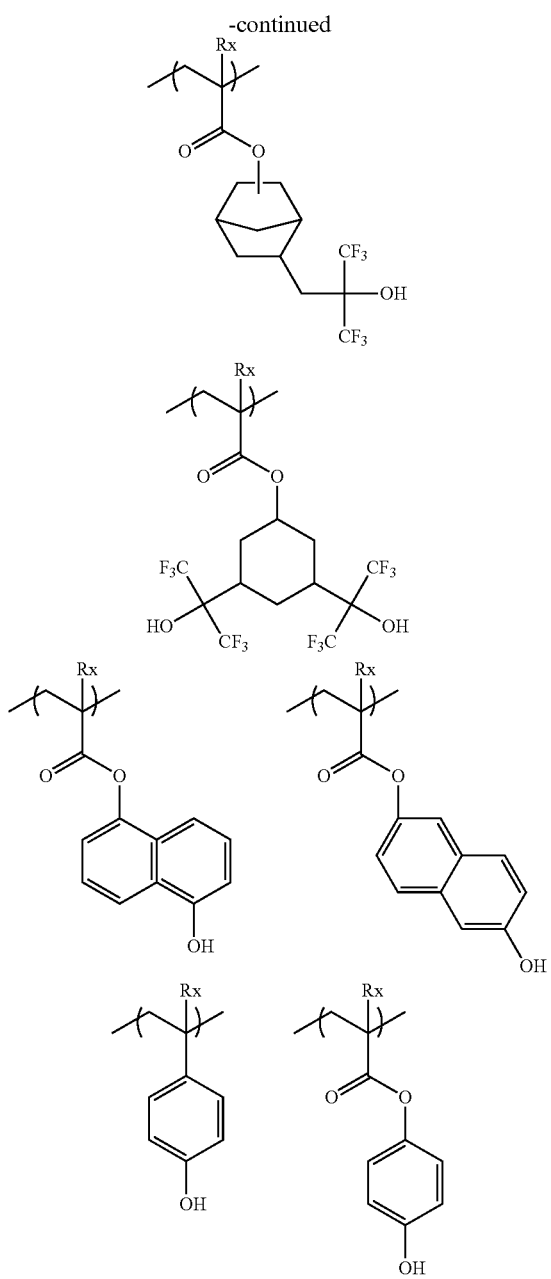
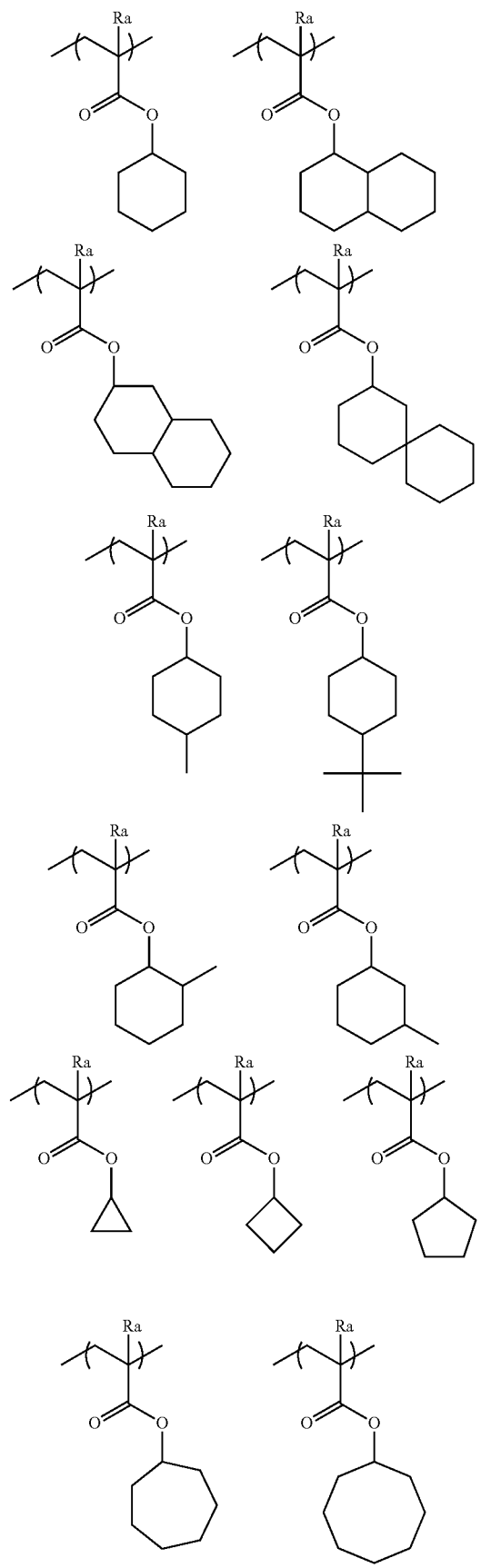

The resin (A) further has an alicyclic hydrocarbon structure and/or an aromatic ring structure without a polar group (for example, the acid group described above, a hydroxyl group, and a cyano group) and may have a repeating unit that does not exhibit acid decomposition properties. The content of the repeating unit is preferably 1 mol % to 50 mol %, more preferably 5 mol % to 50 mol %, and even more preferably 5 mol % to 30 mol % with respect to the total repeating unit in the resin (A).

Specific examples of the repeating unit that has an alicyclic hydrocarbon structure without a polar group and that does not exhibit acid decomposition properties are described below, but the invention is not limited thereto. In the formula, Ra represents H, $CH_3$, $CH_2OH$, or $CF_3$.

-continued

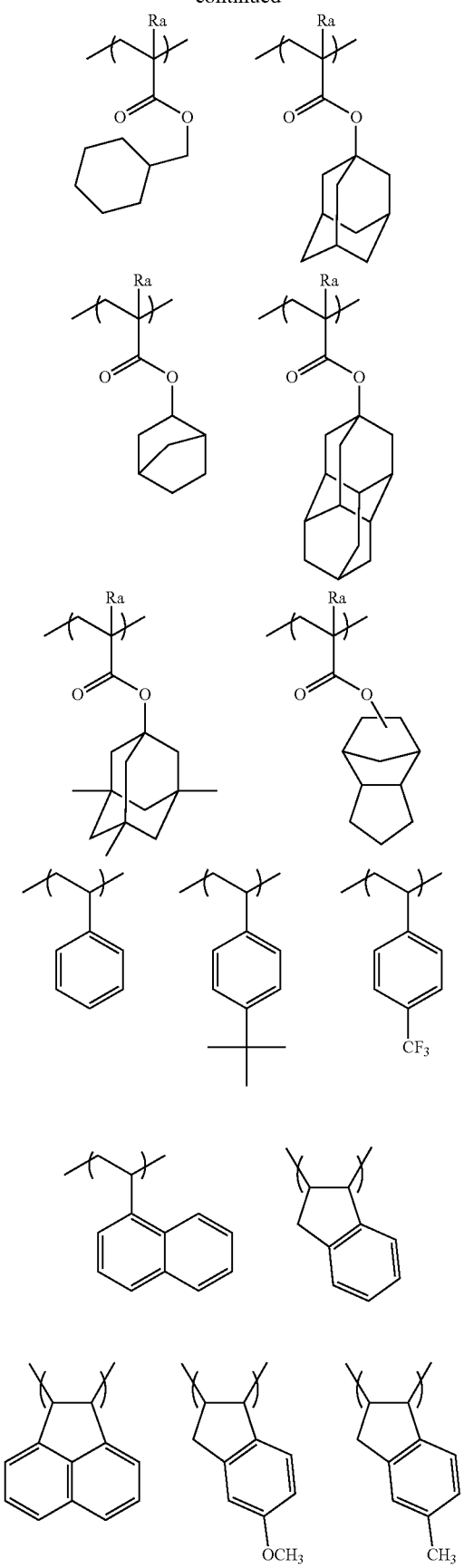

-continued

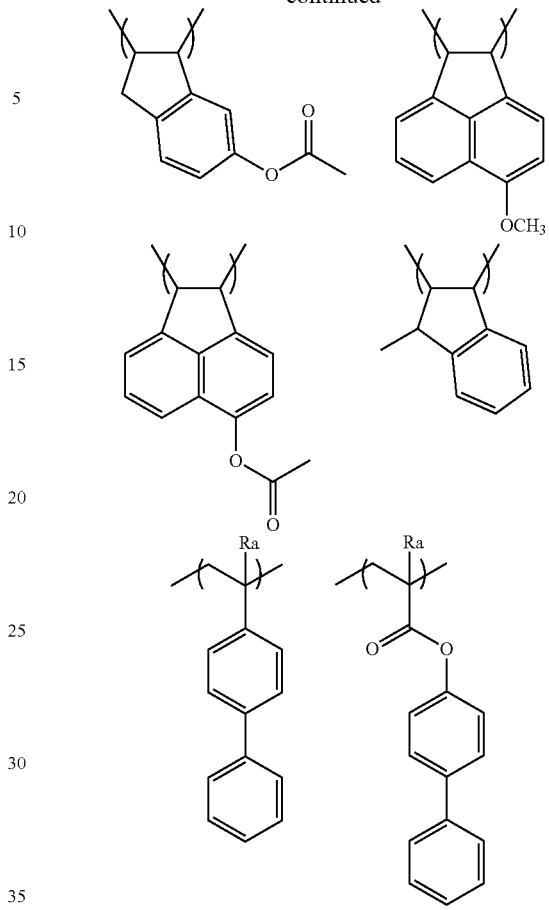

As the form of the resin (A), any form of a random shape, a block shape, a comb shape, and a star shape may be used. The resin (A) can be synthesized by, for example, radical, cationic, or anionic polymerization of the unsaturated monomers corresponding to the respective structures. A desired resin can be obtained by performing polymer reaction after polymerization by using the unsaturated monomers corresponding to precursors of the respective structures.

If the composition is for ArF exposure, in view of the transparency to ArF light, it is preferable that the resin (A) that is used in the composition does not have an aromatic ring substantially (specifically, in the resin, a proportion of a repeating unit having an aromatic group is preferably 5 mol % or less, more preferably 3 mol % or less, and ideally 0 mol %, that is, does not have an aromatic group) and it is preferable that the resin (A) has a monocyclic or polycyclic alicyclic hydrocarbon structure.

In the case where the composition includes a hydrophobic resin (D) described below, in view of compatibility with the hydrophobic resin (D), it is preferable that the resin (A) does not contain a fluorine atom and a silicon atom.

The resin (A) used in the composition is preferably a resin in which all repeating units are (meth)acrylate-based repeating units. In this case, any one of a resin in which all repeating units are methacrylate-based repeating units, a resin in which all repeating units are acrylate-based repeating units, and a resin in which all repeating units are formed of methacrylate-based repeating units and acrylate-based repeating units may be used, but it is preferable that the acrylate-based repeating units occupy 50 mol % or less of the entire repeating units.

In the case where the composition is irradiated with KaF excimer laser light, an electron beam, an X ray, or a high energy ray (EUV or the like) having a wavelength of 50 nm or less, it is preferable that the resin (A) may have a repeating unit having an aromatic ring. The repeating unit having an aromatic ring is not particularly limited, and examples thereof include a styrene unit, a hydroxystyrene unit, a phenyl (meth)acrylate unit, and a hydroxyphenyl (meth)acrylate unit, as exemplified in the description of the respective repeating units as described above. More specific examples of the resin (A) include a resin having a hydroxystyrene-based repeating unit and a hydroxystyrene-based repeating unit protected by an acid-decomposable group, a resin having the repeating unit having an aromatic ring and a resin having a repeating unit having a carboxylic acid moiety of a (meth)acrylic acid protected by an acid-decomposable group. Particularly, at the time of EUV exposure, high sensitivity is generally required, and thus the resin (A) preferably includes a repeating unit containing a protection group that is easily decomposed by an acid. Specific examples of this repeating unit preferably include groups represented by —C(R$_{36}$)(R$_{37}$)(OR$_{39}$) or —C(R$_{01}$)(R$_{02}$)(OR$_{39}$) (a structure generally referred to as an acetal-type protection group) among the structures described above as groups released by an acid.

The resin (A) in the invention can be synthesized and purified by a general method (for example, radical polymerization). For example, with respect to the synthesis and purification method, reference can be made to the descriptions of paragraphs "0201" to "0202" of JP2008-292975, and the like.

A weight average molecular weight of the resin (A) according to the invention is 7,000 or greater, preferably 7,000 to 200,000, more preferably 7,000 to 50,000, even more preferably 7,000 to 40,000, and particularly preferably 7,000 to 30,000, in terms of polystyrene in the GPC method. If the weight average molecular weight is smaller than 7,000, solubility with respect to the organic developer becomes too high, and there is a concern that an accurate pattern may not be formed.

Resins having dispersity (molecular weight distribution: Mw/Mn) which is a ratio of the weight average molecular weight (Mw) and the number average molecular weight (Mn) is generally in the range of 1.0 to 3.0, preferably in the range of 1.0 to 2.6, more preferably in the range of 1.0 to 2.0, and particularly preferably in the range of 1.4 to 2.0 are used. As the resin of which a molecular weight distribution is smaller, resolutions and resist forms become more excellent, sidewalls of a resist pattern become smoother, and roughness properties become more excellent.

The weight average molecular weight and the number average molecular weight is defined as a value in terms of polystyrene by GPC (solvent: THF, column: TSKgel Multipore HXL-M manufactured by Tosoh Corporation, column temperature: 40° C., flow velocity: 1.0 mL/min, detector: RI) measurement.

With respect to the composition, a proportion incorporated into total compositions of the resin (A) is preferably 30 mass % to 99 mass % and more preferably 60 mass % to 95 mass % in the total solid content.

In the composition, the resin (A) may be used singly, or plural types thereof may be used in combination.

Specific examples (in which the compositional ratio of the repeating units is a molar ratio) of the resin (A) are provided below, but the invention is not limited thereto. Embodiments of the case where a structure corresponding to the acid generator (B) as described below is supported on the resin (A) are also exemplified.

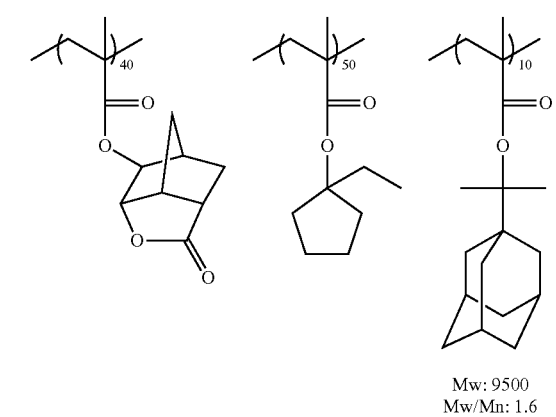

Mw: 9500
Mw/Mn: 1.6

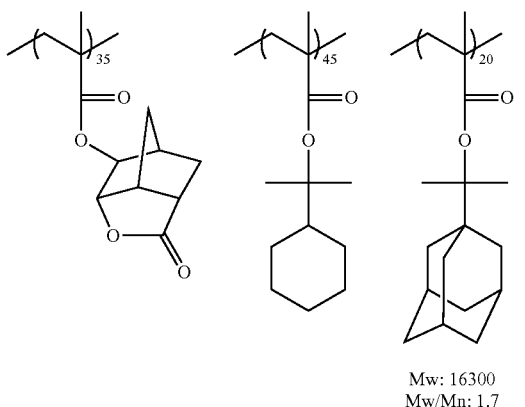

Mw: 16300
Mw/Mn: 1.7

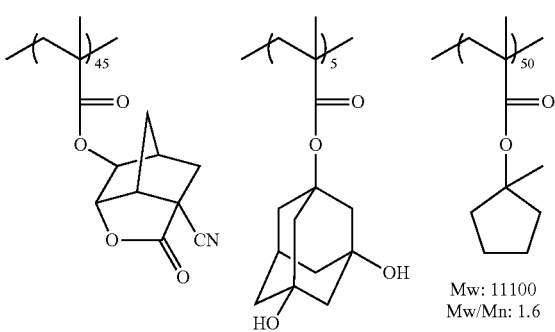

Mw: 11100
Mw/Mn: 1.6

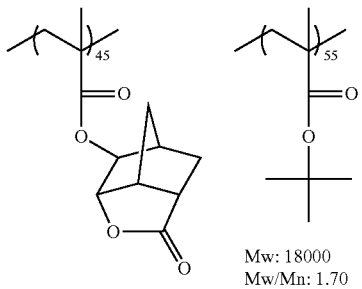

Mw: 18000
Mw/Mn: 1.70

-continued
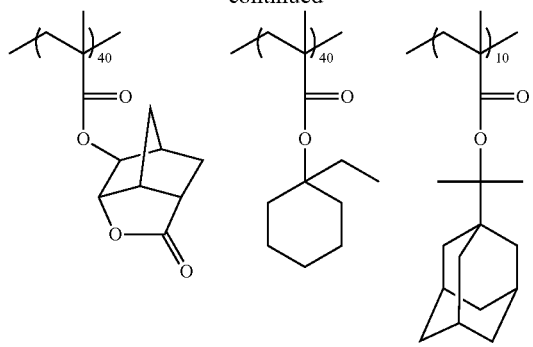
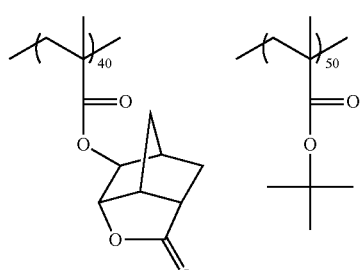
Mw: 13500
Mw/Mn: 1.7
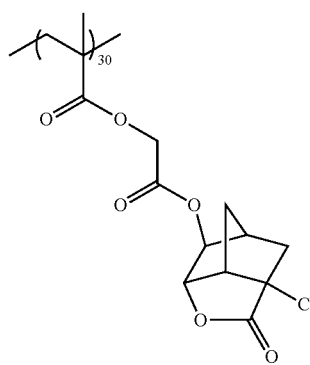
-continued
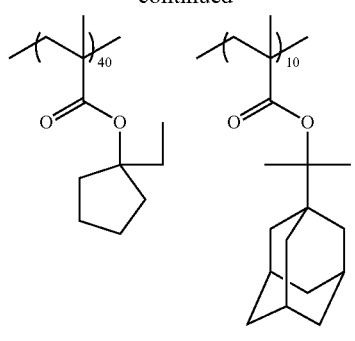
Mw: 10900
Mw/Mn: 1.6
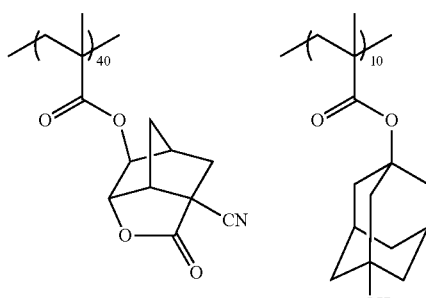
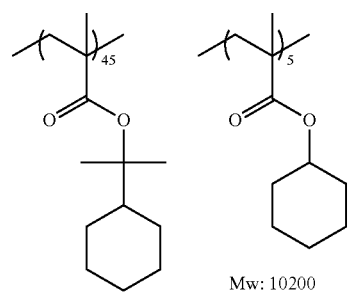
Mw: 10200
Mw/Mn: 1.7
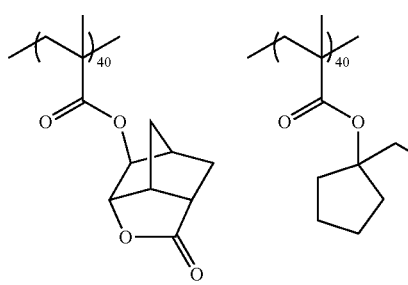
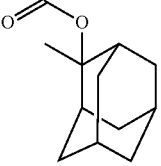
Mw: 10300
Mw/Mn: 1.7

-continued
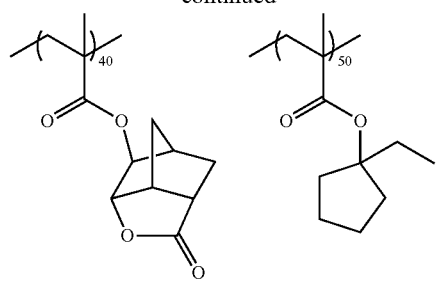
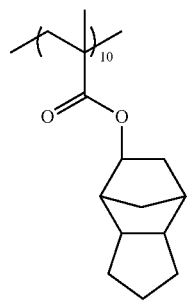
Mw: 9500
Mw/Mn: 1.7
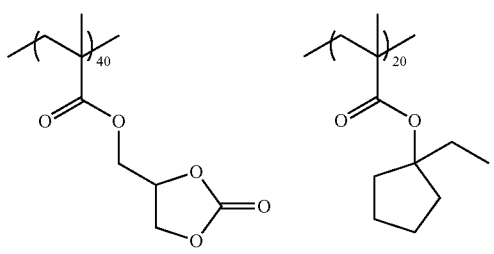
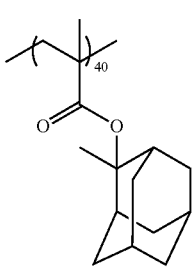
Mw: 7100
Mw/Mn: 1.6
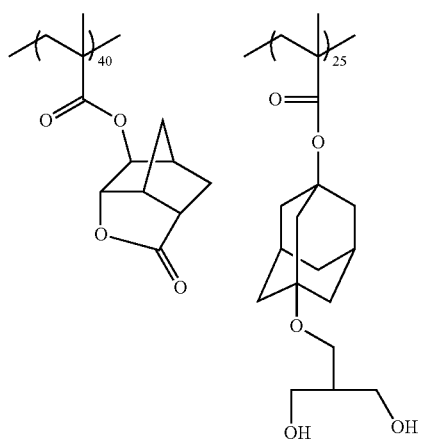
-continued
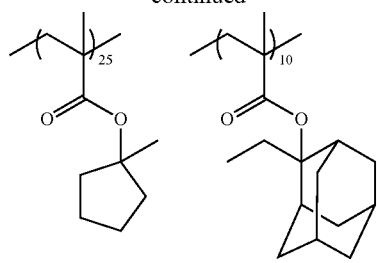
Mw: 6800
Mw/Mn: 1.6
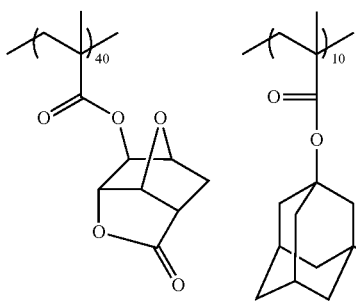
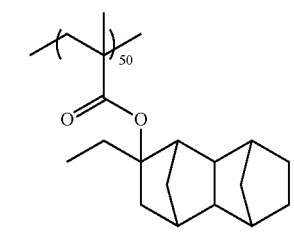
Mw: 10800
Mw/Mn: 1.7
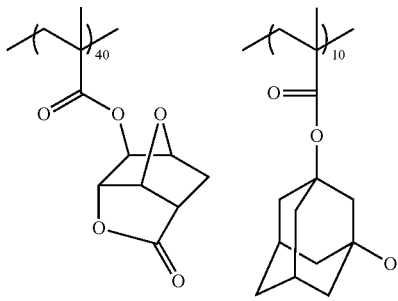
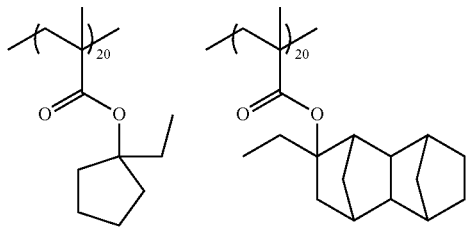

-continued
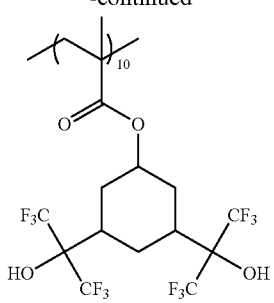
Mw: 9600
Mw/Mn: 1.7
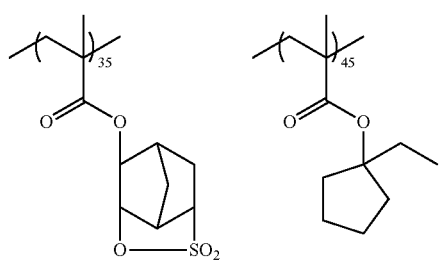
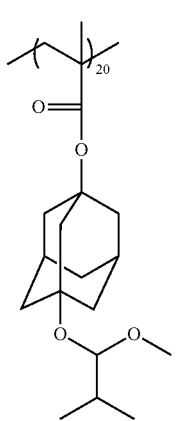
Mw: 10500
Mw/Mn: 1.6
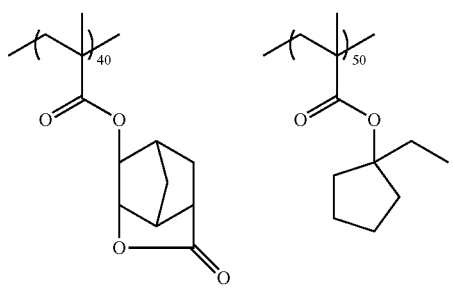
-continued
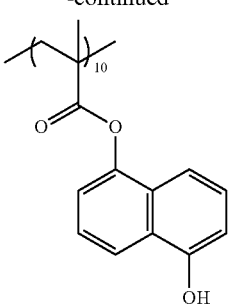
Mw: 8900
Mw/Mn: 1.7
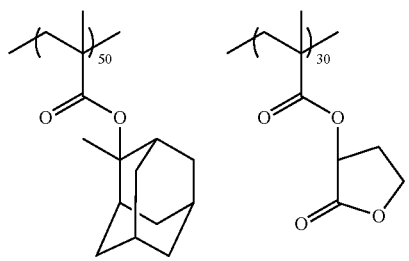
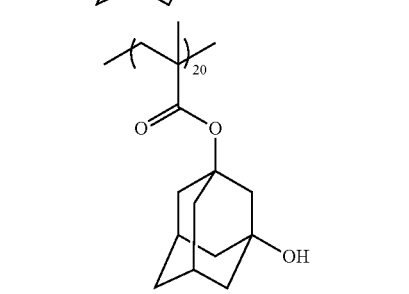
Mw: 11000
Mw/Mn: 1.7
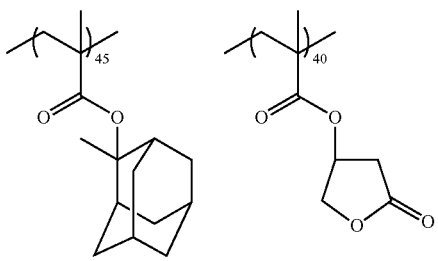
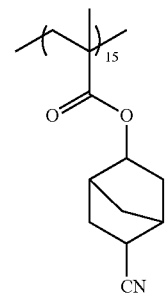
Mw: 9800
Mw/Mn: 1.7

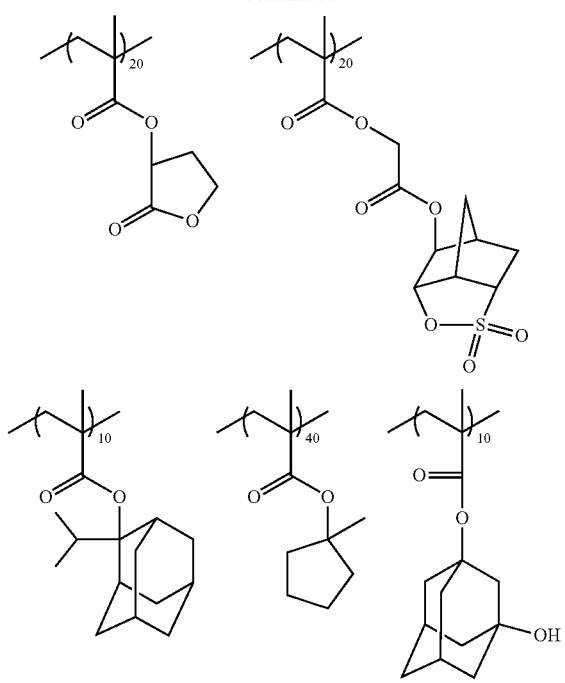
Mw: 11200
Mw/Mn: 1.6
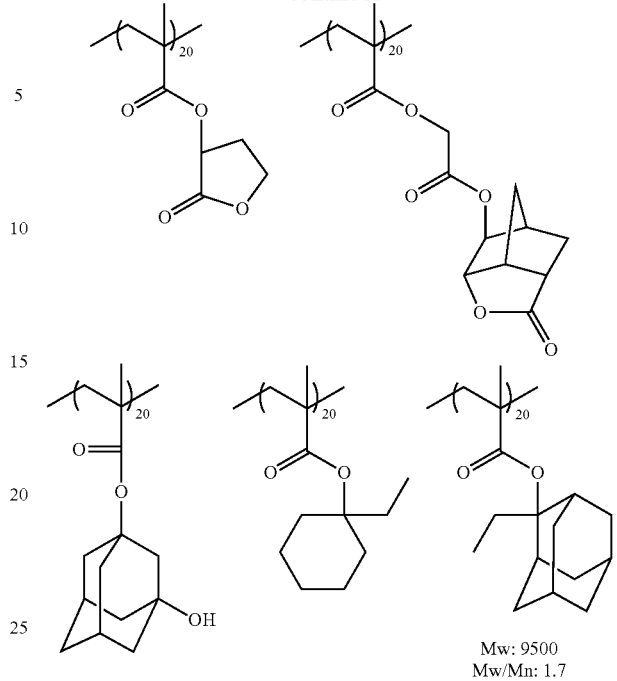
Mw: 9500
Mw/Mn: 1.7
The resins exemplified below are the examples of the resins which can be suitably used, particularly at the time of EUV exposure or electron beam exposure.
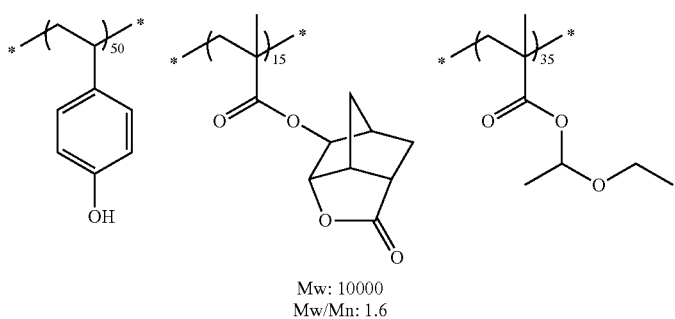
Mw: 10000
Mw/Mn: 1.6
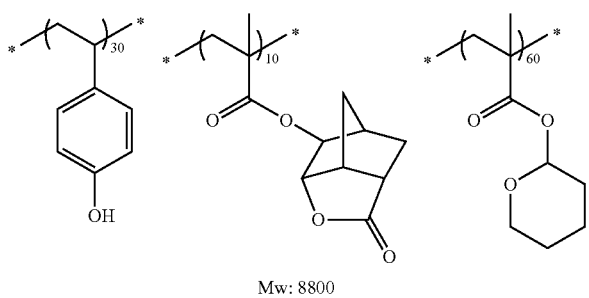
Mw: 8800
Mw/Mn: 1.7
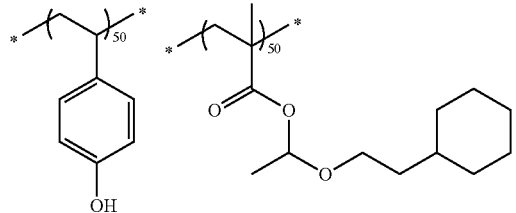
Mw: 12000
Mw/Mn: 1.7

-continued
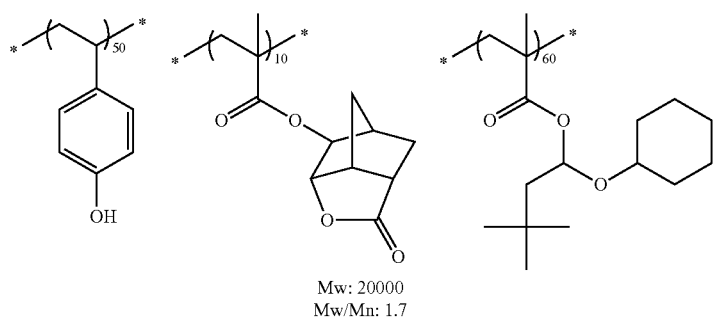
Mw: 20000
Mw/Mn: 1.7
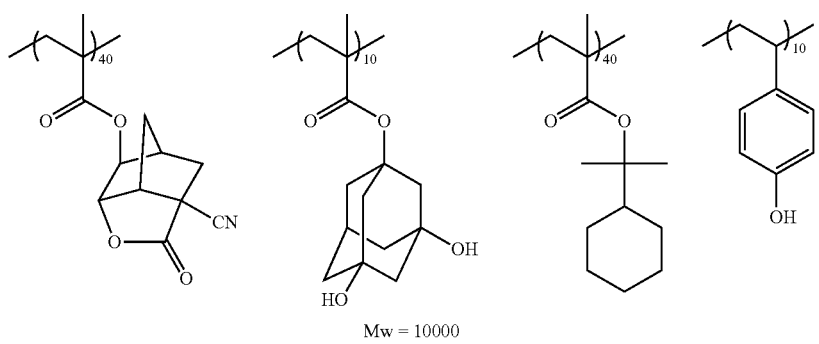
Mw = 10000
Mw/Mn = 1.60
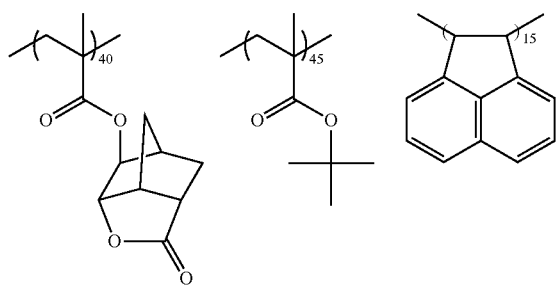
Mw = 7500
Mw/Mn = 1.50
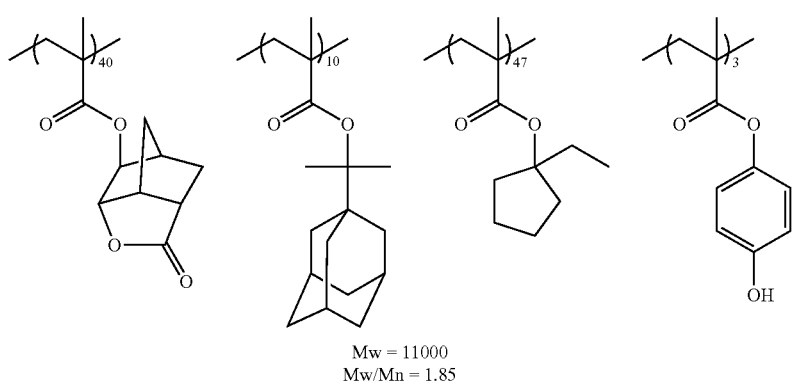
Mw = 11000
Mw/Mn = 1.85

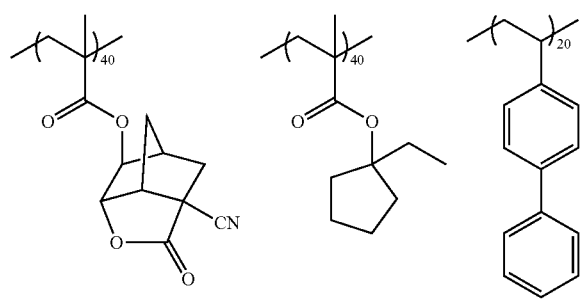
Mw = 7000
Mw/Mn = 1.65
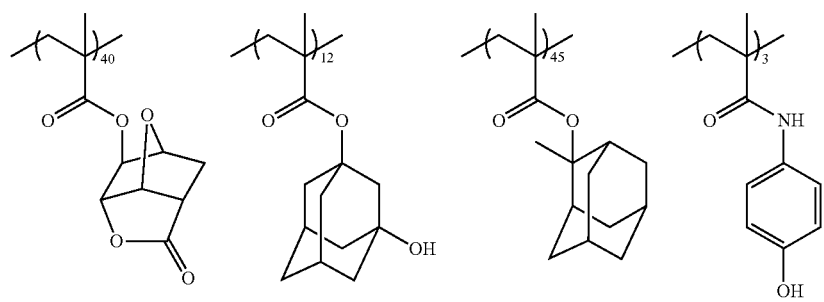
Mw = 8000
Mw/Mn = 1.65
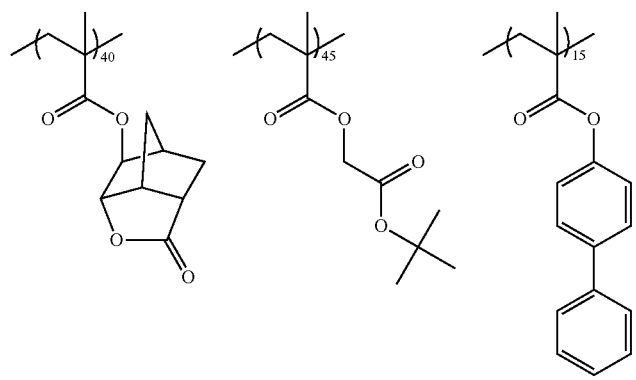
Mw = 19000
Mw/Mn = 1.70
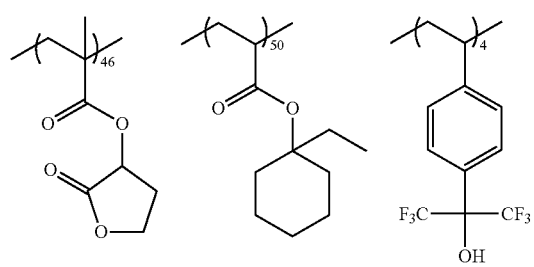
Mw = 26000
Mw/Mn = 1.85

-continued
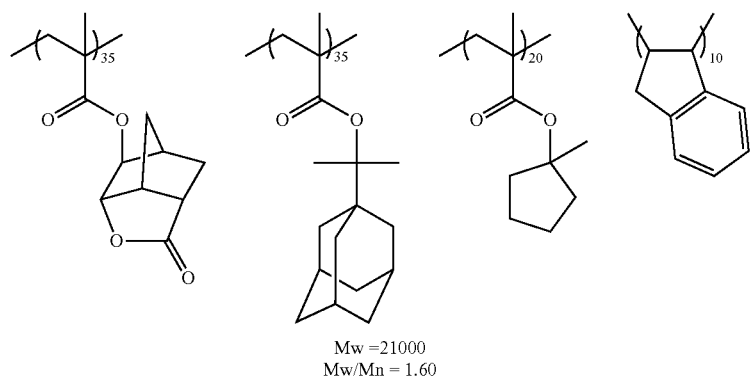
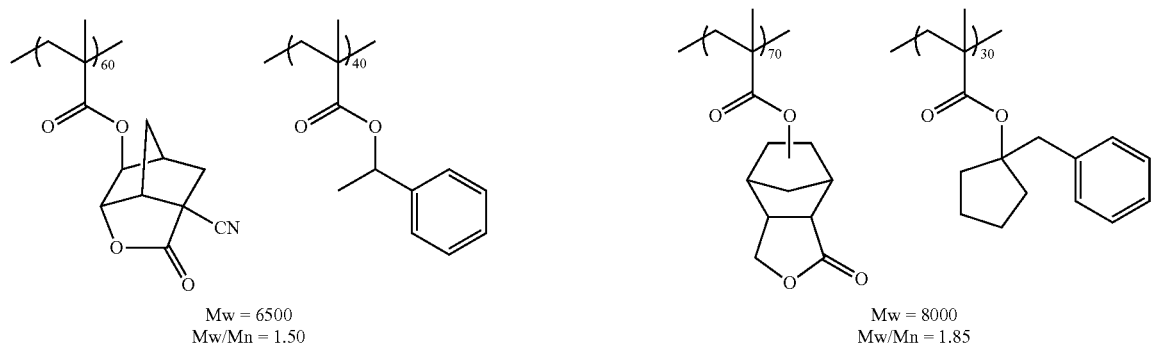
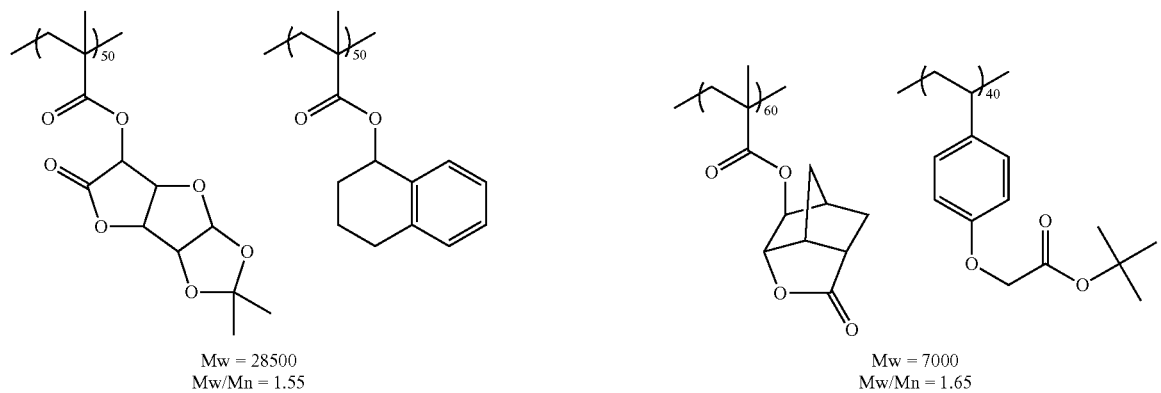
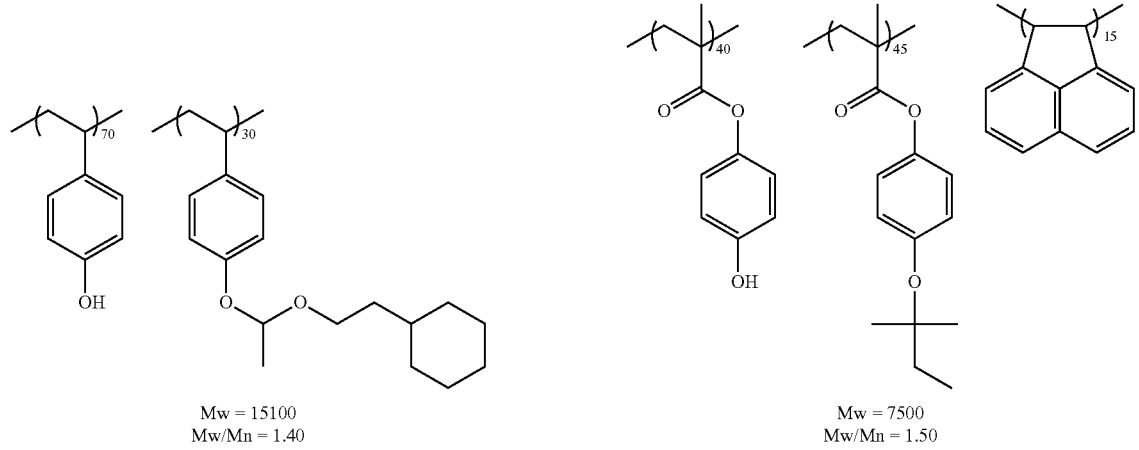

-continued
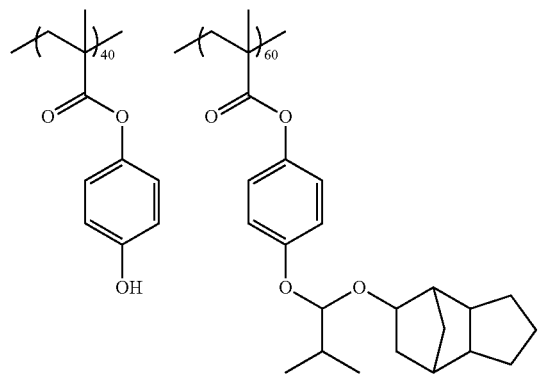
Mw = 9000
Mw/Mn = 1.25
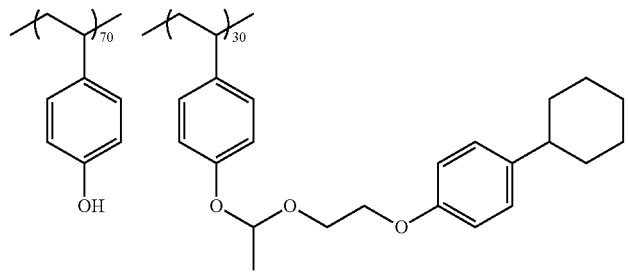
Mw = 4800
Mw/Mn = 1.15
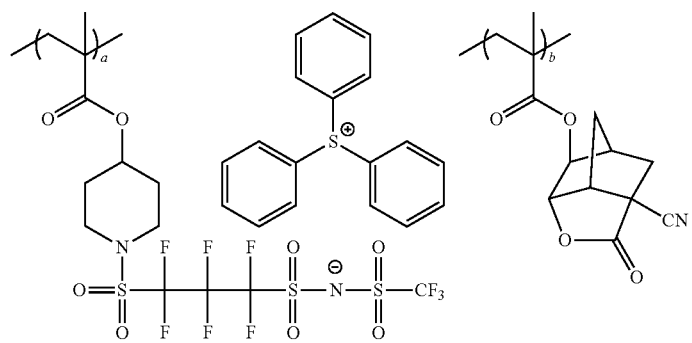
a/b/c/d = 5/43/37/15
Mw = 10500, Mw/Mn = 1.77
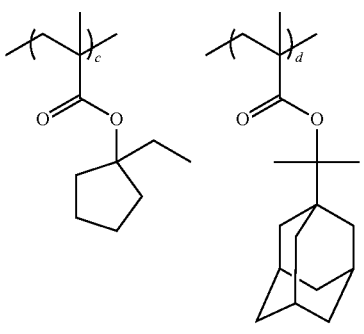
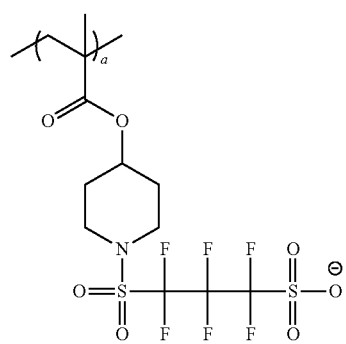
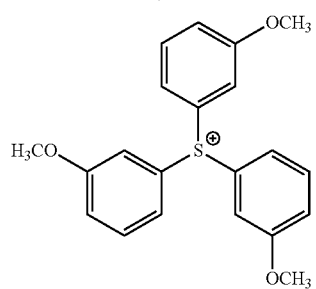
a/b/c = 10/30/60
Mw = 8500, Mw/Mn = 1.78
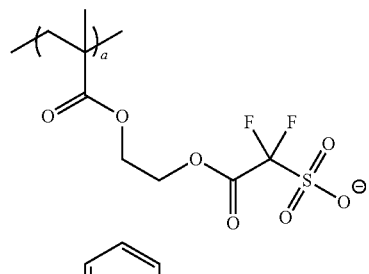
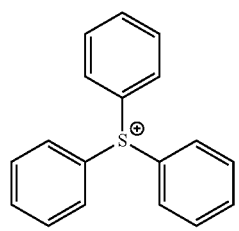
a/b/c/d = 10/40/10/40
Mw = 11500, Mw/Mn = 1.82

-continued
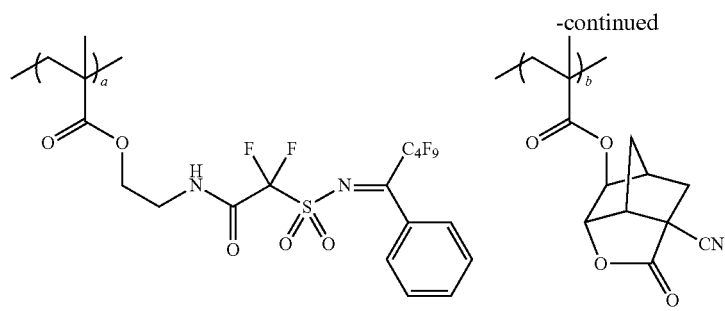
a/b/c =20/35/45
Mw = 9000, Mw/Mn = 1.68
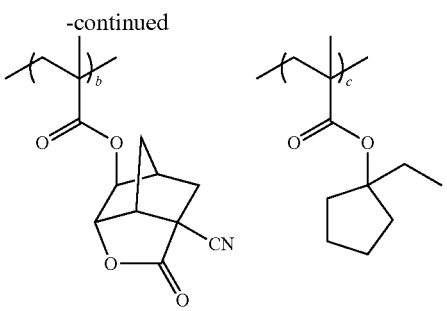
a/b/c/d =20/15/15/50
Mw = 16000, Mw/Mn = 1.65
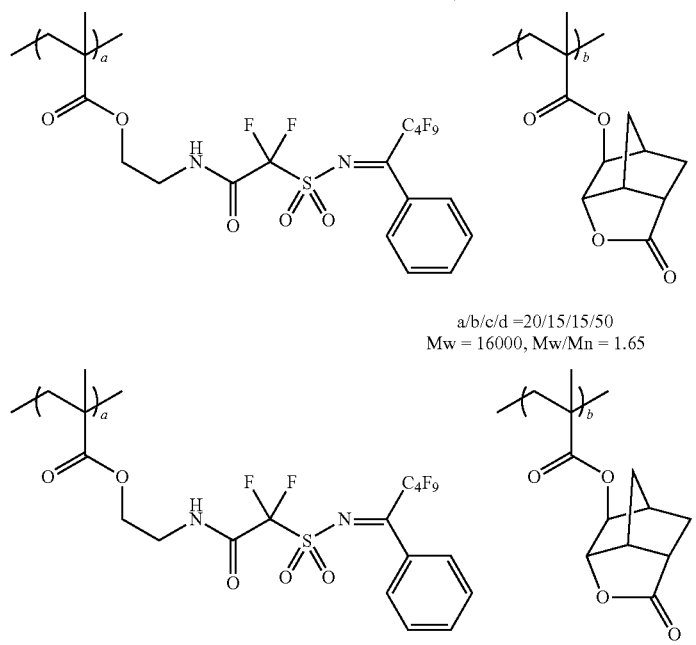
a/b/c/d = 20/20/50/10
Mw = 9500, Mw/Mn = 1.74
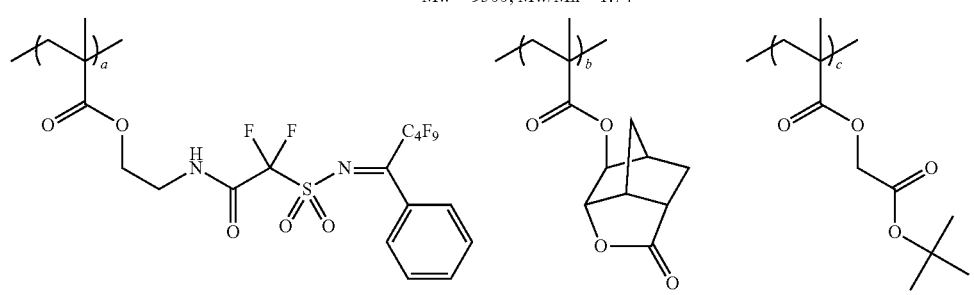
a/b/c = 20/35/45
Mw = 7500, Mw/Mn = 1.55
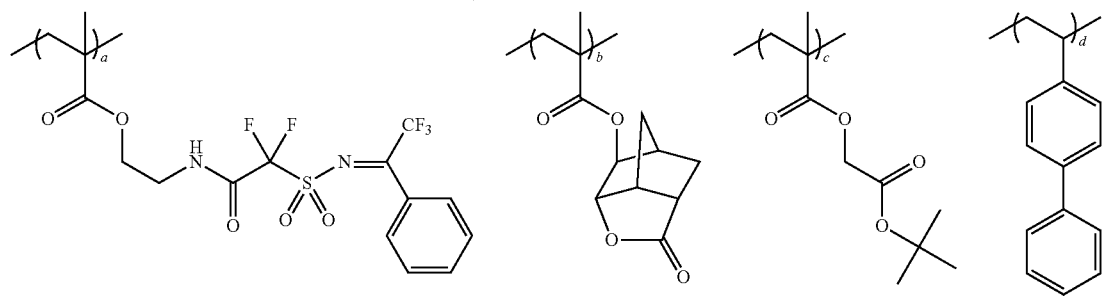
a/b/c/d = 15/30/50/5
Mw = 10000, Mw/Mn = 1.75

-continued
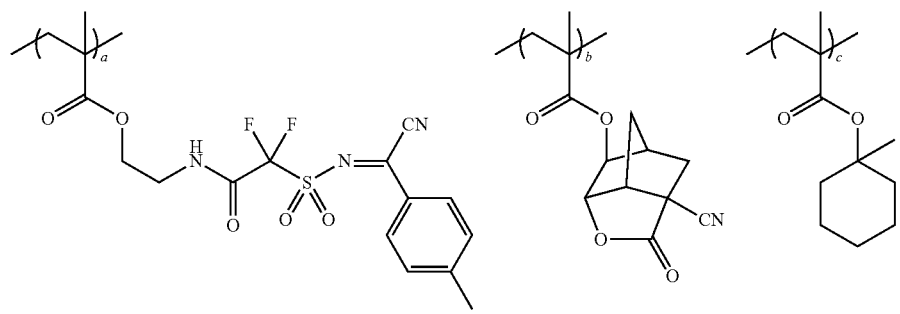
a/b/c = 15/40/45
Mw = 6500, Mw/Mn = 1.72
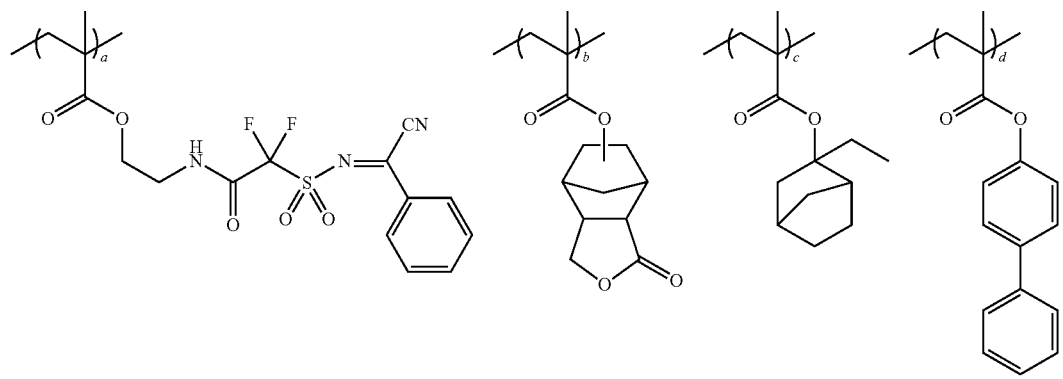
a/b/c/d = 15/25/45/15
Mw = 13000, Mw/Mn = 1.90
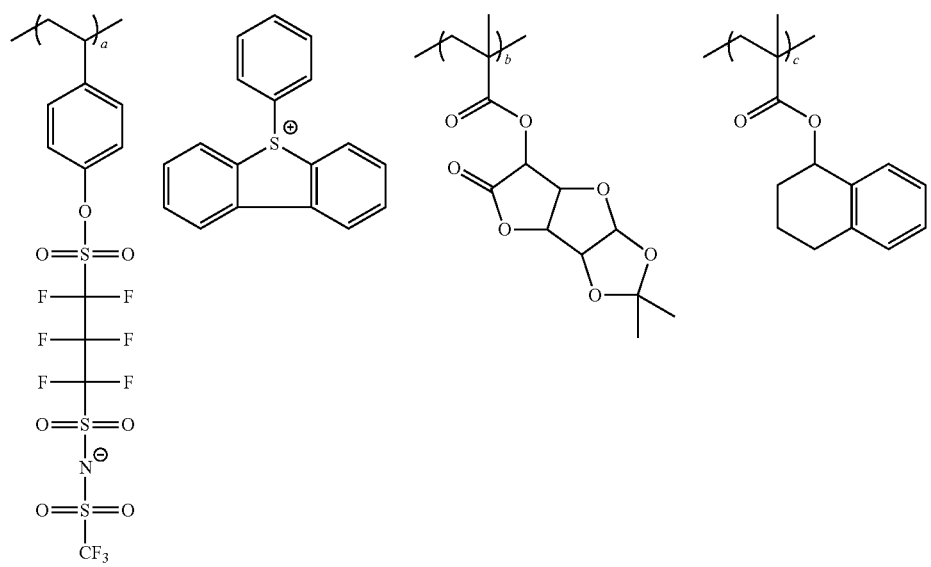
a/b/c = 10/35/55
Mw = 16000 Mw/Mn = 1.80

-continued
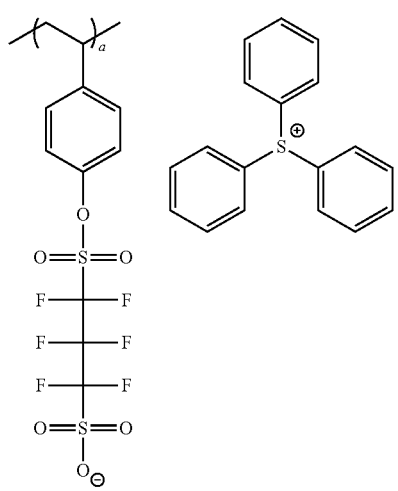
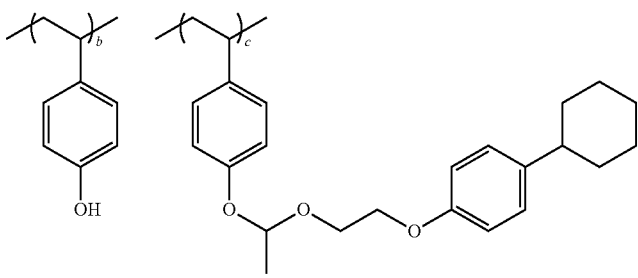
a/b/c = 15/20/65
Mw = 5500 Mw/Mn = 1.15
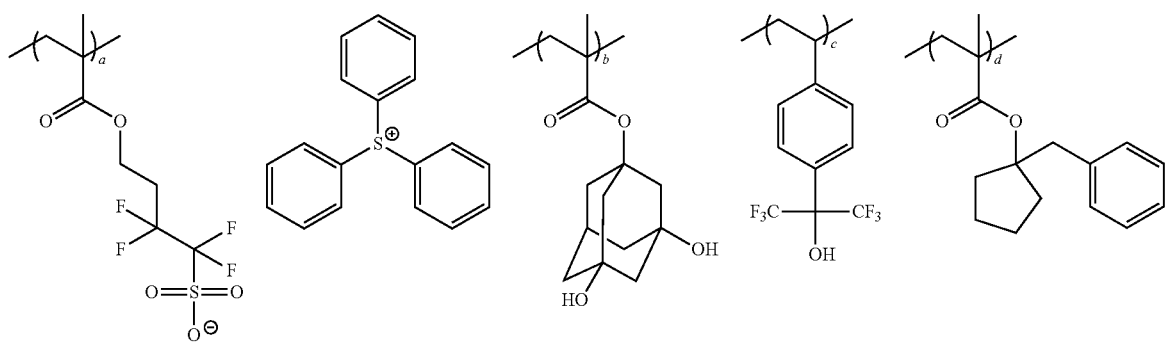
a/b/c/d = 10/30/10/50
Mw = 25000 Mw/Mn = 2.00
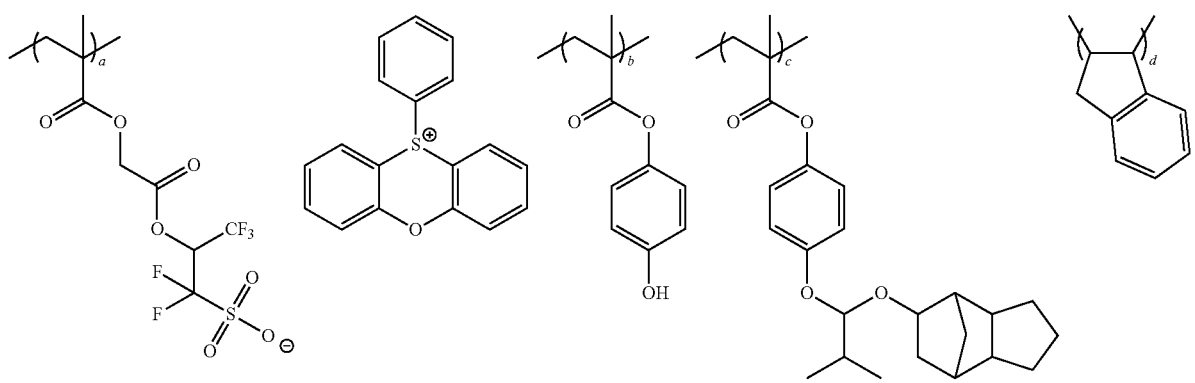
a/b/c/d = 10/25/50/15
Mw = 19000 Mw/Mn = 1.60

-continued
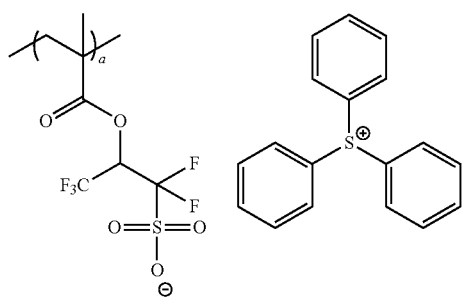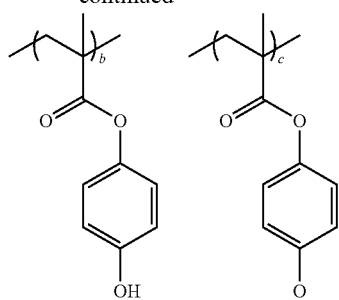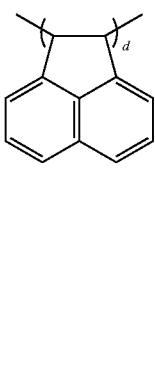
a/b/c/d = 15/15/55/15
Mw = 8500 Mw/Mn = 1.46
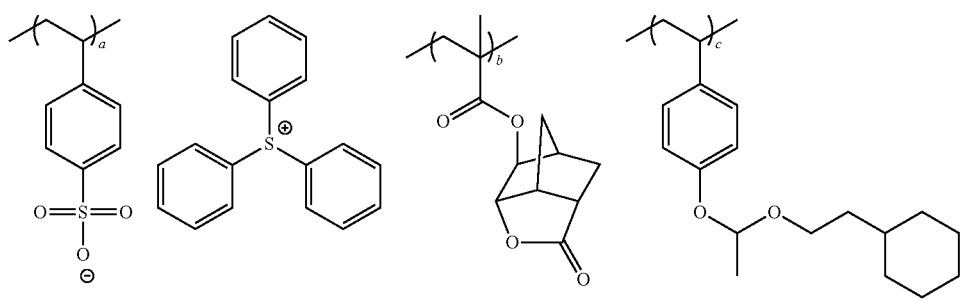
a/b/c = 15/30/55
Mw = 6500 Mw/Mn = 1.40
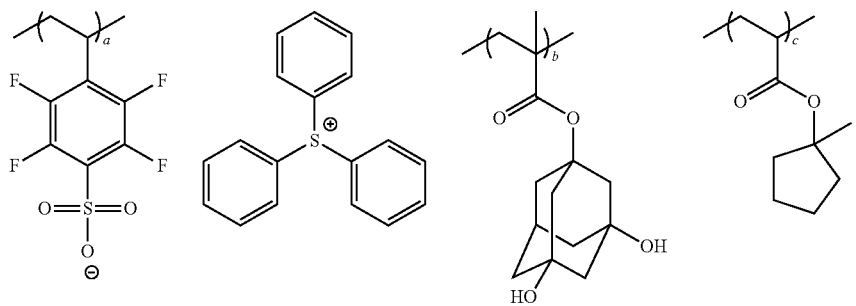
a/b/c = 15/40/45
Mw = 8000 Mw/Mn = 1.50
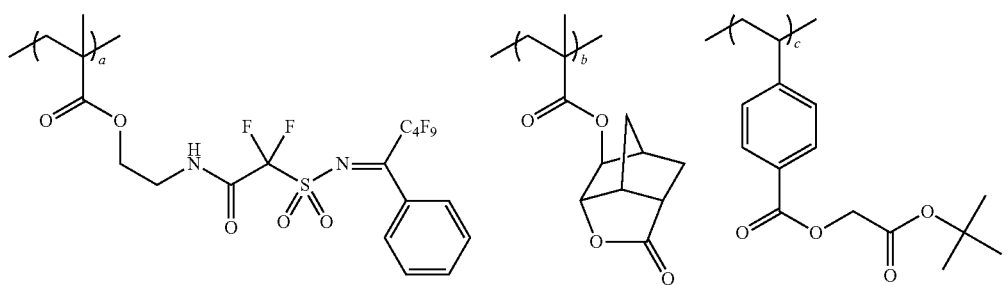
a/b/c = 20/30/50
Mw = 8000, Mw/Mn = 1.75

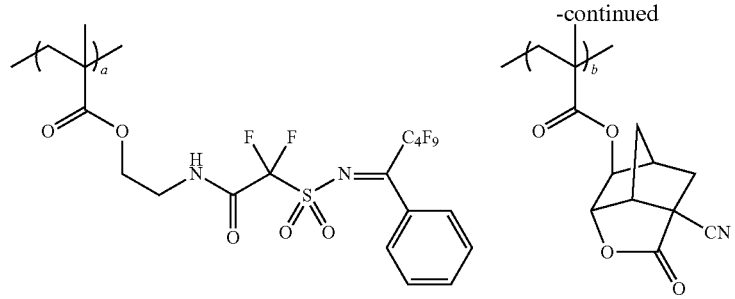 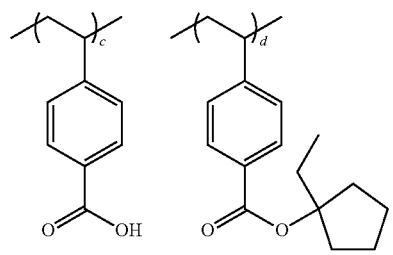

a/b/c/d = 15/25/10/50
Mw = 9000, Mw/Mn = 1.75

[2] Compound That Generates an Acid by Being Irradiated with Actinic Rays or Radioactive Rays Generally, the composition may contain a compound (hereinafter, referred to as "the compound (B)" or "acid generator") that generates an acid by being irradiated with actinic rays or radiation. As the compound (B) that generates an acid by being irradiated with actinic rays or radiation, a compound that generates an organic acid by being irradiated with actinic rays or radiation is preferable.

As the acid generator, a photoinitiator of photocationic polymerization, a photoinitiator of photoradical polymerization, a photo-decoloring agent of pigments, photo-discoloring agents, and well-known compounds that generate an acid by being irradiated with actinic rays or radiation used in a micro resist or the like, and mixtures thereof can be appropriately selected and be used.

Examples thereof include diazonium salts, phosphonium salts, sulfonium salts, iodonium salts, imide sulfonates, oxime sulfonates, diazodisulfones, disulfones, and o-nitrobenzylsulfonates.

Particularly preferred examples of the acid generators are described below.

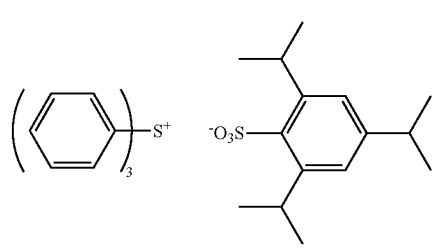
(z1)

(z2)

(z3)

(z4)

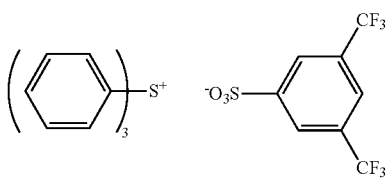
(z5)

(z6)

(z7)

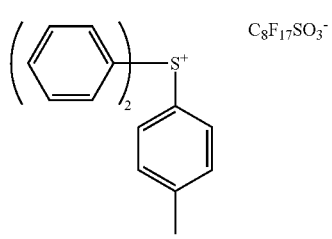
(z8)

(z9)

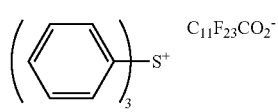

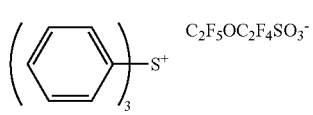

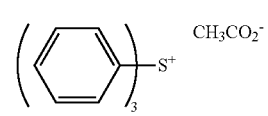

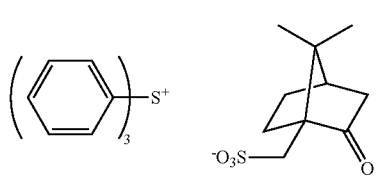
(z10)

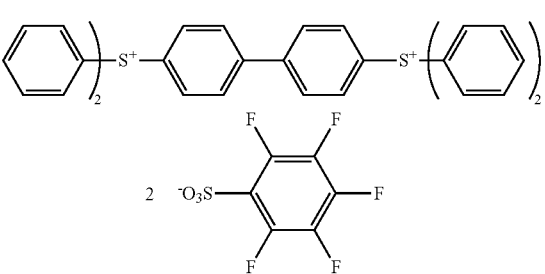
(z11)

-continued
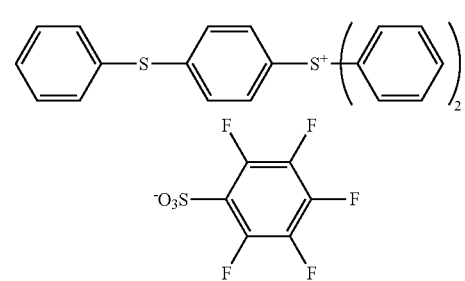 (z12)
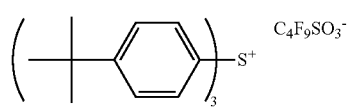 (z13)
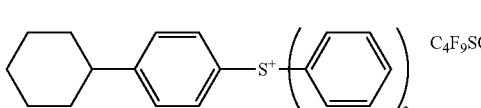 (z14)
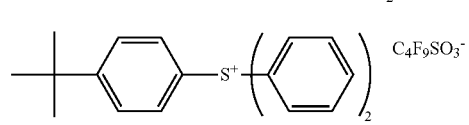 (z15)
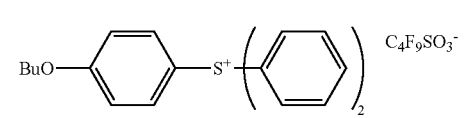 (z16)
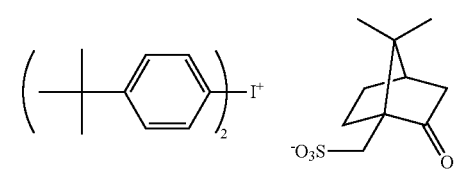 (z17)
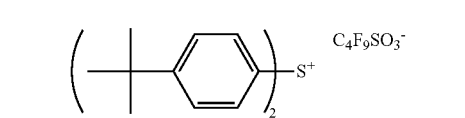 (z18)
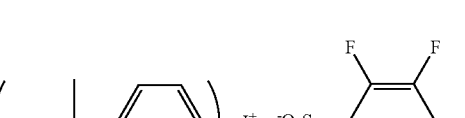 (z19)
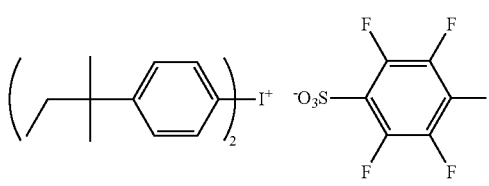 (z20)
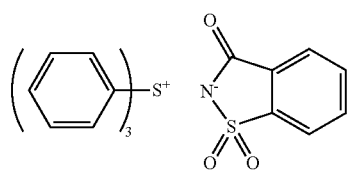 (z21)
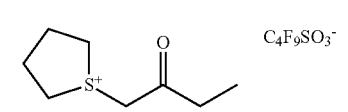 (z22)
-continued
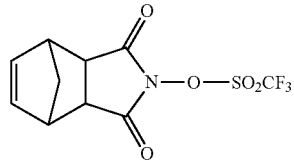 (z23)
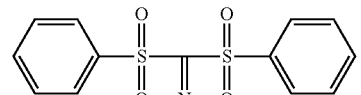 (z24)
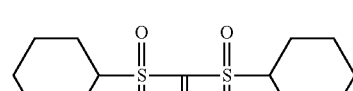 (z25)
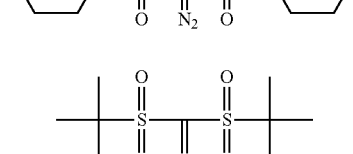 (z26)
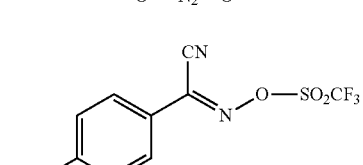 (z27)
 (z28)
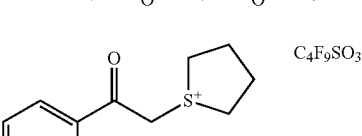 (z29)
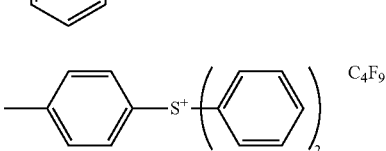 (z30)
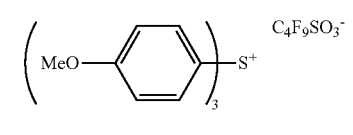 (z31)
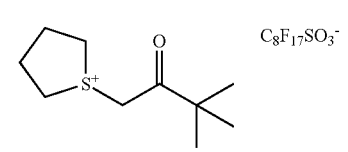 (z32)

-continued (z33) [structure] C₄F₉SO₃⁻

(z34) [structure] C₄F₉SO₃⁻

(z35) [structure] C₃F₇SO₃⁻

(z36) [structure]

(z37) [structure]

(z38) [structure]

(z39) [structure]

(z40) [structure]

-continued (z41) [structure]

(z42) [structure]

(z43) [structure] C₄F₉SO₃⁻

(z44) [structure] C₄F₉SO₃⁻

(z45) [structure]

(z46) [structure]

(z47) [structure]

(z48) [structure]

(z49) [structure]

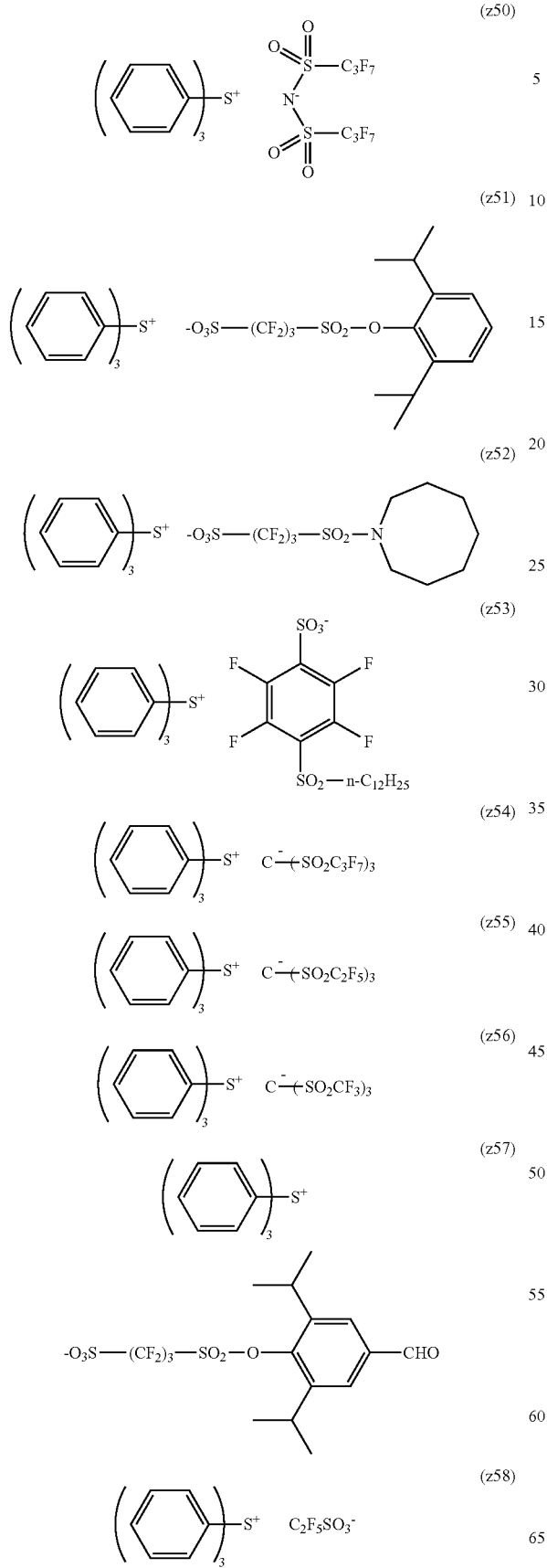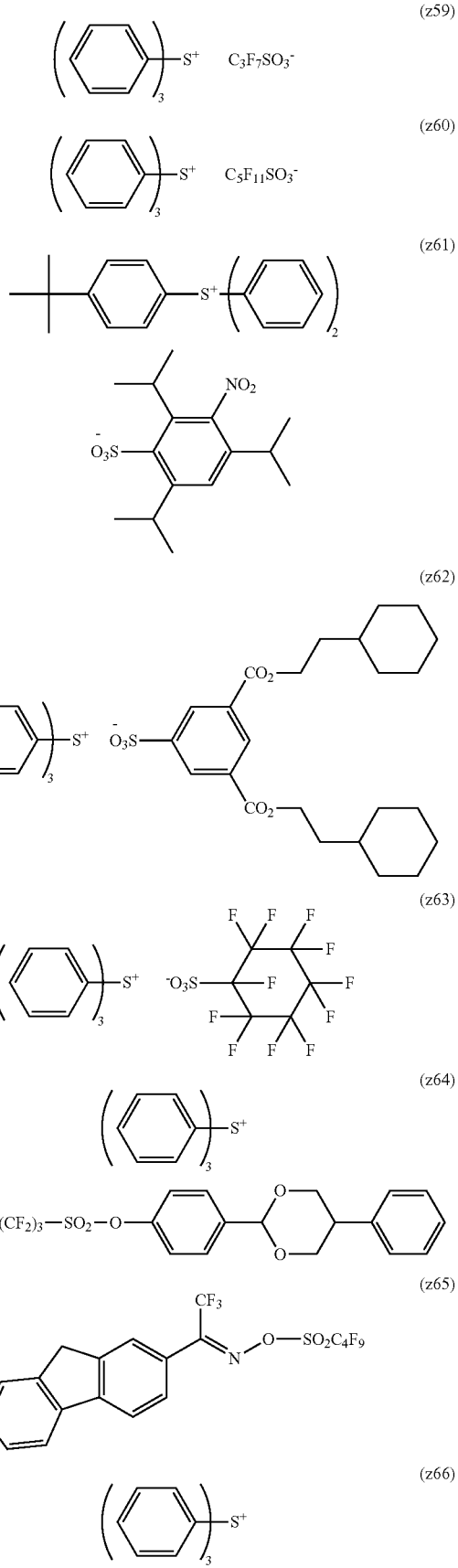

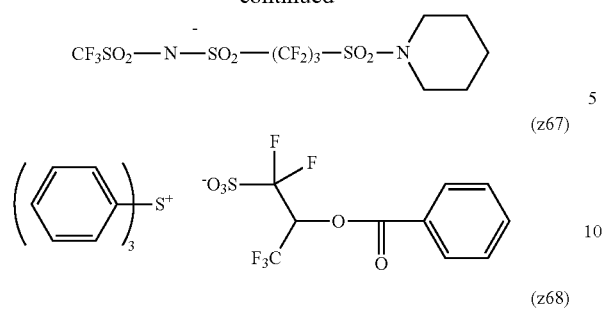
(z67)
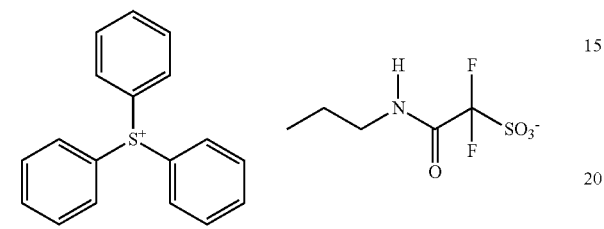
(z68)
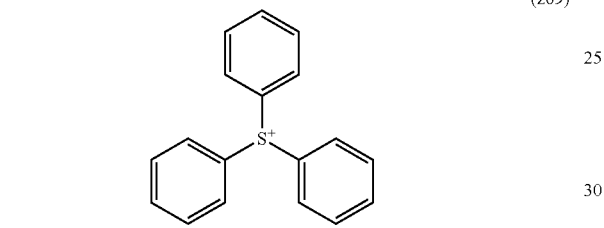
(z69)
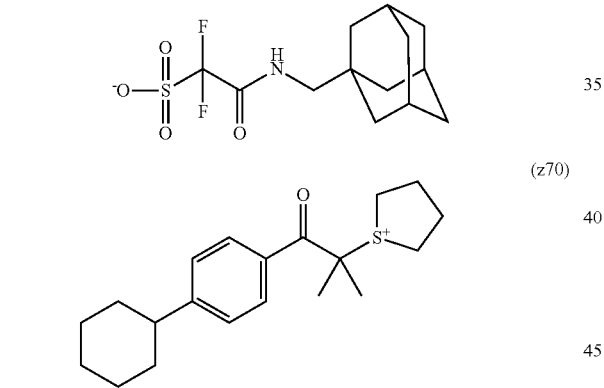
(z70)
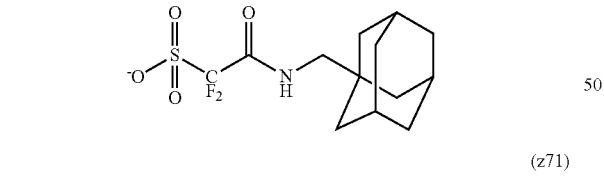
(z71)
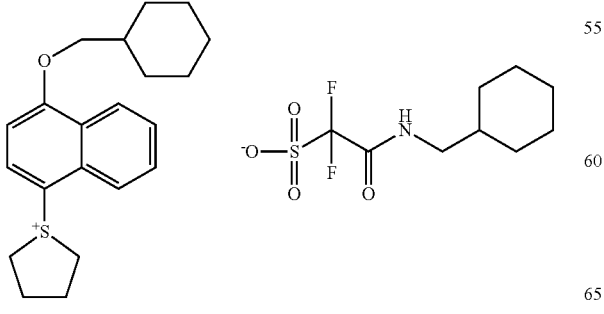
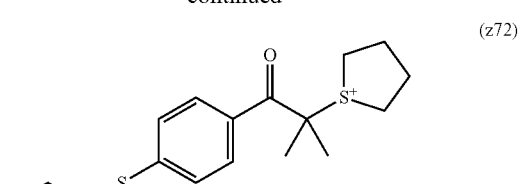
(z72)
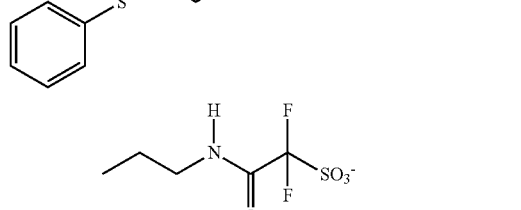
(z73)
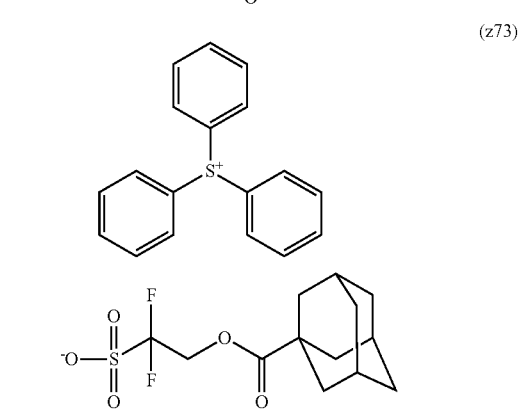
(z74)
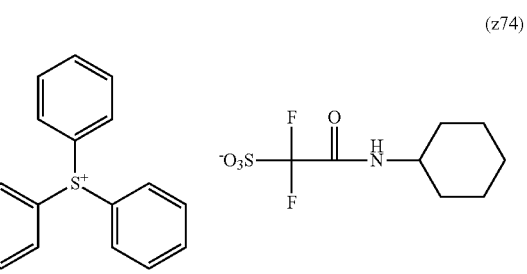
(z75)
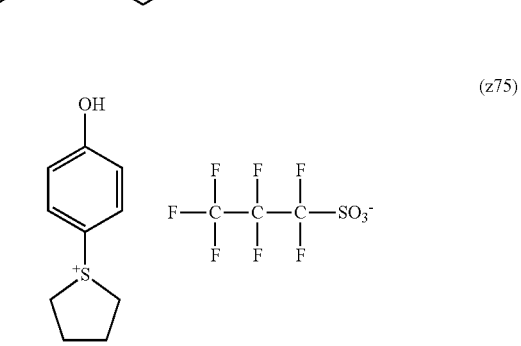
(z76)

-continued
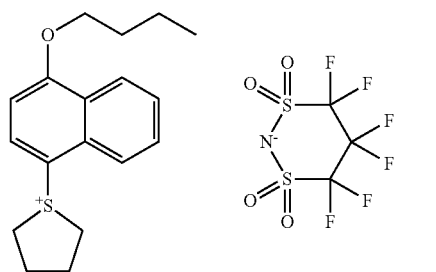
(z77)
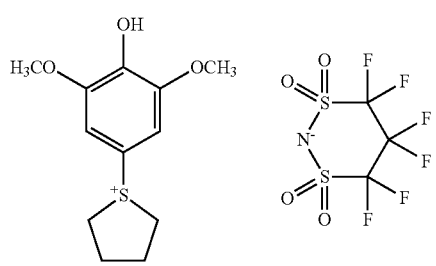
(z78)
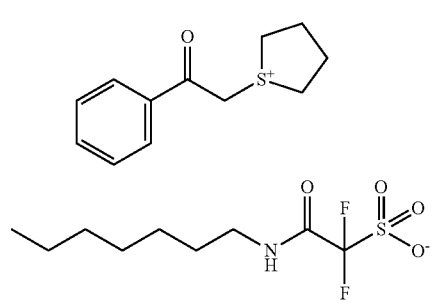
(z79)
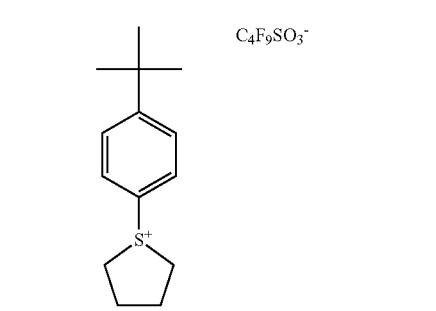
(z80)
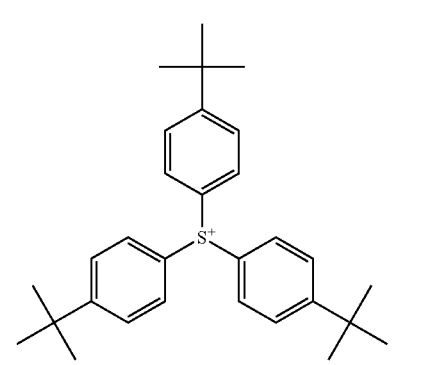
(z81)
-continued
(z82)
(z83) C$_4$F$_9$SO$_3^-$
(z84) C$_4$F$_9$SO$_3^-$
(z85) C$_4$F$_9$SO$_3^-$
(z86) C$_4$F$_9$SO$_3^-$
(z87)

(z88) 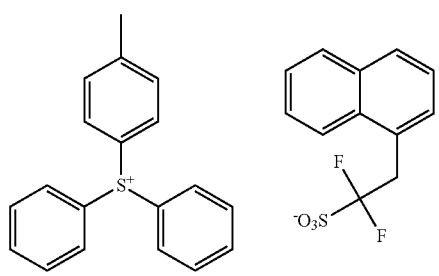
(z89) 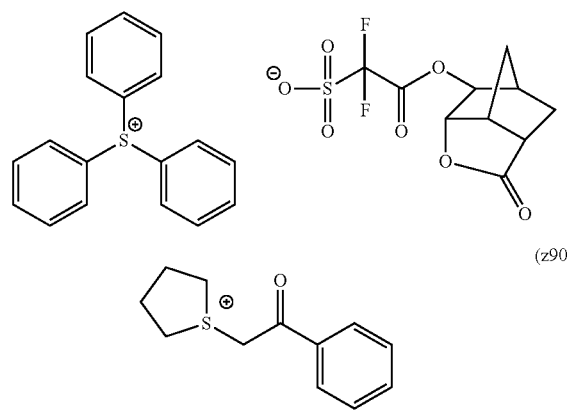
(z90) 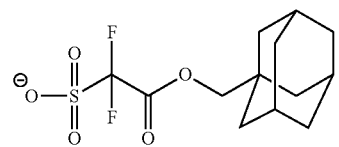
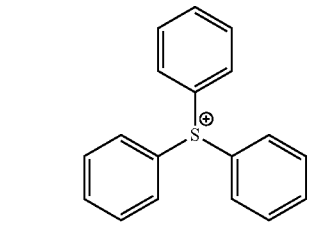
(z91) 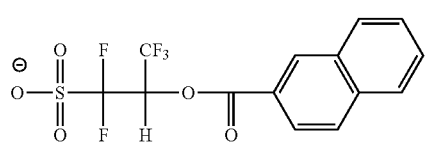
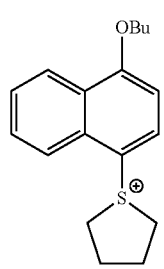 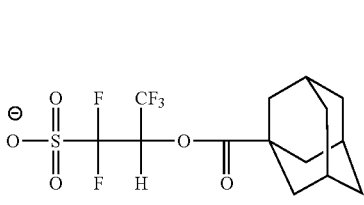
(z92) 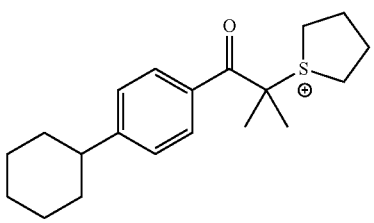
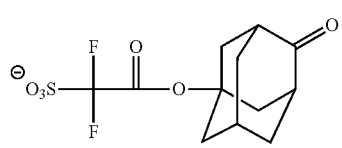
(z93) 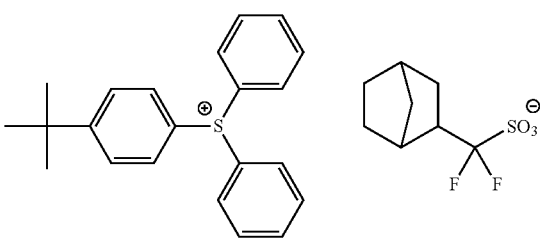
(z94) 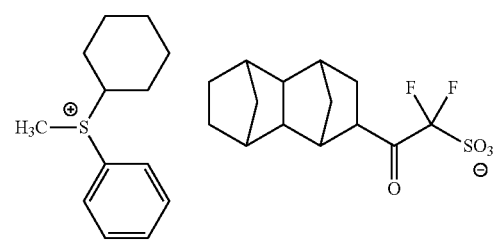
(z95) 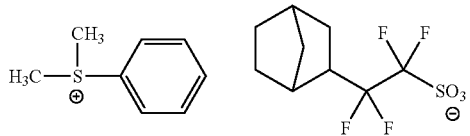
(z96) 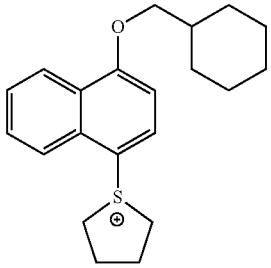
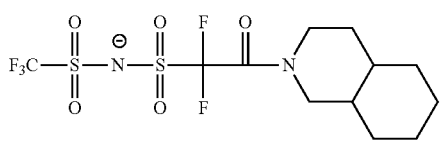
(z97)

-continued (z98) (z103)

(z99) (z104)

(z100)

(z105)

(z101)

(z106)

(z102)

(z107)

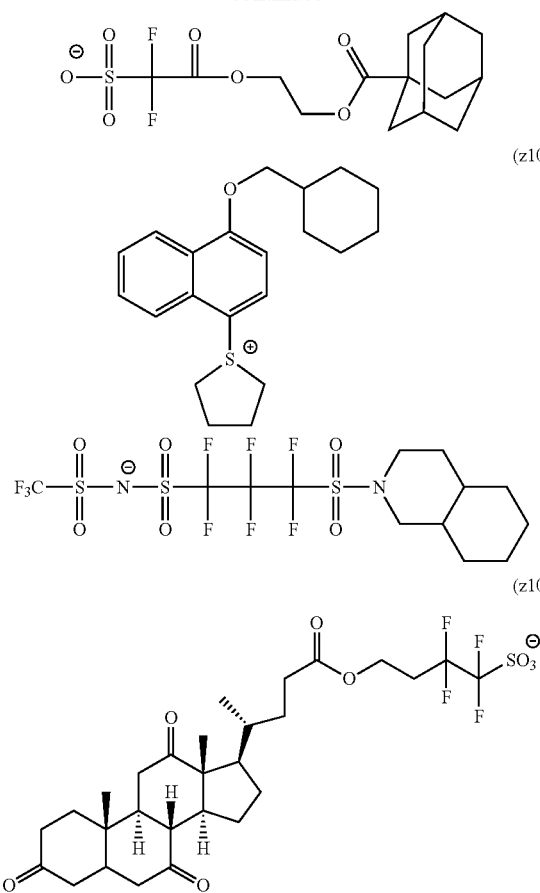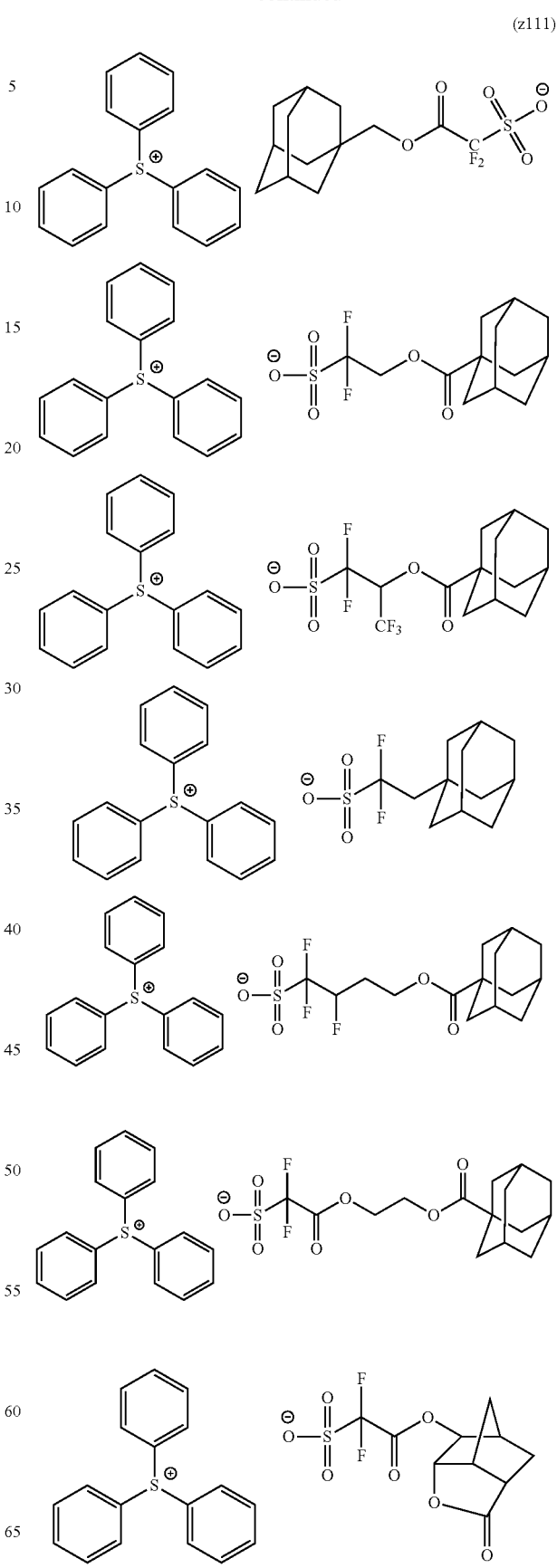

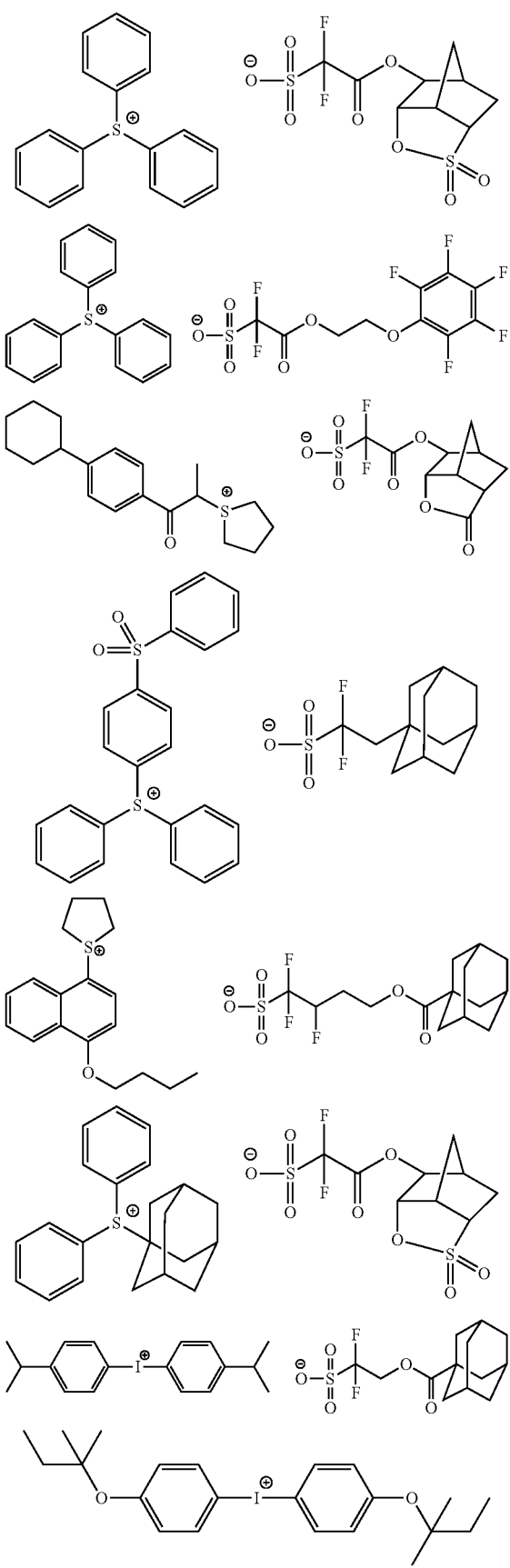
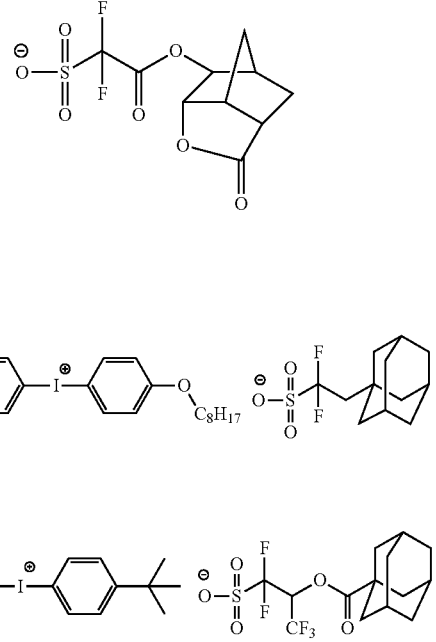

The acid generator can be synthesized by well-known methods, and can be synthesized by methods disclosed in, for example, JP2007-161707A, "0200" to "0210" of JP2010-100595A, "0051" to "0058" of WO2011/093280A, "0382" to "0385" of WO2008/153110A, and JP2007-161707A.

The acid generator can be used singly or two or more types thereof may be used in combination.

The content ratio in the composition of the compound that generates an acid by being irradiated with actinic rays or radiation is preferably 0.1 mass % to 30 mass %, more preferably 0.5 mass % to 25 mass %, even more preferably 3 mass % to 20 mass %, and particularly more preferably 3 mass % to 15 mass % with respect to a total solid content of the composition.

With respect to the actinic ray-sensitive or radiation-sensitive resin composition, there is also an aspect (B) in which the structure corresponding to the acid generator is supported on the resin (A). Specific examples of this embodiment include the structures described in JP2011-248019A (particularly, structures described in paragraphs "0164" to "0191", and structures included in resins described in examples of paragraph "0555"), and repeating units (R) disclosed in paragraphs "0023" to "0210" of JP2013-80002A and contents thereof are incorporated in this specification. Even in the embodiment in which the structure corresponding to the acid generator is supported on the resin (A), the actinic ray-sensitive or radiation-sensitive resin composition may additionally contain an acid generator which is not supported on the resin (A). That is, the composition may include the resin (A) on which the structure corresponding to the acid generator is supported or a compound (B).

Examples of the embodiment (B') include repeating units as below, but the invention is not limited thereto.

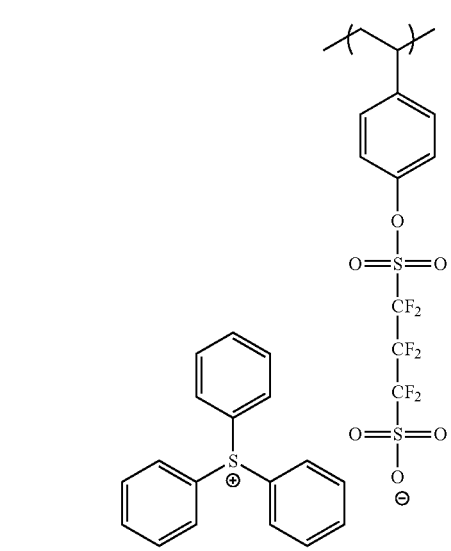
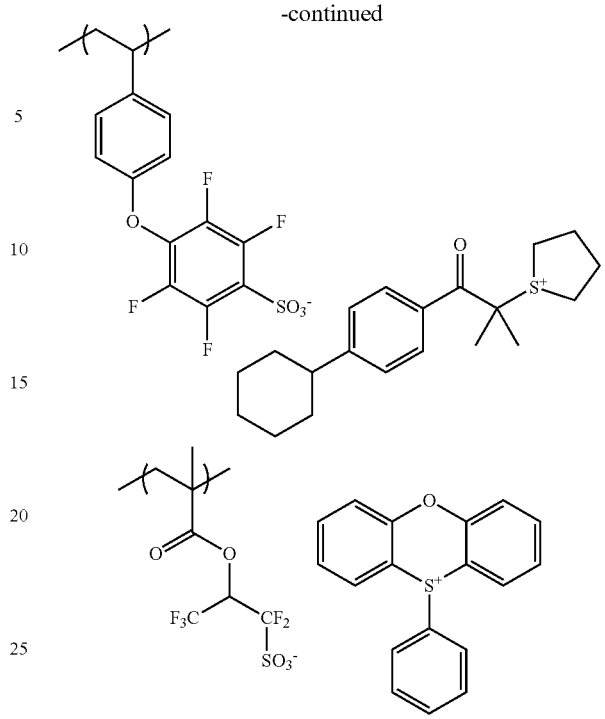
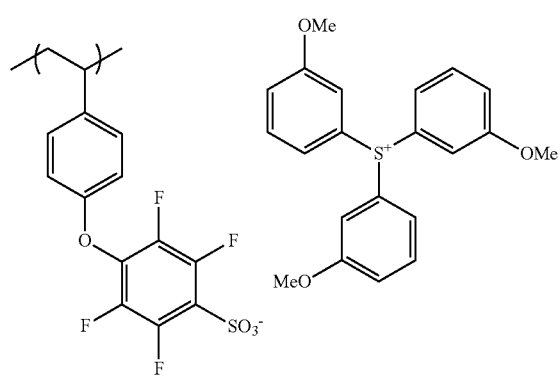
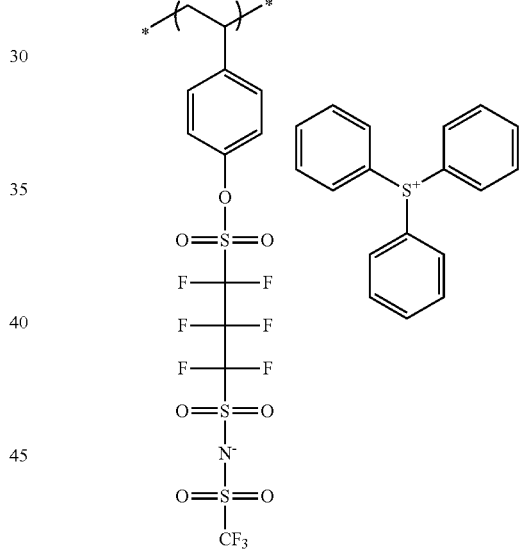
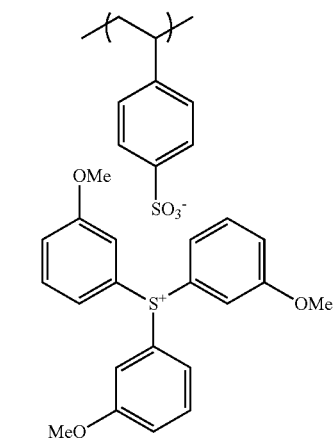

[3] Solvent

In general, the composition preferably contains a solvent.

Examples of the solvent that can be used when the composition is prepared include organic solvents such as an alkylene glycol monoalkyl ether carboxylate, an alkylene glycol monoalkyl ether, an alkyl lactate, an alkyl alkoxypropionate, a cyclic lactone (preferably having 4 to 10 carbon atoms), a monoketone compound that may have a ring (preferably having 4 to 10 carbon atoms), an alkylene carbonate, an alkyl alkoxy acetate, and an alkyl pyruvate.

Specific examples of these solvents include products disclosed in Paragraphs "0441" to "0455" of US2008/0187860A.

According to the invention, plural types of organic solvents may be mixed to be used.

For example, a mixed solvent in which a solvent containing a hydroxyl group in the structure and a solvent not containing a hydroxyl group are mixed may be used as the organic solvent. The solvent containing a hydroxyl group and the solvent not containing a hydroxyl group can be suitably selected from the exemplary compounds described above. However, as the solvent containing a hydroxyl group, alkylene glycol monoalkyl ether, alkyl lactate, or the like is preferable, and propylene glycol monomethyl ether (PGME, alternative name: 1-methoxy-2-propanol) or ethyl lactate is more preferable. As the solvent not containing a hydroxyl group, alkylene glycol monoalkyl ether acetate, alkyl alkoxy propionate, a monoketone compound which may contain a ring, cyclic lactone, alkyl acetate, or the like is preferable. Among these, propylene glycol monomethyl ether acetate (PGMEA, alternative name: 1-methoxy-2-acetoxypropane), ethylethoxypropionate, 2-heptanone, γ-butyrolactone, cyclohexanone, and butyl acetate are particularly preferable, and propylene glycol monomethyl ether acetate, ethylethoxypropionate, and 2-heptanone are most preferable.

Of course, it is also possible to use organic solvents not containing a hydroxyl group in the structure in combination. Examples of this combination include a combination of PGMEA and cyclohexanone, a combination of PGMEA and cyclopentanone, a combination of PGMEA and γ-butyrolactone, and a combination of PGMEA and 2-heptanone.

For example, in the case where two or more types of solvents are used, the mixing ratio (mass) thereof is 1/99 to 99/1, preferably 10/90 to 90/10, and more preferably 20/80 to 60/40.

The solvent preferably includes propylene glycol monomethyl ether acetate, and a single solvent of propylene glycol monomethyl ether acetate, or a mixed solvents of two or more solvents containing propylene glycol monomethyl ether acetate is preferable.

If an appropriate amount of a solvent having a relatively high boiling point such as γ-butyrolactone is used, performances of a hydrophobic resin (D) below are more unevenly distributed on the surface, and thus it is expected that performances on the liquid immersion exposure are enhanced.

Three or more types of solvents may be used. Accordingly, more delicate resist shape adjustment and the adjustment of viscosity may be performed. Examples of this combination include PGMEA•PGME•γ-butyrolactone, PGMEA•PGME•cyclohexanone, PGMEA•PGME•2-heptanone, PGMEA•cyclohexanone•γ-butyrolactone, and PGMEA•γ-butyrolactone•2-heptanone.

[4] The Hydrophobic Resin (D)

When being applied to the liquid immersion exposure, the composition used in the invention may contain a hydrophobic resin (hereinafter, referred to as "the hydrophobic resin (D)" or simply "resin (D)"). It is preferable that the hydrophobic resin (D) is different from the resin (A).

In the case where the hydrophobic resin (D) is contained, the hydrophobic resin (D) is unevenly distributed on the film surface. Therefore, in the case where the liquid immersion medium is water, a static or dynamic contact angle of the surface of the resist film to water increases, and thus liquid immersion liquid followability can be enhanced.

Even in the case where the composition is not applied to liquid immersion exposure, the hydrophobic resin (D) may be included for various purposes. For example, when the composition is applied to EUV exposure, it is preferable to use the hydrophobic resin (D), expecting outgas suppression, adjustment of pattern shape, and the like.

It is preferable that the hydrophobic resin (D) is designed to be unevenly distributed on an interface as described above, but does not necessarily have a hydrophilic group in a molecule differently from the surfactant and does not have to contribute to the homogeneous mixture of polar/non-polar substances.

In order to cause the hydrophobic resin (D) to be unevenly distributed on the film surface, the hydrophobic resin (D) preferably has any one or more types of a "fluorine atom", a "silicon atom", and a "$CH_3$ partial structure contained in a side chain portion of resin" and more preferably has two or more types thereof.

The weight average molecular weight of the hydrophobic resin (D) in terms of polystyrene standards is preferably 1,000 to 100,000, more preferably 1,000 to 50,000, and even more preferably 2,000 to 15,000.

The hydrophobic resin (D) may be used, and plural types thereof may be used in combination.

The content of the hydrophobic resin (D) in the composition is preferably 0.01 mass % to 10 mass %, more preferably 0.05 mass % to 8 mass %, and even more preferably 0.1 mass % to 7 mass % with respect to the total solid content of the composition.

It is natural that the hydrophobic resin (D) has some impurities such as metals in the same manner as the resin (A), and a residual monomer or an oligomer component is preferably 0.01 mass % to 5 mass %, more preferably 0.01 mass % to 3 mass %, and even more preferably 0.05 mass % to 1 mass %. Accordingly, it is possible to obtain a chemical amplification resist composition that does not have foreign substances in the liquid and does not exhibit variation in sensitivity over time. In view of the resolution, the resist form, the sidewall of the resist pattern, and the roughness, the molecular weight distribution (Mw/Mn, also referred to as the dispersity) is preferably in the range of 1 to 5, more preferably in the range of 1 to 3, and even more preferably in the range of 1 to 2.

As the hydrophobic resin (D), various commercially available products can be used, or the hydrophobic resin (D) may be synthesized by a general method (for example, radical polymerization). Examples of the general synthesization method include a collective polymerization method in which polymerization is performed by dissolving monomer species or initiators in a solvent and performing baking and a dripping polymerization method in which a solution of the monomer species and an initiator are added to a baking solvent by being dripped over 1 hour to 10 hours, and the dripping polymerization method is preferable.

The reaction solvent, the polymerization initiator, reaction conditions (temperature, concentration, and the like), and a refinement method after reaction are the same as those described for the resin (A), but in the synthesization of the hydrophobic resin (D), the concentration in the reaction is preferably 30 mass % to 50 mass %. More specifically, disclosure in paragraphs "0320" to "0329" of JP2008-292975A may be referred to.

Hereinafter, specific examples of the hydrophobic resin (D) are described. The molar ratios (corresponding to respective repeating units in the order from the left), the weight average molecular weights, and the dispersity of the repeating units in the respective resins are presented in the table below.

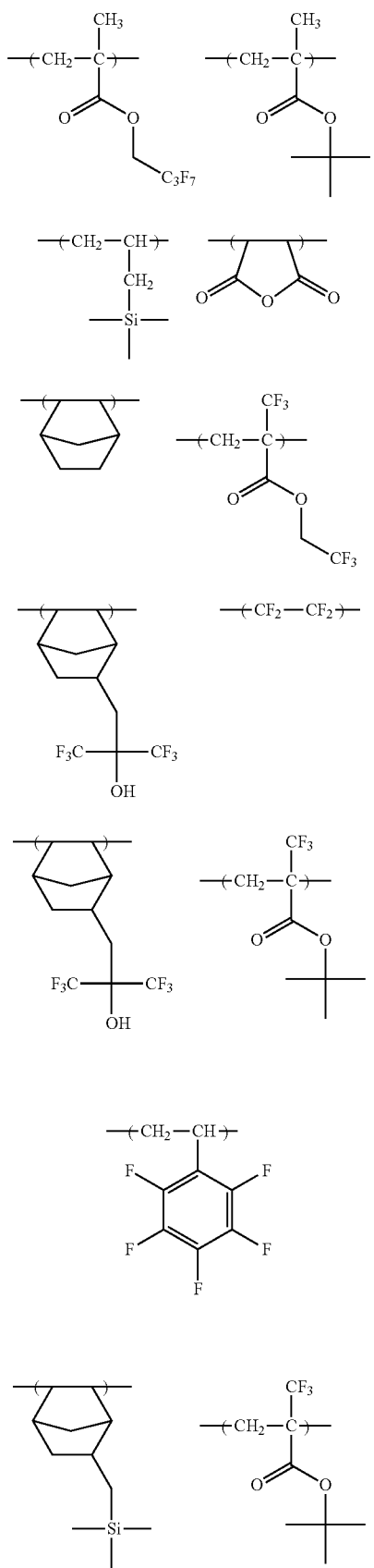
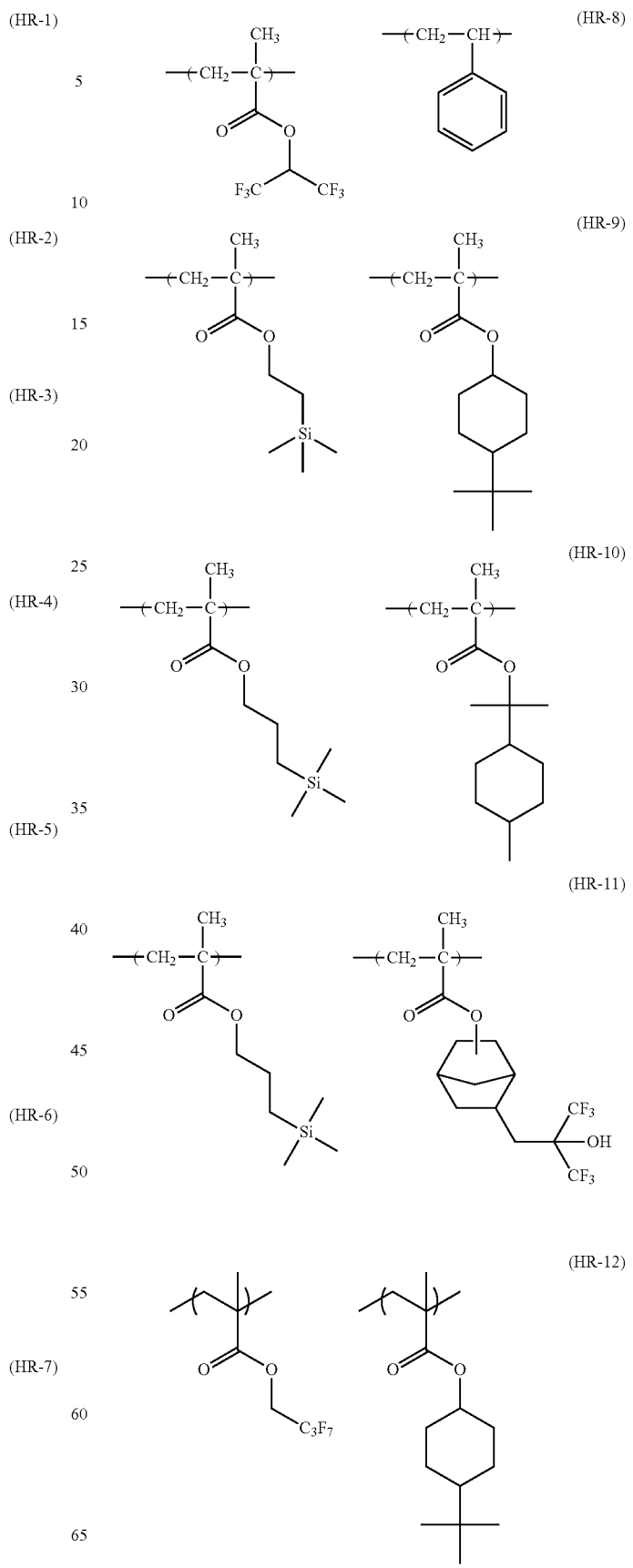

(HR-13)
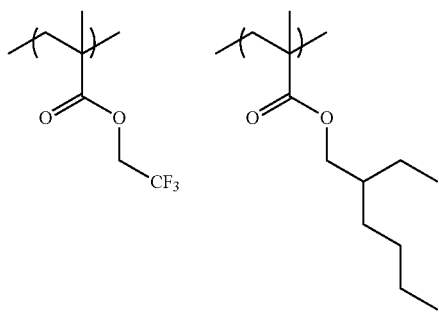
(HR-14)
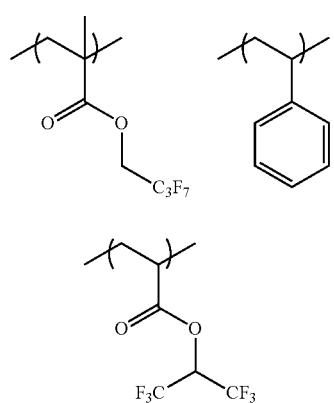
(HR-15)
(HR-16)
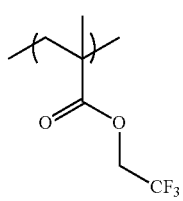
(HR-17)
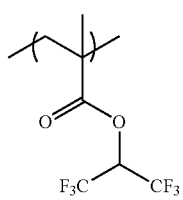
(HR-18)
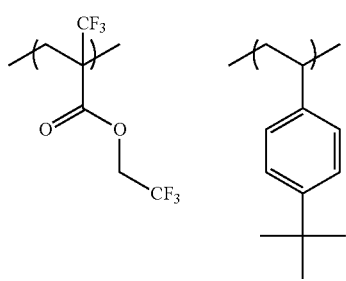
(HR-19)
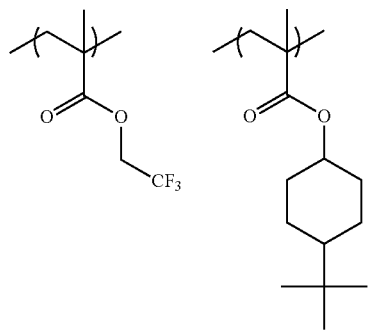
(HR-20)
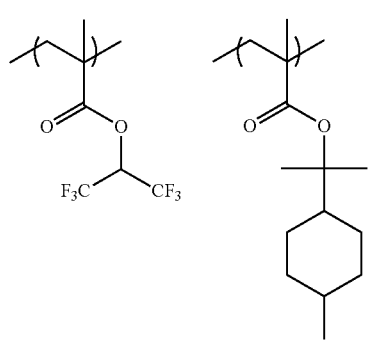
(HR-21)
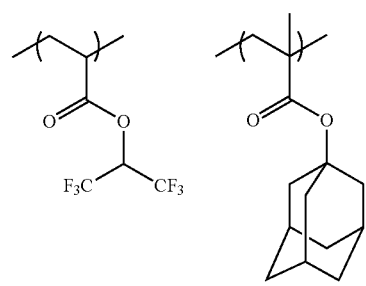
(HR-22)
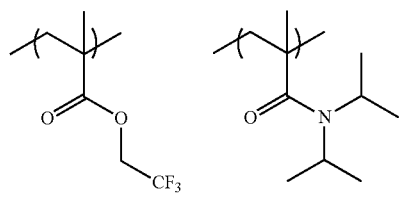
(HR-23)
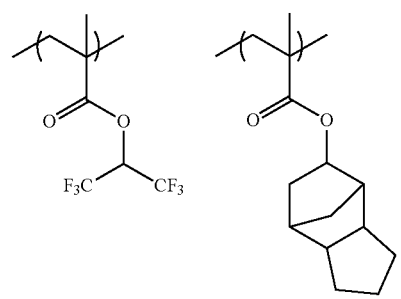

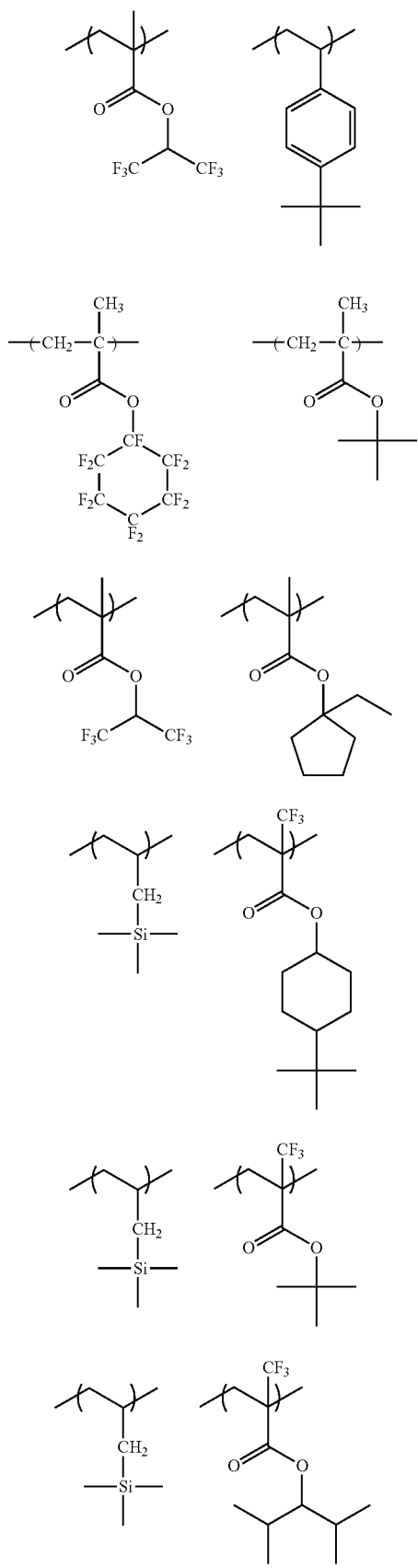
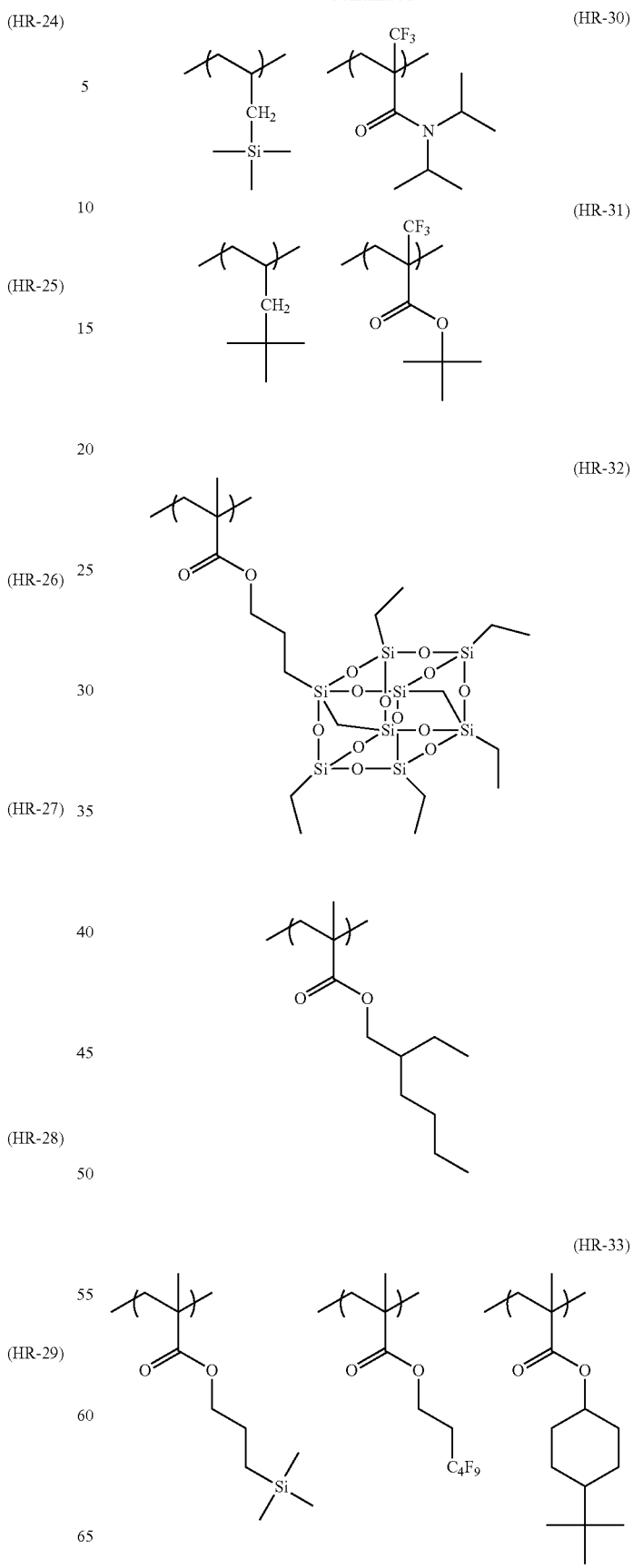

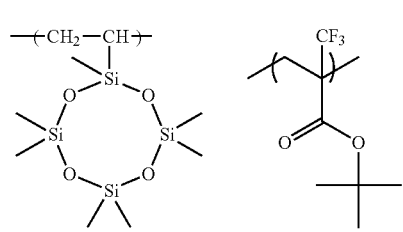 (HR-34)
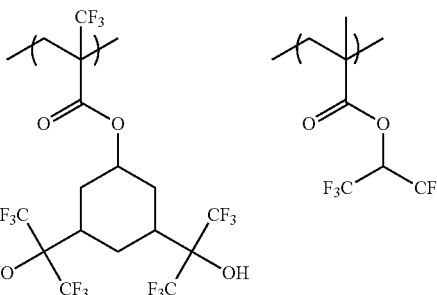 (HR-39)
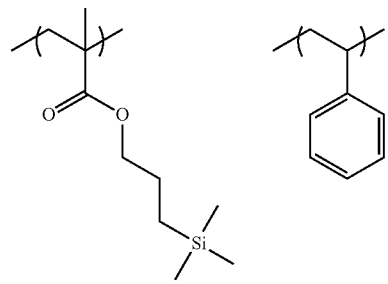 (HR-35)
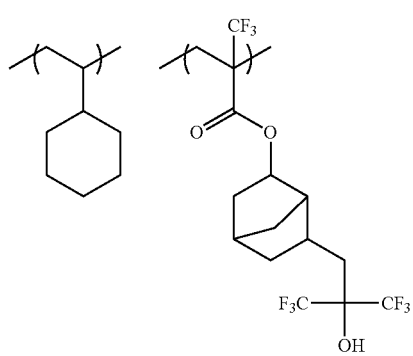 (HR-36)
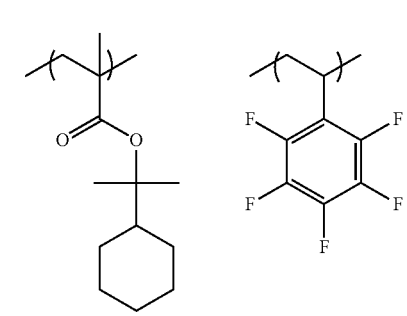 (HR-40)
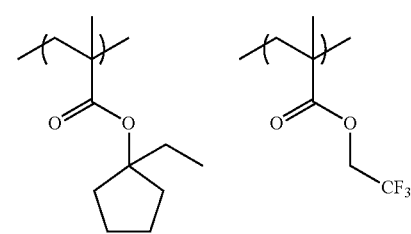 (HR-41)
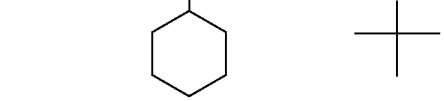 (HR-37)
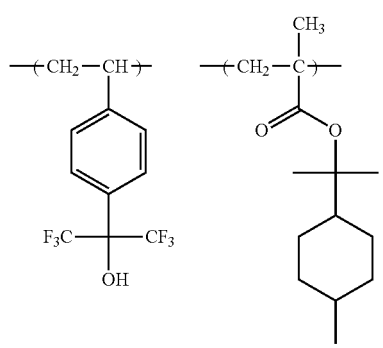 (HR-42)
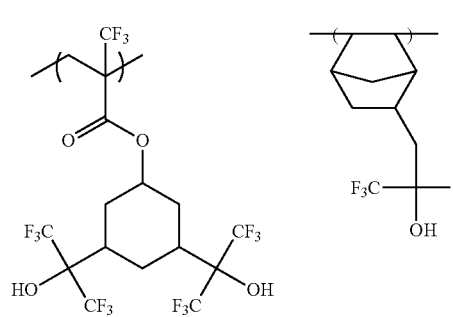 (HR-38)
(HR-43)

(HR-44)
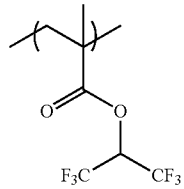 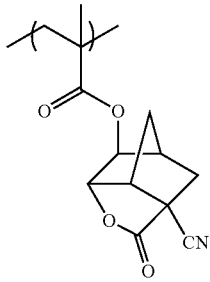
(HR-45)
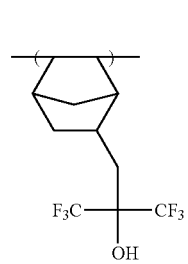 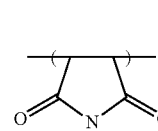 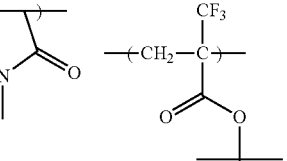
(HR-46)
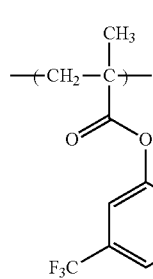 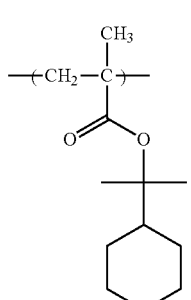
(HR-47)
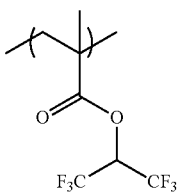 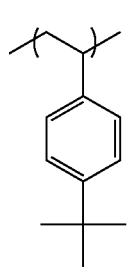 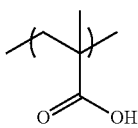
(HR-48)
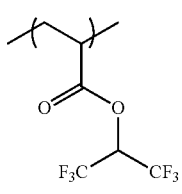 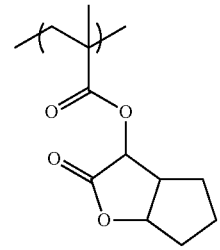
(HR-49)
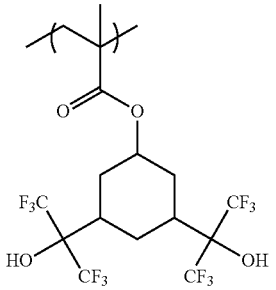
(HR-50)
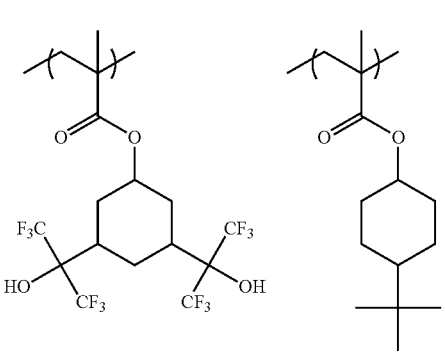
(HR-51)
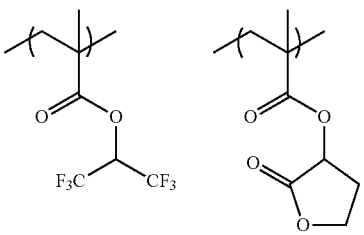 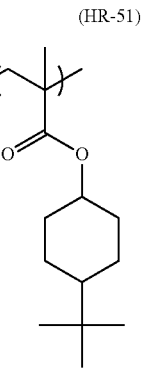
(HR-52)
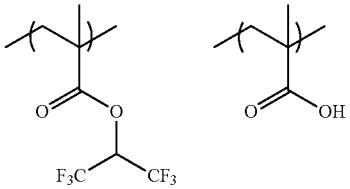
(HR-53)
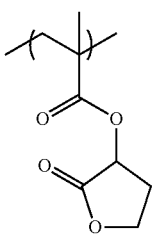 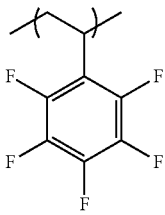

(HR-54)
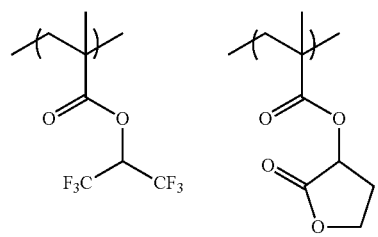
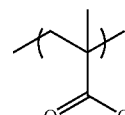
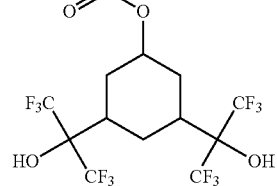
(HR-55)
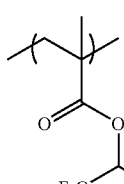 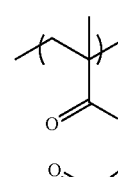
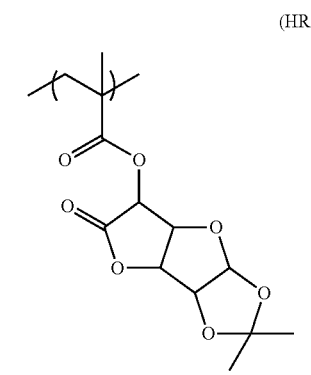
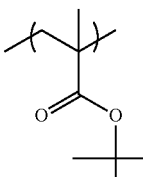
(HR-56)
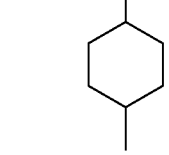
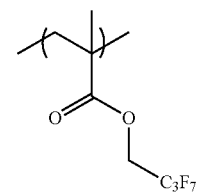
(HR-57)
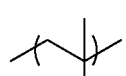
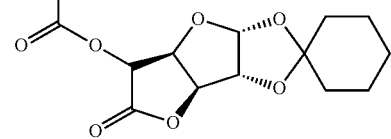
(HR-58)
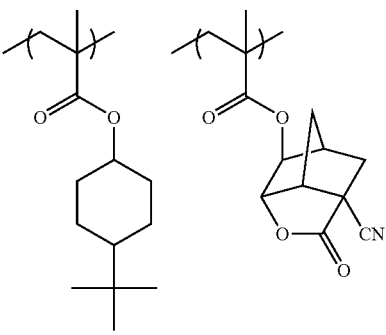
(HR-59)
 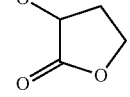
(HR-60)
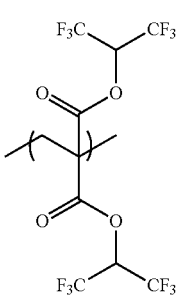 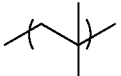 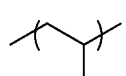
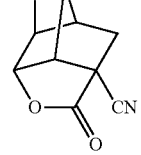
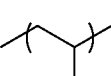
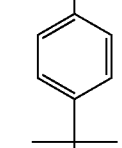
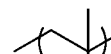
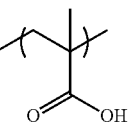

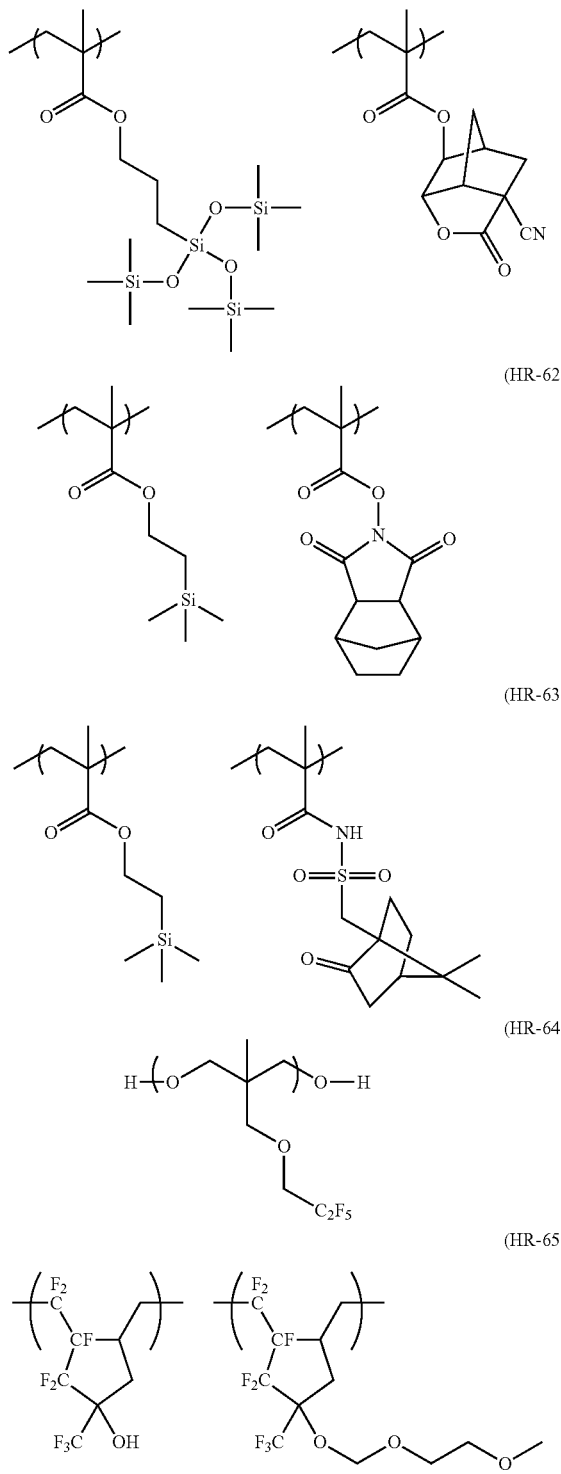
| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

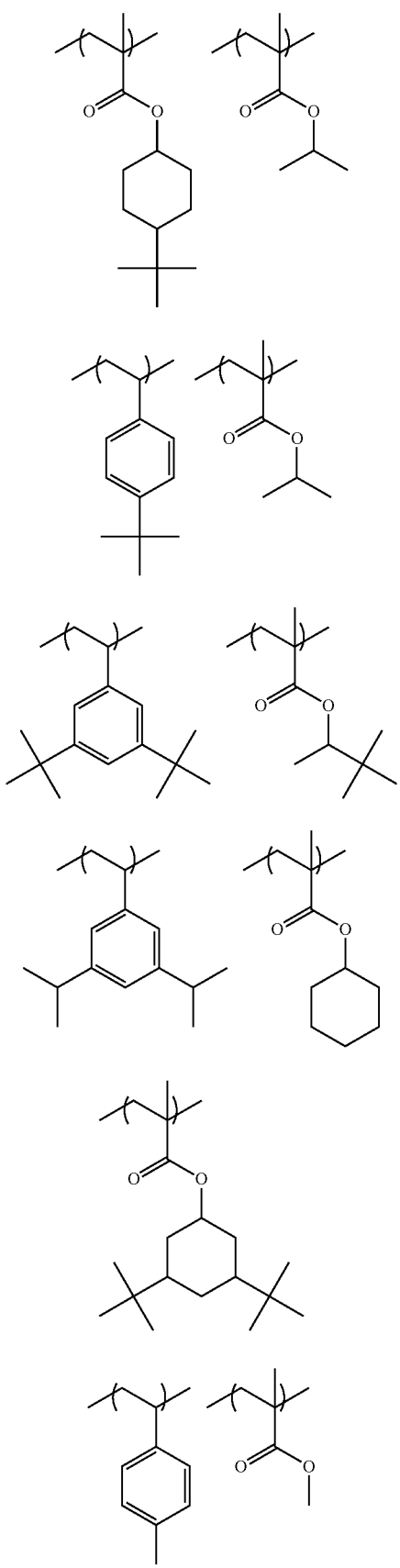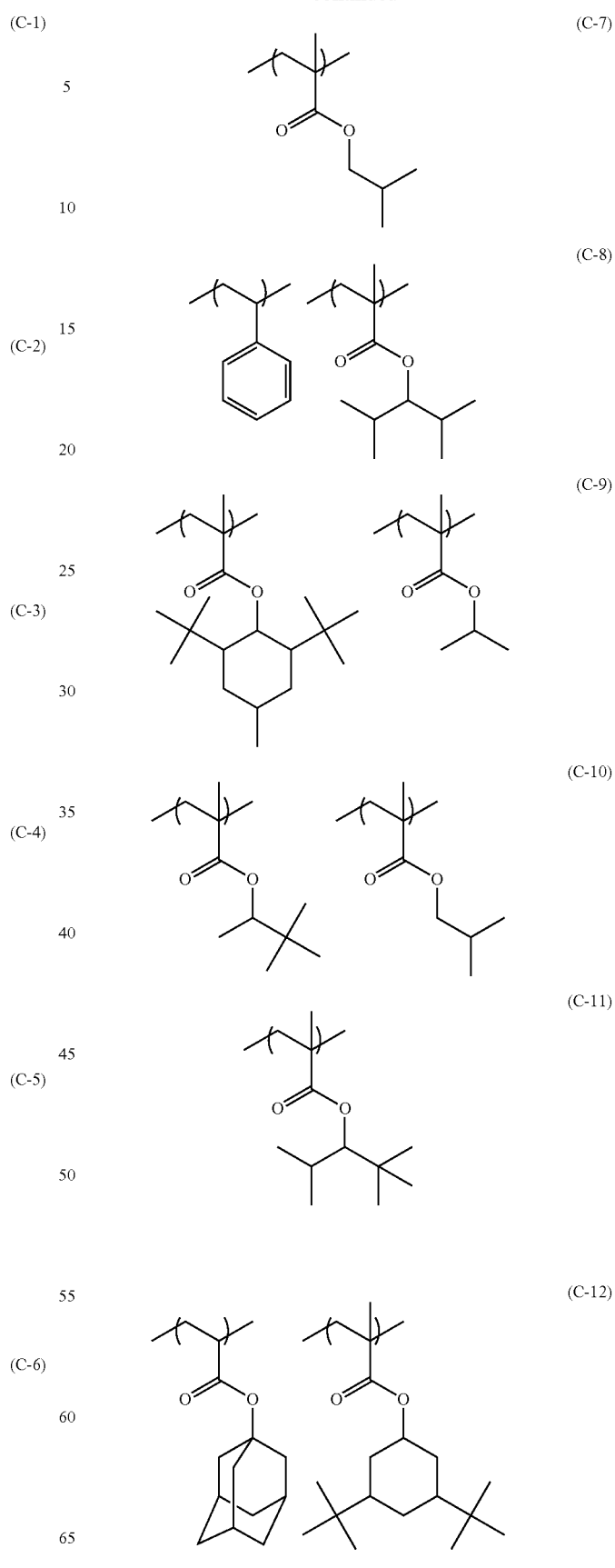

-continued
(C-13)
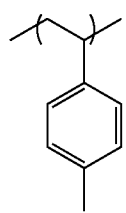
(C-14)
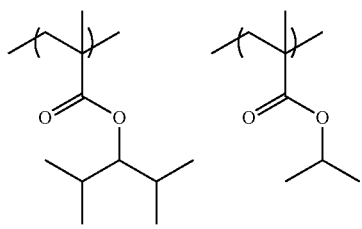
(C-15)
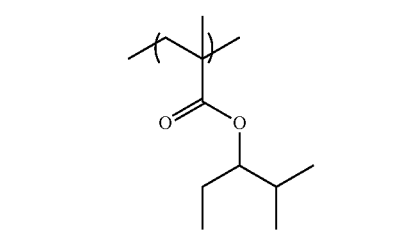
(C-16)
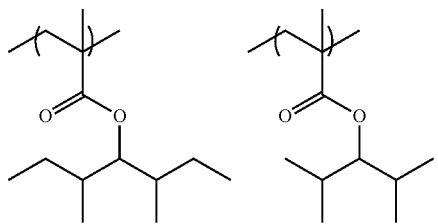
(C-17)
(C-18)
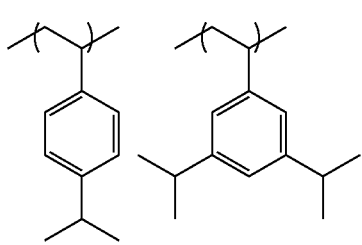
-continued
(C-19)
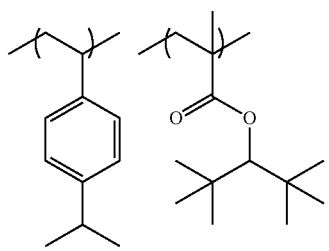
(C-20)
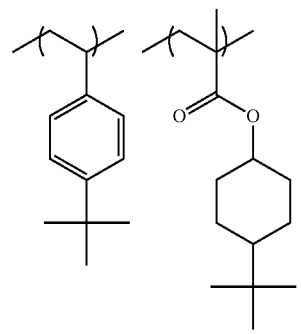
(C-21)
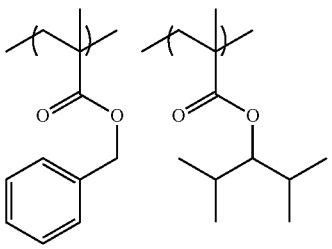
(C-22)
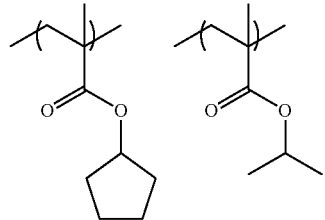
(C-23)
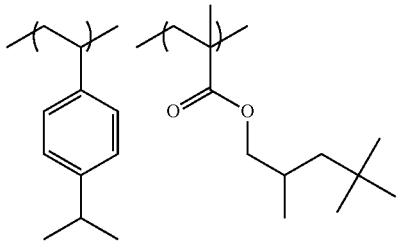
(C-24)
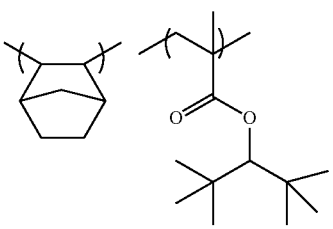

(C-25)
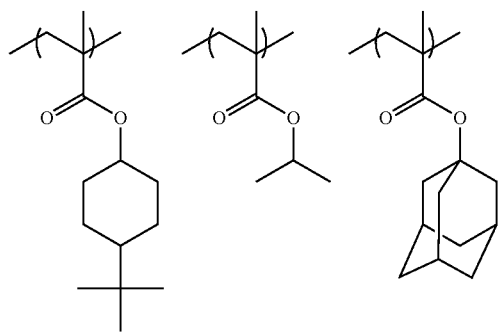
(C-26)
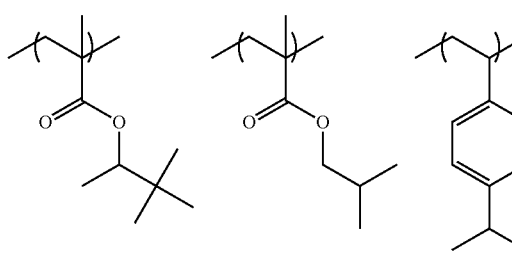
(C-27)
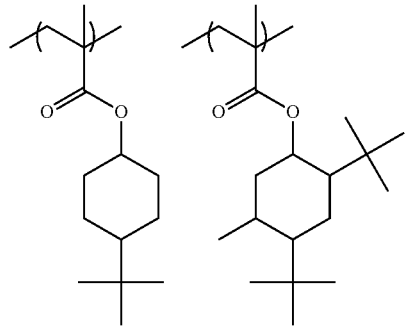
(C-28)
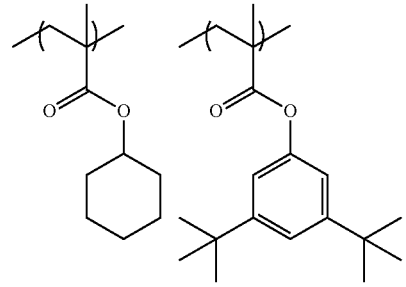
(D-1)
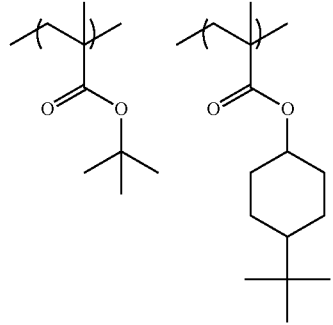
(D-2)
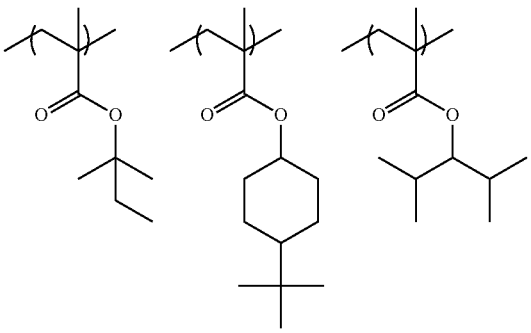
(D-3)
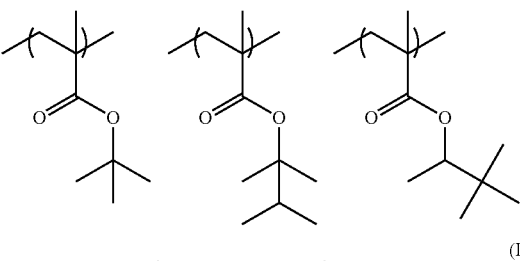
(D-4)
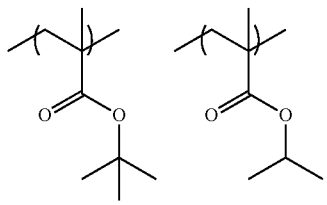
(D-5)
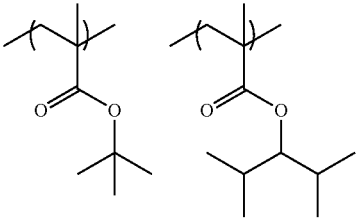
(D-6)
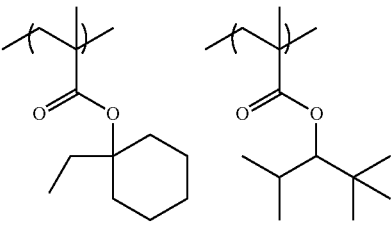
(D-7)
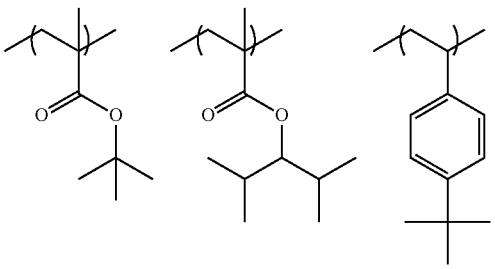

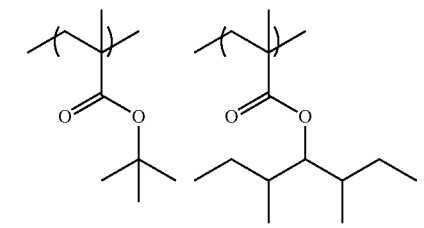
(D-8)
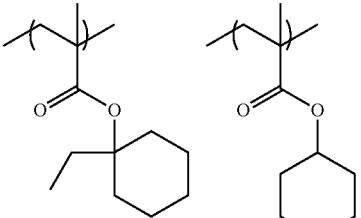
(D-13)
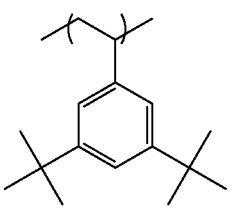
(D-9)
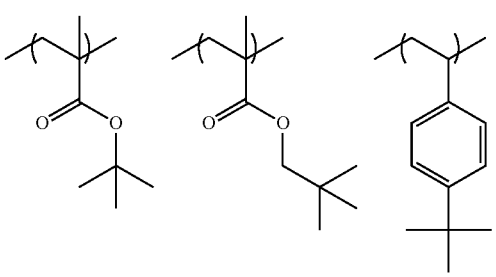
(D-10)
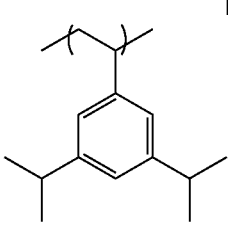
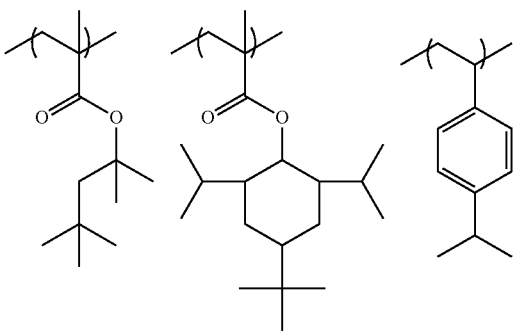
(D-14)
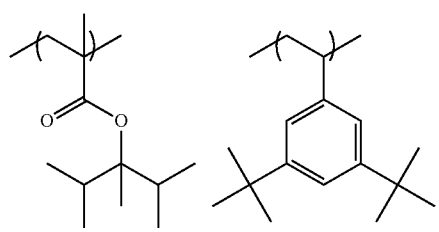
(D-11)
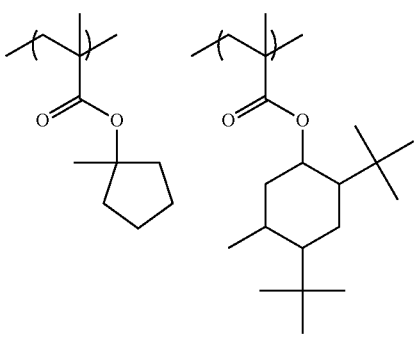
(D-15)
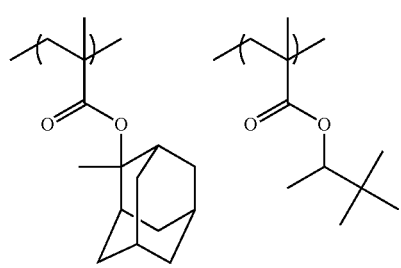
(D-12)
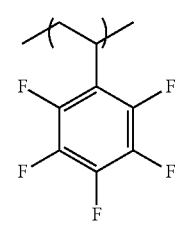

-continued

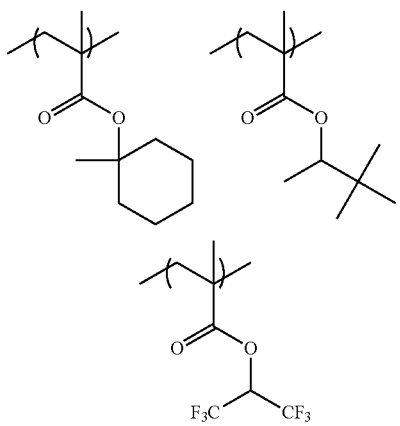
(D-16)

| Resin | Composition | Mw | Mw/Mn |
|-------|-------------|-------|-------|
| C-1 | 50/50 | 9600 | 1.74 |
| C-2 | 60/40 | 34500 | 1.43 |
| C-3 | 30/70 | 19300 | 1.69 |
| C-4 | 90/10 | 26400 | 1.41 |
| C-5 | 100 | 27600 | 1.87 |
| C-6 | 80/20 | 4400 | 1.96 |
| C-7 | 100 | 16300 | 1.83 |
| C-8 | 5/95 | 24500 | 1.79 |
| C-9 | 20/80 | 15400 | 1.68 |
| C-10 | 50/50 | 23800 | 1.46 |
| C-11 | 100 | 22400 | 1.57 |
| C-12 | 10/90 | 21600 | 1.52 |
| C-13 | 100 | 28400 | 1.58 |
| C-14 | 50/50 | 16700 | 1.82 |
| C-15 | 100 | 23400 | 1.73 |
| C-16 | 60/40 | 18600 | 1.44 |
| C-17 | 80/20 | 12300 | 1.78 |
| C-18 | 40/60 | 18400 | 1.58 |
| C-19 | 70/30 | 12400 | 1.49 |
| C-20 | 50/50 | 23500 | 1.94 |
| C-21 | 10/90 | 7600 | 1.75 |
| C-22 | 5/95 | 14100 | 1.39 |
| C-23 | 50/50 | 17900 | 1.61 |
| C-24 | 10/90 | 24600 | 1.72 |
| C-25 | 50/40/10 | 23500 | 1.65 |
| C-26 | 60/30/10 | 13100 | 1.51 |
| C-27 | 50/50 | 21200 | 1.84 |
| C-28 | 10/90 | 19500 | 1.66 |

| Resin | Composition | Mw | Mw/Mn |
|-------|-------------|-------|-------|
| D-1 | 50/50 | 16500 | 1.72 |
| D-2 | 10/50/40 | 18000 | 1.77 |
| D-3 | 5/50/45 | 27100 | 1.69 |
| D-4 | 20/80 | 26500 | 1.79 |
| D-5 | 10/90 | 24700 | 1.83 |
| D-6 | 10/90 | 15700 | 1.99 |
| D-7 | 5/90/5 | 21500 | 1.92 |
| D-8 | 5/60/35 | 17700 | 2.10 |
| D-9 | 35/35/30 | 25100 | 2.02 |
| D-10 | 70/30 | 19700 | 1.85 |
| D-11 | 75/25 | 23700 | 1.80 |
| D-12 | 10/90 | 20100 | 2.02 |
| D-13 | 5/35/60 | 30100 | 2.17 |
| D-14 | 5/45/50 | 22900 | 2.02 |
| D-15 | 15/75/10 | 28600 | 1.81 |
| D-16 | 25/55/20 | 27400 | 1.87 |

[5] Basic Compound

The composition preferably contains a basic compound.

(1) In one embodiment, the composition preferably contains a basic compound or an ammonium salt compound (hereinafter, also referred to as "compound (N)") of which basicity decreases by being irradiated with actinic rays or radioactive rays, as the basic compound.

The compound (N) is preferably a compound (N-1) that has a basic functional group or an ammonium group, and a group that generates an acidic functional group by being irradiated with actinic rays or radioactive rays. That is, the compound (N) is preferably a basic compound having a basic functional group and a group that generates an acidic functional group due to the irradiation with actinic rays or radioactive rays or an ammonium salt compound having an ammonium group and a group that generates an acidic functional group due to the irradiation of actinic rays or radioactive rays.

Specific examples of the compound (N) include the following compounds. In addition to the compounds provided below, as the compound (N), for example, compounds of (A-1) to (A-44) described in US2010/0233629A and compounds of (A-1) to (A-23) described in US2012/0156617A can also be preferably used in the present invention.

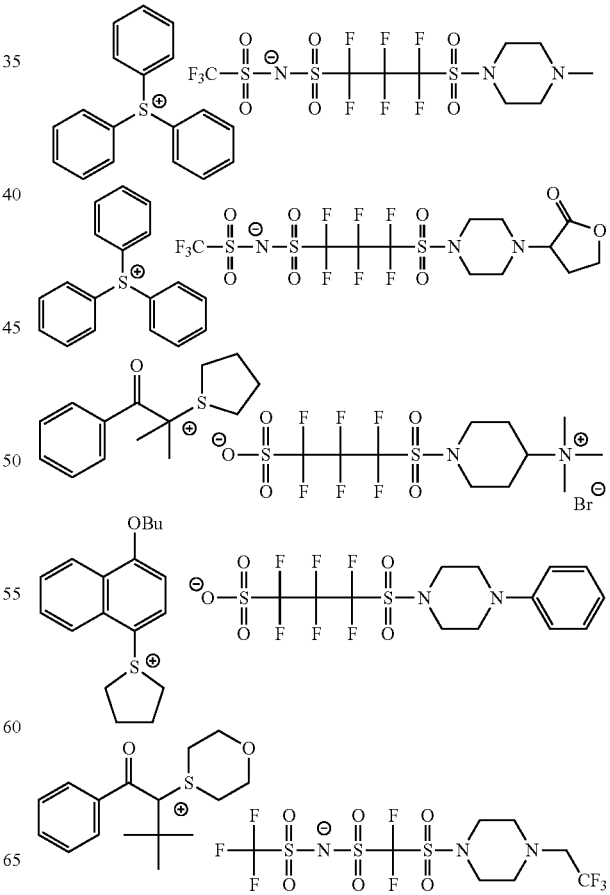

-continued

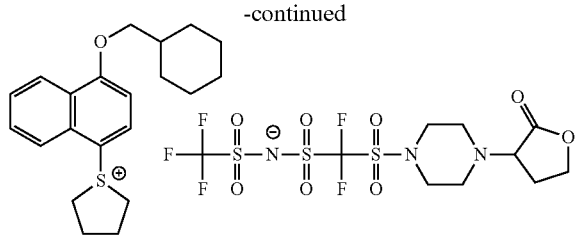

These compounds can be synthesized in accordance with synthesis examples described in JP2006-330098A, or the like.

The molecular weight of the compound (N) is preferably 500 to 1,000.

The composition may or may not contain the compound (N). However, in the case where the compound (N) is contained, the content ratio of the compound (N) is preferably 0.1 mass % to 20 mass % and more preferably 0.1 mass % to 10 mass % with respect to the solid content of the composition.

(2) in another embodiment, the composition may contain a basic compound (N') other than the compound (N) as the basic compound in order to reduce a change in performances with time elapse from exposure to baking.

Preferred examples of the basic compound (N') include compounds having structures represented by the following General Formulae (A') to (E').

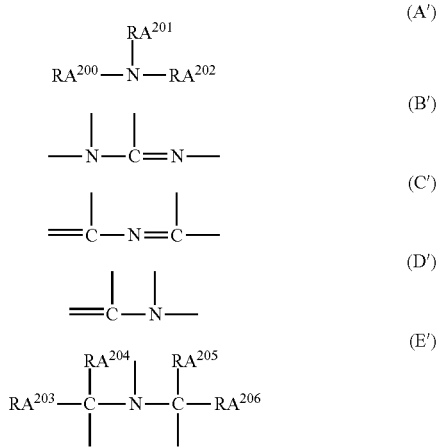

In General Formulae (A') and (E'), $RA^{200}$, $RA^{201}$, and $RA^{202}$ may be identical to or different from each other, and represent hydrogen atoms, alkyl groups (preferably having 1 to 20 carbon atoms), cycloalkyl groups (preferably having 3 to 20 carbon atoms), or aryl groups (having 6 to 20 carbon atoms) Here, $RA^{201}$ and $RA^{202}$ may be bonded to each other to form a ring. $RA^{203}$, $RA^{204}$, $RA^{205}$, and $RA^{206}$ may be identical to or different from each other and represent alkyl groups (preferably having 1 to 20 carbon atoms).

The alkyl group may have a substituent. As the alkyl group having a substituent, an aminoalkyl group having 1 to 20 carbon atoms, a hydroxyalkyl group having 1 to 20 carbon atoms, or a cyanoalkyl group having 1 to 20 carbon atoms is preferable.

It is more preferable that alkyl groups in General Formulae (A') and (E') are unsubstituted.

Specific preferable examples of the basic compound (N') include guanidine, aminopyrrolidine, pyrazole, pyrazoline, piperazine, aminomorpholine, aminoalkylmorpholine, and piperidine. More specific preferable examples thereof include compounds having an imidazole structure, a diazabicyclo structure, an onium hydroxide structure, an onium carboxylate structure, a trialkylamine structure, an aniline structure, or a pyridine structure; alkylamine derivatives having a hydroxyl group and/or an ether bond; and aniline derivatives having a hydroxyl group and/or an ether bond.

Examples of the compound having an imidazole structure include imidazole, 2,4,5-triphenylimidazole, and benzimidazole. Examples of the compound having a diazabicyclo structure include 1,4-diazabicyclo[2,2,2]octane, 1,5-diazabicyclo[4,3,0]nona-5-ene, and 1,8-diazabicyclo[5,4,0]undeca-7-ene. Examples of the compound having an onium hydroxide structure include triarylsulfonium hydroxide, phenacylsulfonium hydroxide, sulfonium hydroxide having 2-oxoalkyl group, specifically triphenylsulfonium hydroxide, tris(t-butyl phenyl)sulfonium hydroxide, bis(t-butyl phenyl)iodonium hydroxide, phenacylthiophenium hydroxide, and 2-oxopropylthiophenium hydroxide. The compound having an onium carboxylate structure is a compound in which the anion moiety of the compound having an onium hydroxide structure becomes a carboxylate, and examples thereof include acetate, adamantane-1-carboxylate, and perfluoroalkyl carboxylate. Examples of the compound having a trialkylamine structure include tri(n-butyl)amine and tri(n-octyl)amine. Examples of the compound having an aniline structure include 2,6-diisopropylaniline, N,N-dimethylaniline, N,N-dibutylaniline, and N,N-dihexylaniline. Examples of the alkylamine derivative having a hydroxyl group and/or an ether bond include ethanolamine, diethanolamine, triethanolamine, and tris(methoxyethoxyethy)amine. Examples of the aniline derivative having a hydroxyl group and/or an ether bond include N,N-bis(hydroxyethyl)aniline.

Preferred examples of the basic compound include an amine compound having a phenoxy group, an ammonium salt compound having a phenoxy group, an amine compound having a sulfonic ester group, and an ammonium salt compound having a sulfonic ester group. Specific examples thereof include, but are not limited thereto, the compounds (C1-1) to (C3-3) exemplified in paragraph "0066" of US2007/0224539A.

(3) In another embodiment, the composition of the present invention may contain a nitrogen-containing organic compound having a group capable of leaving by the action of an acid as one of the basic compounds. As the examples of this compound, specific examples of the compound are provided below.

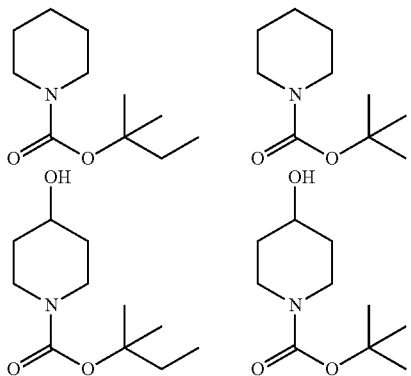

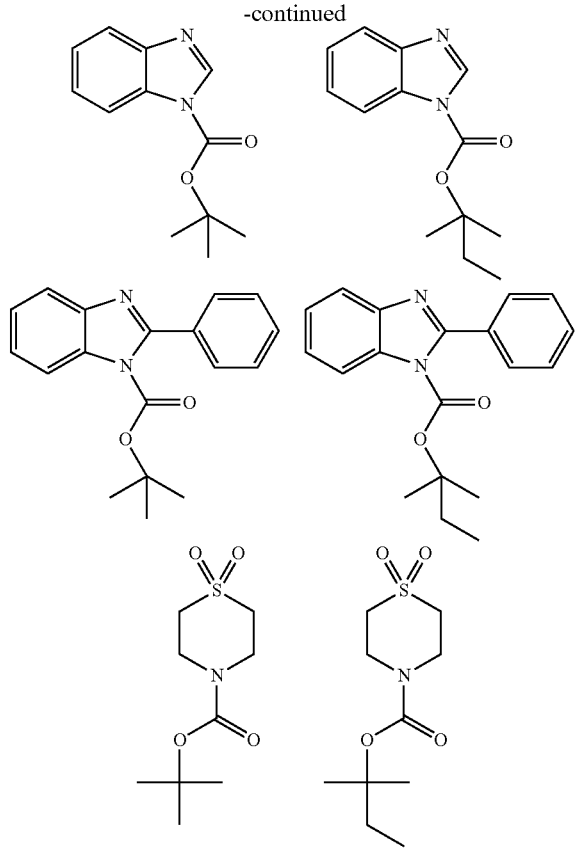

The compound can be synthesized in accordance with, for example, the method described in JP2009-199021A.

As the basic compound (N'), a compound having an amine oxide structure can also be used. As the specific examples of this compound, triethylaminepyridine N-oxide, tributyl amine N-oxide, triethanolamine N-oxide, tris(methoxyethyl)amine N-oxide, tris(2-(methoxymethoxy)ethyl)amineoxide, 2,2',2"-nitrilotriethylpropionate N-oxide, N-2-(2-methoxyethoxy)methoxyethylmorpholine N-oxide, and the amine oxide compounds exemplified in JP2008-102383A in addition to these can also be used.

The molecular weight of the basic compound (N') is preferably from 250 to 2,000, and more preferably from 400 to 1,000. In view of further reduction in LWR and local pattern dimensional uniformity, the molecular weight of the basic compound is preferably 400 or greater, more preferably 500 or greater, and still more preferably 600 or greater.

This basic compound (N') may be used with the compound (N) in combination, or may be used singly or two or more types thereof may be used in combination.

The chemical amplification resist composition according to the invention may or may not contain the basic compound (N'). However, in the case where the composition contains the basic compound (N'), the usage amount of the basic compound (N') is usually from 0.001 mass % to 10 mass %, and preferably from 0.01 mass % to 5 mass %, based on the solid content of the chemical amplification resist composition.

(4) According to another aspect, as the basic compound, the composition may contain an onium salt represented by General Formula (6A) or (6B) described below. It is expected that the onium salt controls the proliferation of the generated acid in a resist system, in relation to the acid strength of a photoacid generator generally used in the resist composition.

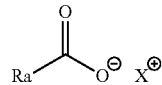

(6A)

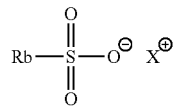

(6B)

In General Formula (6A),

Ra represents an organic group. However, an organic group in which a fluorine atom is added to a carbon atom which is directly bonded to a carboxylic acid group in the formula is excluded.

$X^+$ represents an onium cation.

In General Formula (6B),

Rb represents an organic group. However, an organic group in which a fluorine atom is added to a carbon atom which is directly bonded to a sulfonic acid group in the formula is excluded.

$X^+$ represents an onium cation.

In the organic groups represented by Ra and Rb, atoms directly bonded to the carboxylic acid group or the sulfonic acid group in the formulae are preferably carbon atoms. In this case, in order to cause the acid to be comparatively weaker than the acid generated from the photoacid generator described above, the carbon atom directly bonded to the sulfonic acid group or the carboxylic acid group is not substituted with a fluorine atom.

Examples of the organic groups represented by Ra and Rb include an alkyl group having 1 to 20 carbon atoms, a cycloalkyl group having 3 to 20 carbon atoms, an aryl group having 6 to 30 carbon atoms, an aralkyl group having 7 to 30 carbon atoms, and a heterocyclic group having 3 to 30 carbon atoms. In these groups, a portion or all of the hydrogen atoms may be substituted.

The alkyl group, the cycloalkyl group, the aryl group, the aralkyl group, and the heterocyclic group may be included in the substituent, and examples of the substituent include a hydroxyl group, a halogen atom, an alkoxy group, a lactone group, and an alkylcarbonyl group.

Examples of the onium cation represented by $X^+$ in General Formula (6A) and (6B) include a sulfonium cation, an ammonium cation, an iodonium cation, a phosphonium cation, and a diazonium cation, and among them, the sulfonium cation is more preferable.

As the sulfonium cation, for example, an arylsulfonium cation that has at least one aryl group is preferable and a triarylsulfonium cation is more preferable. The aryl group may have a substituent, and as the aryl group, a phenyl group is preferable.

Examples of the sulfonium cation and the iodonium cation preferably include structures described in the compound (B).

Specific structures of an onium salt represented by General Formula (6A) or (6B) are described below.

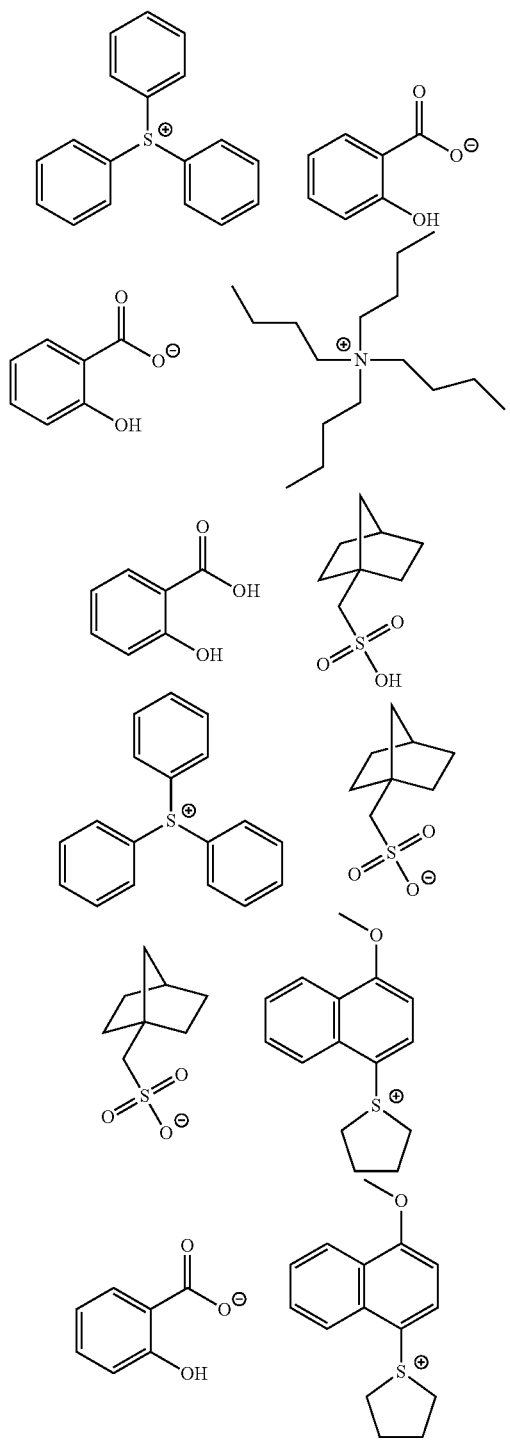

and a sulfonium or iodonium salt structure is preferable. As the acid anion structure, a sulfonate anion or a carboxylate anion is preferable. Examples of the compound include the following.

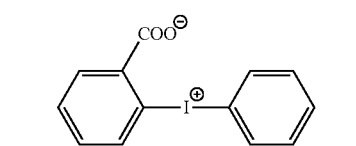

C1-1

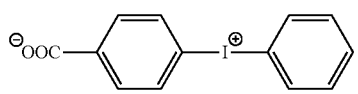

C1-2

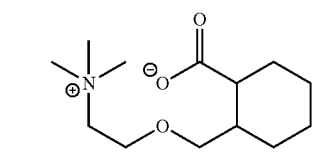

C1-3

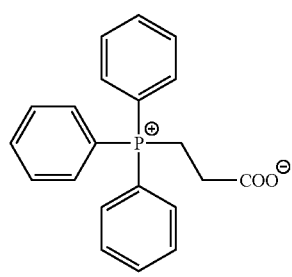

C1-4

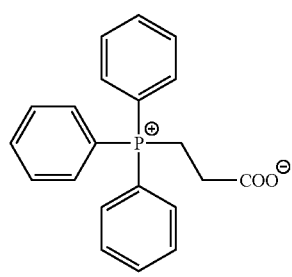

C1-5

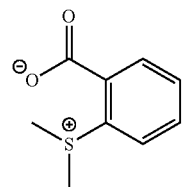

C1-6

(5) According to another aspect, as the basic compound, the composition may contain a compound having both of an onium salt structure and an acid anion structure in one molecule (hereinafter, referred to as a "betaine compound"), such as a compound included in Formula (I) of JP2012-189977A, a compound represented by Formula (I) of JP2013-6827A, a compound represented by Formula (I) of JP2013-8020A, and a compound represented by Formula (I) of JP2012-252124A. Examples of the onium salt structure include sulfonium, iodonium, and ammonium structures,

C1-7

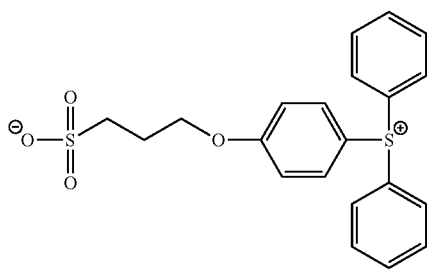

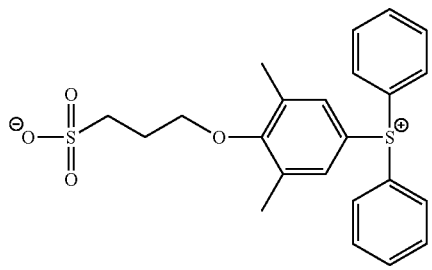

C1-8

[6] Surfactant

The composition may contain a surfactant. In the case where the composition contains the surfactant, the composition preferably contains any one of fluorine and/or silicon-based surfactants (fluorine-based surfactant, silicon-based surfactant, or surfactant having both of fluorine atom and silicon atom) or two or more types thereof.

If the composition contains a surfactant, when an exposure light source of 250 nm or lower, particularly 220 nm or lower is used, a resist pattern having a small number of defects in adhesiveness and development can be formed with preferable sensitivity and resolution.

Examples of the fluorine and/or silicon-based surfactants include surfactants disclosed in Paragraph "0276" of US2008/0248425A, and for example, FLUORAD FC430, 431, and 4430 (manufactured by Sumitomo 3M Limited), MEGAFACE series (manufactured by DIC Corporation), SURFLON S-382, SC101, 102, 103, 104, 105, 106, and KH-20 (manufactured by Asahi Glass Co., Ltd.), TROYSOL S-366 (manufactured by TROY Chemical Corporation), GF-300 and GE-150 (manufactured by Toagosei Co., Ltd.), SURFLON S-393 (manufactured by AGC Seimi Chemical Co., Ltd.), EFTOP EF121, EF122A, EF122B, RF122C, EF125M, EF135M, EF351, EF352, EF801, EF802, and EF601 (manufactured by JEMCO Inc.), PF636, PF656, PF6320, and PF6520 (manufactured by OMNOVA Solutions Inc.), and FTX-204G, 208G, 218G, 230G, 204D, 208D, 212D, 218D, and 222D (manufactured by NEOS Corporation). Polysiloxane polymer KP-341 (produced by Shin-Etsu Chemical Co., Ltd.) may also be used as the silicon-based surfactant.

As the surfactants, in addition to the well-known surfactants described above, a surfactant using a polymer having a fluoro-aliphatic group derived from a fluoro-aliphatic compound that is manufactured by a telomerization process (also referred to as a telomer process) or an oligomerization process (also referred to as an oligomer process) may be used. The fluoro-aliphatic compound can be synthesized by the method disclosed in JP2002-90991 A.

Examples of a surfactant corresponding to the above include MEGAFACE F178, F-470, F-473, F-475, F-476, and F-472 (manufactured by DIC Corporation), a copolymer of a $C_6F_{13}$ group-containing acrylate (or methacrylate) and a (poly(oxyalkylene)) acrylate (or methacrylate), a copolymer of a $C_3F_7$ group-containing acrylate (or methacrylate), a (poly(oxyethylene)) acrylate (or methacrylate) and a (poly(oxypropylene)) acrylate (or methacrylate).

According to the invention, other surfactants in addition to the fluorine and/or silicon-based surfactants disclosed in Paragraph "0280" of US2008/0248425A can be used.

These surfactants may be used singly, or some types thereof may be used in combination.

In the case where the composition contains a surfactant, the used amount of the surfactant is preferably 0.0001 mass % to 2 mass % and more preferably 0.0005 mass % to 1 mass % with respect to the total amount of the composition (excluding the solvent).

Meanwhile, if the addition amount of the surfactant is 10 ppm or lower with respect to the total amount of the actinic ray-sensitive or radiation-sensitive resin composition (except for solvent), the uneven distribution properties of the surface of the hydrophobic resin increase, such that the resist film surface can be caused to be hydrophobic and the water conformity at the time of liquid immersion exposure can be enhanced.

[7] Other Additives (G)

The composition may contain an onium carboxylate salt. Examples of such an onium carboxylate salt include onium carboxylate salts described in "0605" and "0606" of US2008/0187860A.

In the case where the composition contains an onium carboxylate salt, the content thereof is generally 0.1 mass % to 20 mass %, preferably 0.5 mass % to 10 mass %, and even more preferably 1 mass % to 7 mass %, with respect to the total solid content of the composition.

The composition may contain a so-called acid proliferation agent, if necessary. It is preferable that the acid proliferation agent is used, particularly when the pattern forming method according to the invention is performed by EUV exposure or irradiation with electron beams. Specific examples of the acid proliferation agent are not particularly limited, and examples thereof are provided below.

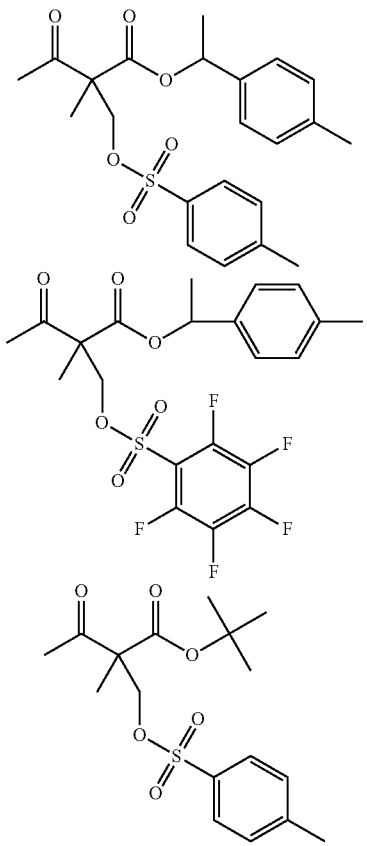

135
-continued
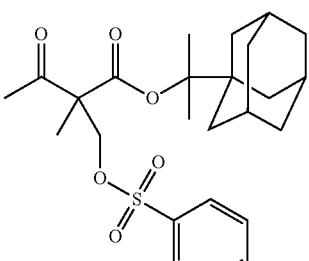
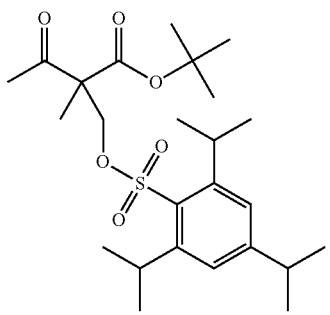
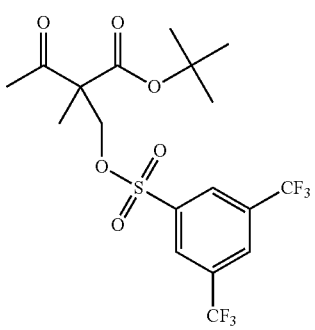
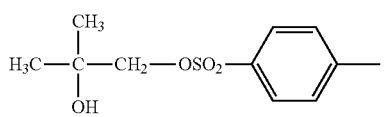
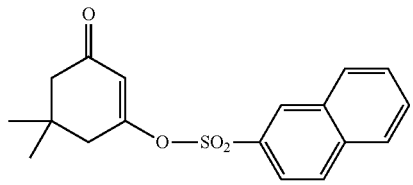
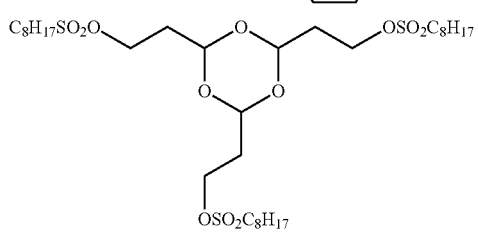
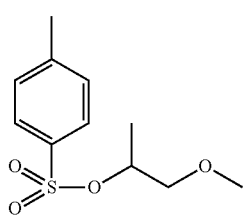
136
-continued
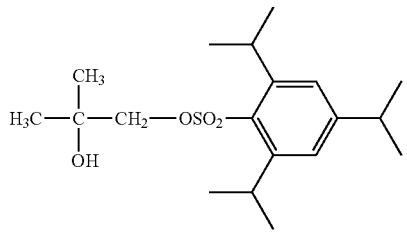
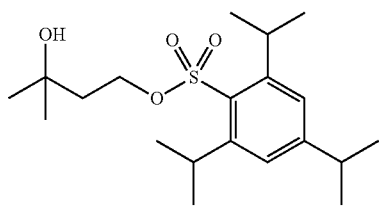
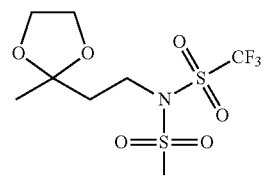
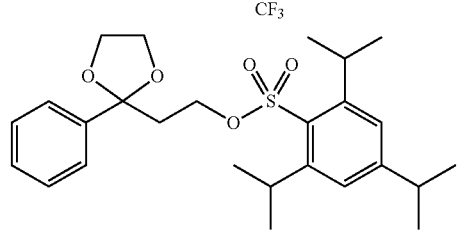
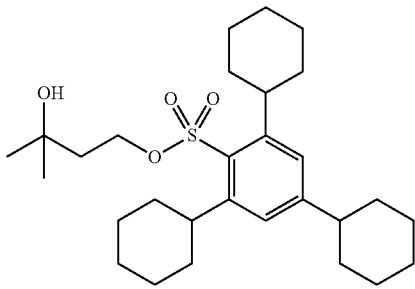
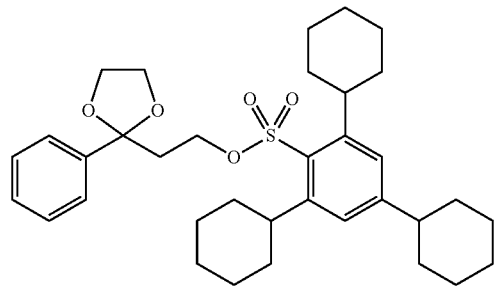
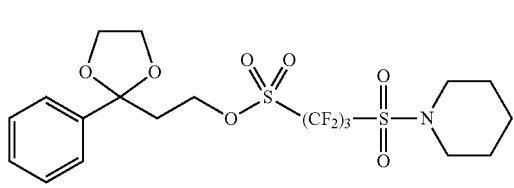

-continued

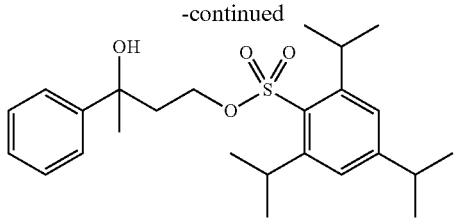

The composition may further contain a dye, a plasticizer, a light sensitizing agent, a light absorbing agent, an alkali soluble resin, a dissolution inhibitor, a compound that promotes solubility with respect to a developer (for example, a phenol compound having a molecular weight of 1,000 or less or alicyclic or aliphatic compound having carboxyl group), and the like.

(Sequence of Step (1))

The method of forming a film on a substrate by using the actinic ray-sensitive or radiation-sensitive resin composition is not particularly limited, and well-known methods can be employed. Among them, in order to make the adjustment of the film thickness easier, a method of forming the film by coating the actinic ray-sensitive or radiation-sensitive resin composition on the substrate may be provided.

The coating method is not particularly limited, but well-known method is employed. In the semiconductor manufacturing field, spin coating is preferably used.

After the actinic ray-sensitive or radiation-sensitive resin composition is coated, if necessary, a drying treatment for removing the solvent may be performed. The method of the drying treatment is not particularly limited, and examples thereof include a baking treatment and an air drying treatment.

<Film>

In the case where the film (resist film) formed by using the composition according to the invention is applied to liquid immersion exposure (described below), a receding contact angle to pure water is preferably 70° to 85° and more preferably 75° to 85° at the temperature of 23° C. and the humidity of 45%. In order to realize a preferable receding contact angle, the hydrophobic resin preferably includes the actinic ray-sensitive or radiation-sensitive composition. Otherwise, a so-called "top coat" is formed composition on the resist film such that a receding contact angle may be increased.

The thickness of the resist film is not particularly limited, but in order to form a highly accurate fine pattern, the thickness is preferably 1 nm to 500 nm and more preferably 1 nm to 100 nm.

[Step (2): Exposure Step]

Step (2) is a step of exposing the film formed in Step (1). More specifically, Step (2) is a step of selectively exposing the film such that a desired pattern is formed. Accordingly, the film is exposed in a pattern shape, and the solubility of the resist film is changed only in an exposed portion. In the exposed area, the resin described above has a polar group.

The expression "exposure" means the irradiation of actinic rays or radioactive rays.

The light used in the exposure is not particularly limited, but examples thereof include infrared light, visible light, ultraviolet light, far ultraviolet light, extreme ultraviolet light, X-rays, and electron beams. Examples thereof include far-ultraviolet light having a wavelength preferably 250 nm or shorter, more preferably 220 nm or shorter, even more preferably 1 nm to 200 nm.

More specific examples thereof include a KrF excimer laser (248 nm), an ArF excimer laser (193 nm), a $F_2$ excimer laser (157 nm), X rays, EUV (13 nm), and electron beams. Among them, a KrF excimer laser, an ArF excimer laser, EUV, or electron beams are preferable, and an ArF excimer laser is more preferable.

The method of selectively exposing the film is not particularly limited, and well-known methods can be used. For example, a binary mask in which the transmittance of a light shielding portion is 0% or a halftone-type phase shift mask (HT-Mask) in which the transmittance of the light shielding portion is 6% can be used.

As the binary mask, a product in which a chromium film, a chromium oxide film, or the like is formed on the quartz glass substrate as the light shielding portion is generally used.

As the halftone-type phase shift mask, a product in which a molybdenum silicide (MoSi) film, a chromium film, a chromium oxide film, a silicon oxynitride film, and the like is formed on the quartz glass substrate as the light shielding portion is generally used.

The invention is not limited to the exposure performed through a photomask, and exposure without a photomask, for example, selective exposure (pattern exposure) by drawing by electron beams and the like may be performed.

This step may include exposure plural times.

(Baking Treatment)

A baking treatment (PB: Prebake) may be performed on the film before this step. The baking treatment (PB) may be performed plural times.

A baking treatment (PEB: Post Exposure Bake) may be performed on the resist film after this step. The baking treatment (PEB) may be performed plural times.

The reaction of the exposure portion is promoted by the baking treatment, and thus the sensitivity or the pattern profile is further improved.

In both of PB and PEB, the temperature of the baking treatment is preferably 70° C. to 130° C. and more preferably 80° C. to 120° C.

In both of PB and PEB, the time of the baking treatment is preferably 30 seconds to 300 seconds, more preferably 30 seconds to 180 seconds, and even more preferably 30 seconds to 90 seconds.

In both of PB and PEB, the baking treatment may be performed by means included in a general exposing and developing machine, and a hot plate or the like may be used.

(Preferred Form: Liquid Immersion Exposure)

Examples of a preferred form of the exposure include liquid immersion exposure. If the liquid immersion exposure is used, a finer pattern can be formed. The liquid immersion exposure may be combined with a super resolution technique such as a phase shift method or a modified illumination method.

As the liquid immersion liquid used in the liquid immersion exposure, a liquid in which a temperature coefficient of the refractive index is minimized so as to be transparent at the exposure wavelength and limit the deform of an optical image projected on the resist film is preferable. Particularly, in the case where the exposure light source is an ArF excimer laser (wavelength; 193 nm), in addition to the viewpoint described above, in view of the easy acquisition and easy handling, water is preferably used.

In the case where water is used as the liquid immersion liquid, a small proportion of additives (liquid) that decreases the surface tension of water and also increases the surface activity may be added. As the additive, a product that does not dissolve the resist film and of which an influence on an optical coat on a lower surface of the lens element is negligible is preferable.

Examples of such an additive is preferably an aliphatic alcohol which has a refractive index approximately equal to a refractive index of water, and specific examples thereof include a methyl alcohol, an ethyl alcohol, and an isopropyl alcohol. If an alcohol having a refractive index approximately equal to a refractive index of water is added, it is possible to obtain an advantage of causing the variation in the refractive index in the entire liquid to be extremely small, even if alcohol components in water evaporate and the content concentration changes.

Meanwhile, in the case where materials which are opaque to 193 nm light or impurities that have greatly different refractive indexes as that of water are mixed in, the optical image which is projected on the resist may be deformed. Therefore, as the water used, distilled water is preferable. Pure water which is filtered by an ion exchange filter may be used.

If the refractive index of the liquid immersion liquid is increased, it is possible to enhance the lithography performances. From this point of view, additives that increase the refractive index may be added to water, or heavy water ($D_2O$) may be used instead of water.

With respect to the liquid immersion exposure, before the exposure and/or after the exposure (before baking treatment), the surface of the resist film may be washed with aqueous chemical liquid.

According to the invention, the general exposure (exposure that does not use immersion liquid) except for the immersion exposure is referred to as dry exposure.

[Step (3): Contact Step]

Step (3) is a step of causing the exposed film and the component (hereinafter, simply referred to as a "component") that performs any one interaction of an ionic bond, a hydrogen bond, a chemical bond, and a dipole interaction, with a polar group in the exposed film, without substantially dissolving the exposed film obtained in Step (2) to come into contact with each other. In the area of the exposed film in Step (2) described above, a polar group is generated, interaction is performed the formed polar group and the component come into contact with each other, by performing this step. For example, in the case where the basic compound is used as the component, a salt is formed between polar groups. As a result, solubility to the developer described below in the exposure area (area in which a polar group is generated) in the film decreases (insolubilization), solubility contrast between the exposure area and the unexposed area becomes great, and thus formed pattern forming properties are excellent.

This step is performed without substantially dissolving the exposed. Here, the expression "without substantially dissolving a film" means that the maximum of a dissolution rate of the film in this step is 0.5 nm/sec or less and more preferably 0.1 nm/sec or less. Here, the expression "the maximum of a dissolution rate of the film in this step is 0.5 nm/sec or less" represents that a dissolution rate is 0.5 nm/sec or less at an arbitrary point of the exposed film (generally exposure portions and unexposed portions are mixed) in an exposure step. The lower limit thereof is not particularly limited, and is preferably 0. For example, in the case where only the component is used, the dissolution rate refers to a dissolution rate when the component and the film come into contact with each other and in the case where a treating agent including the component and the solvent is used as described below, the dissolution rate refers to a dissolution rate when the treating agent and the film come into contact with each other. The expression "nm/sec" means a dissolved amount (nm) of the film for one second. The component is brought into contact with the film, and the dissolution rate is calculated from a contact time thereof and the dissolution depth.

Hereinafter, first, a sequence of this step is described, and then used components are described.

In this step, a method of causing the exposed film obtained in Step (2) and the component to come into contact with each other is not particularly limited, but well-known methods are employed. The contact method varies according to properties of the component used. For example, in the case where the component is liquid, a method of continuously discharging a component on a substrate rotating at a predetermined speed (spin coating method), a method of dipping a substrate in a tube filled with a component for a predetermined period of time (dipping method), a method of spraying a component on a substrate surface (spray method), and a method of development by raising a developer on a substrate surface by surface tension and leaving the developer for a certain period of time (paddle method) can be applied. In the case where a treatment fluid including a component and a solvent below is used, this treating agent is used instead of the component above.

As the component, gas may be used. In this case, a method of causing the gas and the film to come into contact with each other is used.

This step is performed so as to cause the area (exposure area) exposed at least in Step (2) in the film and the component (or a treating agent) to come into contact with each other.

In Step (3), a contact time between the component and the film is not particularly limited. However, in view of making the effect of the invention more excellent, the contact time is preferably 1 second to 200 seconds and more preferably 5 seconds to 60 seconds.

As described above, instead of the components above, a treating agent including a component and a solvent that does not substantially dissolves the exposed film may be used. In the treating agent, in view of making the effect of the invention more excellent, the content of the component is preferably 0.1 mass % to 30 mass %, more preferably 1 mass % to 20 mass %, and even more preferably 1 mass % to 10 mass %.

The solvent included in the treating agent is a solvent that does not substantially dissolve the exposed film in Step (2). The expression "not substantially dissolve" means that the degree of solubility to the film is a predetermined value or lower.

Types of the solvent are not particularly limited, as long as the solvent does not substantially dissolve the exposed film. Examples therof include water or an organic solvent. As the organic solvent, a solvent containing at least one type of organic solvents selected from a group consisting of a hydrocarbon-based solvent, a ketone-based solvent, an ester-based solvent, an alcohol-based solvent, an amide-based solvent, and an ether-based solvent is preferably used. Specific examples of the various solvents include solvents which are the same as described in the developer including an organic solvent as described below.

Among these, in view of solubility and permeability to the film (particularly, exposure area), the treating agent preferably contains an alcohol-based solvent, particularly preferably contains monovalent alcohol, most preferably contains monovalent alcohol having 5 or more carbon atoms.

Here, examples of the monovalent alcohol include straight chain, branched, and cyclic monovalent alcohol, and specific examples thereof include 1-hexanol, 2-hexanol, 4-methyl-2-pentanol, 1-pentanol, and 3-methyl-1-butanol.

Plural components in the treating agent may be mixed with each other or may be used by mixing the component with other organic solvents.

After the component (or the treating agent) is caused to come into contact, a baking step is performed, such that the forming of the interaction can be promoted. The baking condition is appropriately selected according to the formulation of the compositions, but is generally about 30° C. to 200° C., and preferably 50° C. to 100° C.

(Component)

The components used in this step is a compound that can form at least one interaction of an ionic bond, a hydrogen bond, a chemical bond, and a dipole interaction with a polar group that is generated by an action of an acid with the resin described above. As described above, if the resin and the component forms a predetermined interaction, solubility of the resin changes. The ionic bond means a static interaction between cations and anions and includes the forming of a salt.

The component may be gas, liquid, or a solid body.

Types of the component are not particularly limited, but examples thereof include an onium salt compound, a nitrogen containing compound, and a phosphorus-based compound. These compounds are described below.

One of preferred forms of the component is a basic organic compound. The basic organic compound means an organic compound that forms a polar group and an ionic bond in the film. In the basic organic compound, pKa of a conjugate acid is preferably 4 or greater, more preferably 6 or greater, and particularly preferably 8 or greater.

The pKa above is a calculation value obtained by ACD/ChemSketch (ACD/Labs 8.00 Release Product Version: 8.08).

(Onium Salt Compound)

The onium salt compound means a compound having an onium salt structure. The onium salt structure refers to a salt structure generated by a coordinate bond formed by an organic substance component and a Lewis base. The onium salt compound mainly forms an interaction by an ionic bond with a polar group. For example, in the case where the polar group is a carboxyl group, a cation in the onium salt compound forms a static interaction (forms an ionic bond) with carboxylate anion (COO⁻) derived from carboxyl.

The types of the onium salt structure are not particularly limited, and examples thereof include structures of an ammonium salt, a phosphonium salt, an oxonium salt, a sulfonium salt, a selenonium salt, a carbonium salt, a diazonium salt, and an iodonium salt, which have cation structures described below.

Examples of the cation in the onium salt structure include a product having a positive charge on a heteroatom of a heteroaromatic ring. Examples of the onium salt include a pyridinium salt and an imidazolium salt.

In this specification, as one form of the ammonium salt, the pyridinium salt and the imidazolium salt are exemplified.

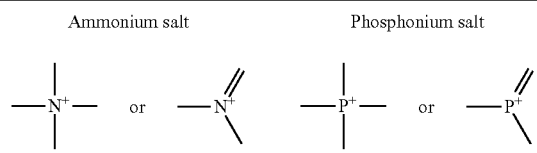

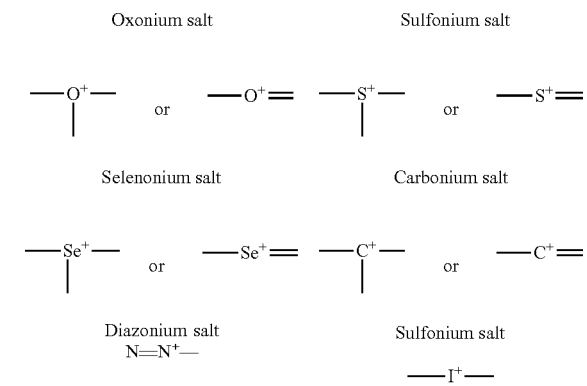

In view of making the effect of the invention more excellent, the onium salt compound may be salt compounds having a polyvalent onium salt having two or more onium ion atoms in a molecule. As the polyvalent onium salt compound, a compound in which two or more cations are linked by a covalent bond is more preferable.

Examples of the polyvalent onium salt include a diazonium salt, an iodonium salt, a sulfonium salt, an ammonium salt, and a phosphonium salt. In view of making the effect of the invention more excellent, a diazonium salt, an iodonium salt, a sulfonium salt, and an ammonium salt are preferable, and in view of stability, an ammonium salt is preferable.

As the anion (negative ion) included in an onium salt compound (onium salt structure), and any anions can be used. However, the anion may be a monovalent ion or a polyvalent ion.

Examples of the monovalent anion include a sulfonate anion, a formate anion, a carboxylate anion, a sulfinate anion, a boronate anion, a halide ion, a phenol anion, an alkoxy anion, and a hydroxide ion. Examples of the divalent anion include an oxalate ion, phthalate ion, maleate ion, a fumarate ion, a tartrate ion, a malate ion, a lactate ion, a sulfate ion, a diglycolate ion, and an ion of a 2,5-furandicarboxylic acid.

Among these, examples thereof preferably include a sulfonate anion, a carboxylate anion, a bis(alkylsulfonyl)amide anion, a tris(alkylsulfonyl)methide anion, $BF_4^-$, $PF_6^-$, and $ShF_6^-$ and more preferably an organic anion containing a carbon atom.

(Nitrogen-Containing Compound)

The nitrogen-containing compound means a compound including a nitrogen atom. In this specification, the onium salt compound is not included in a nitrogen-containing compound. The nitrogen-containing compound mainly forms an interaction between the nitrogen atom in the compound and the polar group. For example, in the case where the polar group is a carboxyl group, the polar group interacts with a nitrogen atom in a. nitrogen-containing compound, so as to form a salt. Specific examples of the nitrogen-containing compound are described below, but as one of preferred forms of the nitrogen-containing compound, an alkylamine compound (particularly preferably C1 to C30 (having 1 to 30 carbon atoms)) is preferable, a tertiary alkylamine compound (particularly preferably C1 to C30 (having 1 to 30 carbon atoms)) is even more preferable, and n-octylamine, di-n-octylamine, tri-n-octylamine, and tetramethylethylenediamine are particularly preferable. For example, in General Formula (6) described below, it is more preferable that each of $R^4$ to $R^5$ independently represents a chain hydrocarbon group having 1 to 30 carbon atoms or an alicyclic hydrocarbon group having 3 to 30 carbon atoms, and $R^6$ is an n-valent chain hydrocarbon group having 1 to 30 carbon atoms or an n-valent alicyclic hydrocarbon group having 3 to 30 carbon atoms.

In view of making the effect of the invention more excellent, the other preferred forms of the nitrogen-containing compound preferably include secondary amine or tertiary amine and preferably includes tertiary amine.

In view of making the effect of the invention more excellent, one of the other preferred forms of the nitrogen-containing compound preferably has two or more nitrogen atoms (polyvalent amine compound).

Examples of the nitrogen-containing compound include compounds represented by General Formula (6) below.

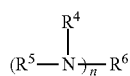

Formula (6)

In General Formula (6) above, each of $R^4$ and $R^5$ independently represents a hydrogen atom, a hydroxyl group, a formyl group, an alkoxy group, an alkoxycarbonyl group, a chain hydrocarbon group having 1 to 30 carbon atoms, an alicyclic hydrocarbon group having 3 to 30 carbon atoms, an aromatic hydrocarbon group having 6 to 14 carbon atoms, or the group obtained by combining two or more of these groups. $R^6$ is a hydrogen atom, a hydroxyl group, a formyl group, an alkoxy group, an alkoxycarbonyl group, an n-valent chain hydrocarbon group having 1 to 30 carbon atoms, an n-valent alicyclic hydrocarbon group having 3 to 30 carbon atoms, an n-valent aromatic hydrocarbon group having 6 to 14 carbon atoms, or an n-valent group obtained by combining two or more of these groups. n is an integer of 1 or greater. However, when n is 2 or greater, plural $R^4$ and $R^5$ may be identical to or different from each other. Any two of $R^4$ to $R^6$ are bonded to each other to form a ring structure together with a nitrogen atom to which both are boded.

Examples of chain hydrocarbon groups having 1 to 30 carbon atoms which are represented by $R^4$ and $R^5$ above include a methyl group, an ethyl group, an n-propyl group, an i-propyl group, an n-butyl group, a 2-methylpropyl group, a 1-methylpropyl group, and a t-butyl group.

Examples of the alicyclic hydrocarbon group having 3 to 30 carbon atoms represented by $R^4$ and $R^5$ above include a cyclopropyl group, a cyclopentyl group, a cyclohexyl group, an adamantyl group, and a norbornyl group.

Examples of the aromatic hydrocarbon group having 6 to 14 carbon atoms which is represented by $R^4$ and $R^5$ above include a phenyl group, a tolyl group, and a naphthyl group.

Examples of the group obtained by combining two or more of these groups represented by $R^4$ and $R^5$ above include an aralkyl group having 6 to 12 carbon atoms such as a benzyl group, a phenethyl group, a naphthylmethyl group, and a naphthylethyl group.

Examples of the n-valent chain hydrocarbon group having 1 to 30 carbon atoms represented by $R^6$ above include groups obtained by removing (n-1) hydrogen atoms from groups as exemplified as a chain hydrocarbon group having 1 to 30 carbon atoms, which are represented by $R^4$ and $R^5$ above.

Examples of the n-valent alicyclic hydrocarbon group having 3 to 30 carbon atoms which is represented by $R^6$ above include groups obtained by removing (n-1) hydrogen atoms from groups as exemplified as alicyclic hydrocarbon groups having 3 to 30 carbon atoms which are represented by $R^4$ and $R^5$ above.

Examples of the n-valent aromatic hydrocarbon group having 6 to 14 carbon atoms which is represented by $R^6$ above include groups obtained by removing (n-1) hydrogen atoms from groups as exemplified as aromatic hydrocarbon groups having 6 to 14 carbon atoms which are represented by $R^4$ and $R^5$ above.

Examples of the group obtained by combining two or more of these groups represented by $R^6$ above include groups obtained by removing (n-1) hydrogen atoms from groups as exemplified as the groups obtained by combining two or more of these groups which are represented by $R^4$ and $R^5$ above.

The groups represented by $R^4$ to $R^6$ above may be substituted. Specific examples of a substituent include a methyl group, an ethyl group, a propyl group, an n-butyl group, a t-butyl group, a hydroxyl group, a carboxy group, a halogen atom, and an alkoxy group. Examples of the halogen atom include a fluorine atom, a chlorine atom, and a bromine atom. Examples of the alkoxy group include a methoxy group, an ethoxy group, a propoxy group, and a butoxy group.

Examples of the compound represented by Formula (6) above include a (cyclo)alkylamine compound, a nitrogen-containing heterocyclic compound, an amide group-containing compound, and an urea compound.

Examples of the (cyclo)alkylamine compound include a compound having one nitrogen atom, a compound having two nitrogen atoms, and a compound having three or more nitrogen atoms.

Examples of the (cyclo)alkylamine compound having one nitrogen atom include mono(cyclo)alkylamines such as n-hexylamine, n-heptylamine, n-octylamine, n-nonylamine, 1-aminodecane, and cyclohexylamine;

di(cyclo)alkylamines such as di-n-butylamine, di-n-pentylamine, di-n-hexylamine, di-n-heptylamine, di-n-octylamine, di-n-nonylamine, di-n-decylamine, cyclohexyltnethylamine, and dicyclohexylamine; tri(cyclo)alkylamines such as triethylamine, tri-n-propylamine, tri-n-butylamine, tri-n-pentylamine, tri-n-hexylamine, tri-n-heptylamine, tri-n-octylamine, tri-n-nonylamine, tri-n-decylamine, cyclohexyldimethylamine, methyldicyclohexylamine, and tricyclohexylamine;

substituted alkylamine such as triethanolamine; and aromatic amines such as aniline, N-methylaniline, N,N-dimethylaniline, 2-methylaniline, 3-methylaniline, 4-methylaniline, N,N-dibutylaniline, 4-nitroaniline, diphenylamine, triphenylamine, naphthylamine, 2,4,6-tri-tert-butyl-N-methylaniline, N-phenyldiethanolamine, 2,6-diisopropylaniline, 2-(4-aminophenyl)-2-(3-hydroxyphenyl) propane, and 2-(4-aminophenyl)-2-(4-hydroxyphenyl) propane.

Examples of the (cyclo)alkylamine compound having two nitrogen atoms include ethylenediamine, tetramethylethylenediamine, tetramethylenediamine, hexamethylenediamine, 4,4'-diaminodiphenylmethane, 4,4'-diaminodiphenylether, 4,4'-diaminobenzophenone, 4,4'-diaminodiphenylamine, 2,2-bis(4-aminophenyl)propane, 2-(3-aminophenyl)-2-(4-aminophenyl)propane, 1,4-bis[1-(4-aminophenyl)-1-methylethyl]benzene, 1,3-bis[1-(4-aminophenyl)-1-methylethyl]benzene, bis(2-dimethylaminoethyl)ether, bis(2-diethylaminoethyl)ether, 1-(2-hydroxyethyl)-2-imidazolidinone, 2-quinoxalinol, and N,N,N',N'-tetrakis(2-hydroxypropyl)ethylenediamine.

Examples of the (cyclo)alkylamine compound having three or more nitrogen atoms include polymers such as polyethyleneimine, polyallylamine, and 2-dimethylaminoethylacrylamide.

Examples of the nitrogen-containing heterocyclic compound include a nitrogen-containing aromatic heterocyclic compound and a nitrogen-containing aliphatic heterocyclic compound.

Examples of the nitrogen-containing aromatic heterocyclic compound include imidazoles such as imidazole, 4-methylimidazole, 4-methyl-2-phenylimidazole, benzimidazole, 2-phenylbenzimidazole, 1-benzyl-2-methylimidazole, and 1-benzyl-2-methyl-1H-imidazole; and pyridines such as pyridine, 2-methylpyridine, 4-methylpyridine, 2-ethylpyridine, 4-ethylpyridine, 2-phenylpyridine, 4-phenylpyridine, 2-methyl-4-phenylpyridine, nicotine, nicotinic acid, nicotinic acid amide, quinoline, 4-hydroxyquinoline, 8-oxyquinoline, acridine, and 2,2':6',2''-terpyridine.

Examples of the nitrogen-containing aliphatic heterocyclic compound include piperazines such as piperazine, and 1-(2-hydroxyethyl)piperazine;

pyrazine, pyrazole, pyridazine, quinozaline, purine, pyrrolidine, proline, piperidine, piperidine ethanol, 3-piperidino-1,2-propanediol, morpholine, 4-methylmorpholine, 1-(4-morpholinyl)ethanol, 4-acetylmorpholine, 3-(N-morpholino)-1,2-propanediol, 1,4-dimethylpiperazine, and 1,4-diazabicyclo[2.2.2]octane.

Examples of the amide group-containing compound include

N-t-butoxycarbonyl group-containing amino compounds such as N-t-butoxycarbonyldi-n-octylamine, N-t-butoxycarbonyldi-n-nonylamine, N-t-butoxycarbonyldi-n-decylamine, N-t-butoxycarbonyldicyclohexylamine, N-t-butoxycarbonyl-1-adamantylamine, N-t-butoxycarbonyl-2-adamantylamine, N-t-butoxycarbonyl-N-methyl-1-adamantylamine, (S)-(−)-1-(t-butoxycarbonyl)-2-pyrrolidinemethanol, (R)-(+)-1-(t-butoxycarbonyl)-2-pyrrolidinemethanol, N-t-butoxycarbonyl-4-hydroxypiperidine, N-t-butoxycarbonylpyrrolidine, N-t-butoxycarbonylpiperazine, N,N-di-t-butoxycarbonyl-1-adamantylamine, N,N-di-t-butoxycarbonyl-N-methyl-1-adamantylamine, N-t-butoxycarbonyl-4,4'-diaminodiphenylmethane, N,N'-di-t-butoxycarbonylhexamethylenediamine, N,N,N',N'-tetra-t-butoxycarbonylhexamethylenediamine, N,N'-di-t-butoxycarbonyl-1,7-diaminoheptane, N,N'-di-t-butoxycarbonyl-1,8-diaminooctane, N,N'-di-t-butoxycarbonyl-1,9-diaminononane, N,N'-di-t-butoxycarbonyl-1,10-diaminodecane, N,N'-di-t-butoxycarbonyl-1,12-diaminododecane, N,N'-di-t-butoxycarbonyl-4,4'-diaminodiphenylmethane, N-t-butoxycarbonylbenzimidazole, N-t-butoxycarbonyl-2-methylbenzimidazole, and N-t-butoxycarbonyl-2-phenylbenzimidazole; formamide, N-methylformamide, N,N-dimethylformamide, acetamide, N-methylacetamide, N,N-dimethylacetamide, propionamide, benzamide, pyrrolidone, N-methylpyrrolidone, N-acetyl-1-adamantylamine, and tris(2-hydroxyethyl) isocyanurate.

Examples of the urea compound include urea, methyl urea, 1,1-dimethyl urea, 1,3-dimethyl urea, 1,1,3,3-tetramethyl urea, 1,3-diphenyl urea, and tri-n-butylthio urea.

Among these, a (cyclo)alkylamine compound and a nitrogen-containing aliphatic heterocyclic compound are preferable, and 1-aminodecane, di-n-octylamine, tri-n-octylamine, tetramethylethylenediamine, N,N-dibutylaniline, and proline are more preferable.

As the preferred form of the nitrogen-containing compound, a nitrogen-containing compound (polyvalent nitrogen-containing compound) including plural (two or more) nitrogen atoms is preferable. Particularly, an embodiment including three or more nitrogen atoms is preferable, and four or more nitrogen atoms is more preferable.

In view of making the effect of the invention more excellent, another preferred embodiment of the nitrogen-containing compound includes a compound represented by Formula (3).

Formula (3)

In Formula (3), A represents a single bond, or an n-valent organic group.

As A, specifically, a single bond, a group represented by Formula (1A) below, a group represented by Formula (1B) below,

(1A)

(1B)

—NH—, —NR—, —O—, —S—, a carbonyl group, an alkylene group, an alkenylene group, an alkynylene group, a cycloalkylene group, an aromatic group, and a heterocyclic group, and an n-valent organic group formed by combining two or more types thereof can be included as preferred examples. Here, in the formula above, $R_W$ represents an organic group, and is preferably an alkyl group, an alkylcarbonyl group, and an alkylsulfonyl group. With respect to the combination above, heteroatoms are not linked to each other.

Among them, an aliphatic hydrocarbon group (an alkylene group, an alkenylene group, an alkynylene group, and a cycloalkylene group), a group represented by Formula (1B) described above, —NH— and —NR— are preferable.

Here, as an alkylene group, an alkenylene group, and an alkynylene group, groups having 1 to 40 carbon atoms are preferable, groups having 1 to 20 carbon atoms are more preferable, and groups having 2 to 12 carbon atoms are even more preferable. Here, the alkylene group may be a linear group or a branched group, and may have a substituent. Here, as the cycloalkylene group, a group having 3 to 40 carbon atoms is preferable, a group having 3 to 20 carbon atoms is more preferable, and a group having 5 to 12 carbon atoms is even more preferable. The cycloalkylene group may be monocyclic or polycyclic, and may have a substituent on the ring.

The aromatic group may be monocyclic or polycyclic, and may include a non-benzenoid aromatic group. Examples of the monocyclic aromatic group include a benzene residue, a pyrrole residue, a furan residue, a thiophene residue, and an indole residue, and examples of the polycyclic aromatic group include a naphthalene residue, an anthracene residue, a tetracene residue, a benzofuran residue, and a benzothiophene residue. The aromatic group may have a substituent.

The n-valent organic group may have a substituent, and the types thereof are not particularly limited, but examples thereof include an alkyl group, an alkoxy group, an alkylcarbonyl group, an alkylcarbonyloxy group, an alkyloxycarbonyl group, an alkenyl group, an alkenyloxy group, an alkenylcarbonyl group, an alkenylcarbonyloxy group, an alkenyloxycarbonyl group, an alkynyl group, an alkyleneoxy group, an alkynylenecarbonyl group, an alkynylenecarbonyloxy group, an alkynyleneoxycarbonyl group, an aralkyl group, an aralkyloxy group, an aralkylcarbonyl group, an aralkylcarbonyloxy group, an aralkyloxycarbonyl group, a hydroxyl group, an amide group, a carboxyl group, a cyano group, and a fluorine atom.

B represents a single bond, an alkylene group, a cycloalkylene group, or an aromatic group, and the alkylene group, the cycloalkylene group, and the aromatic group may have substituents. Here, descriptions of the alkylene group, the cycloalkylene group, and the aromatic group are as described above.

However, not both of A and B are single bonds.

Each of Rz's independently represents a hydrogen atom, an aliphatic hydrocarbon group in which a hetero atom may be included, or an aromatic hydrocarbon group in which a hetero atom is included.

Examples of the aliphatic hydrocarbon group include an alkyl group, an alkenyl group, and an alkynyl group. The number of carbon atoms included in the aliphatic hydrocarbon group is not particularly limited, but, in view of making the effect of the invention more excellent, the number of carbon atoms is preferably 1 to 20 and more preferably 1 to 10.

Examples of the aromatic hydrocarbon group include a phenyl group and a naphthyl group.

A hetero atom is included in the aliphatic hydrocarbon group and the aromatic hydrocarbon group. The definition and the preferred embodiment of the hetero atom are the same as those of the hetero atom described in Formula (1-1) above.

A substituent (for example, a functional group such as a hydroxyl group, a cyano group, an amino group, a pyrrolidino group, a piperidino group, a morpholino group, or an oxo group, an alkoxy group, or a halogen atom) may be included in the aliphatic hydrocarbon group and the aromatic hydrocarbon group.

n represents an integer of 2 to 8 and preferably represents an integer of 3 to 8.

The compound represented by Formula (3) above preferably has three or more nitrogen atoms. In this embodiment, in the case where n is 2, at least one nitrogen atom is included in A. If a nitrogen atom is included in A, for example, at least one selected from the group consisting of a group represented by Formula (1B) described above, —NH—, and —NR$_W$— is included in A.

Compounds represented by Formula (3) are exemplified below.

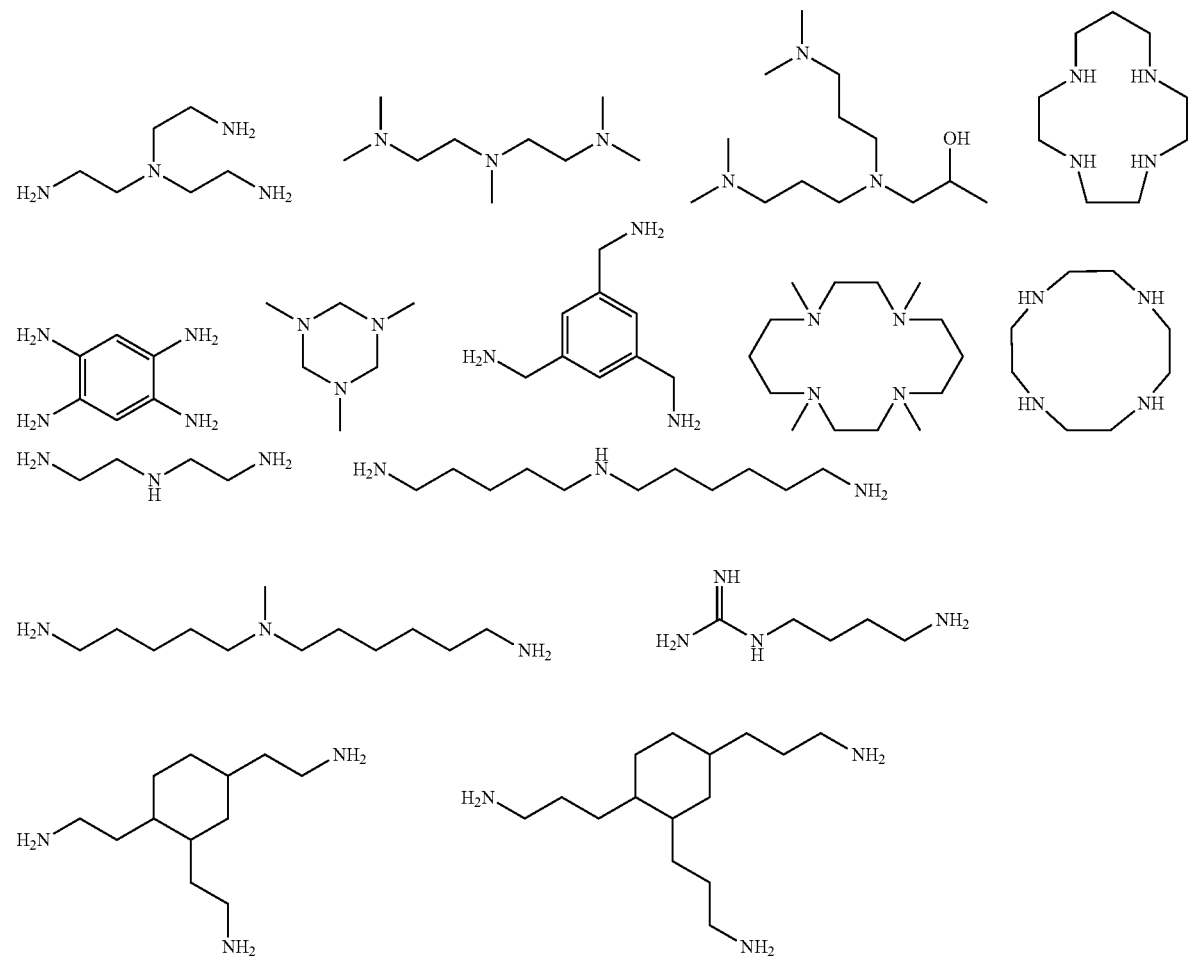

149 150
-continued
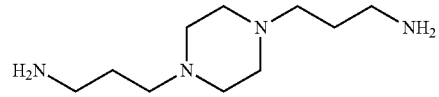
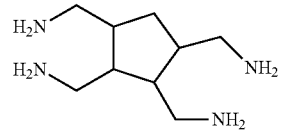
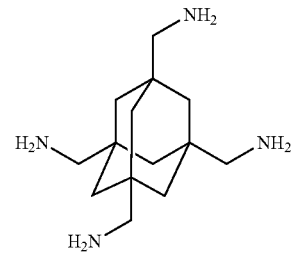
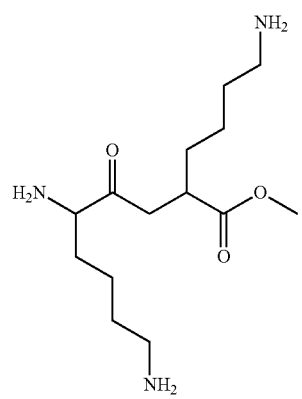
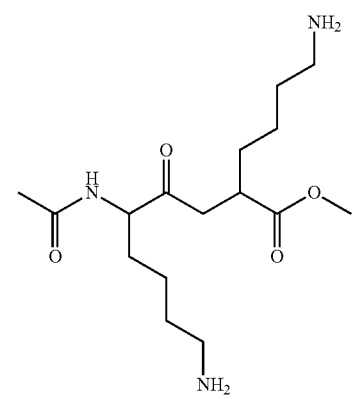
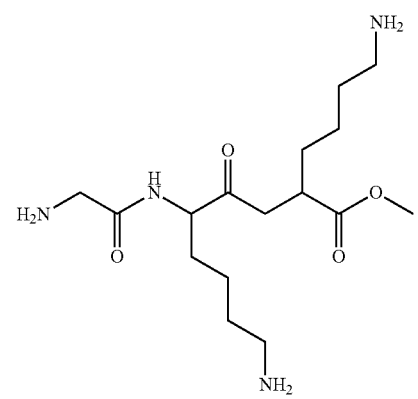
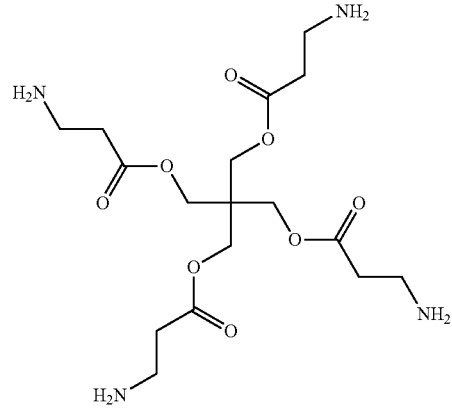
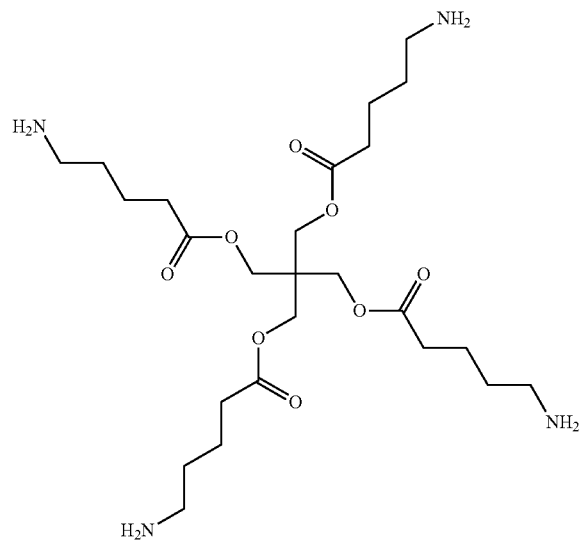
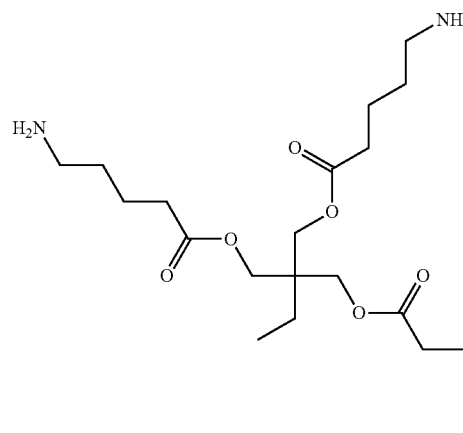
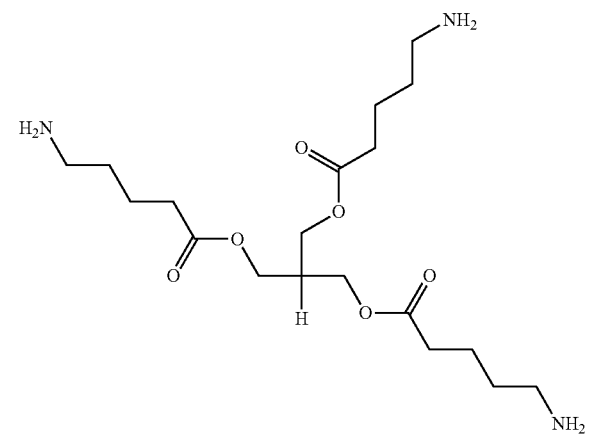

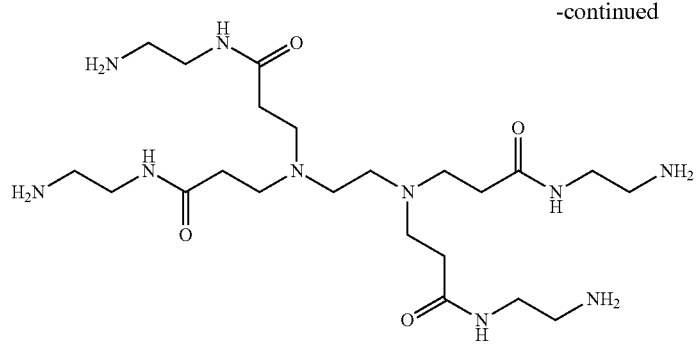

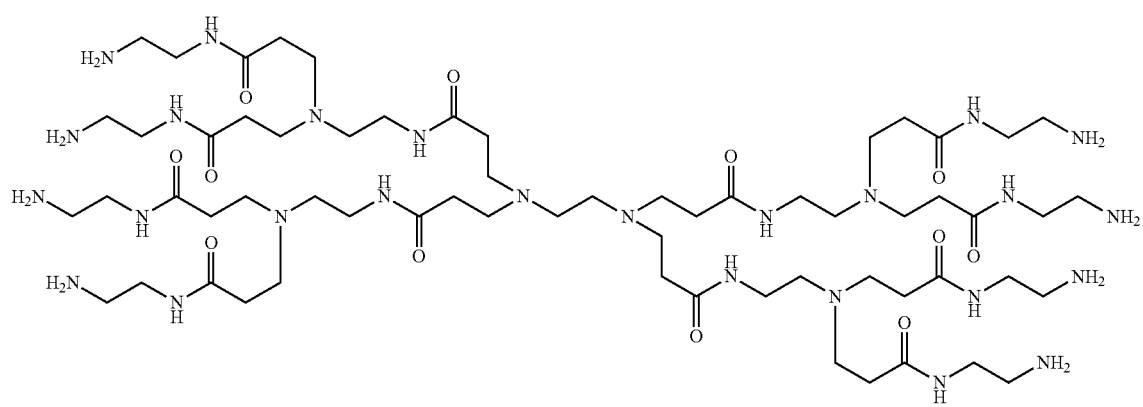 [SMILES: NCCNC(=O)CCN(CCNC(=O)CCN(CCC(=O)NCCN(CCC(=O)NCCN)CCC(=O)NCCN)CCN(CCC(=O)NCCN(CCC(=O)NCCN)CCC(=O)NCCN)CCC(=O)NCCN(CCC(=O)NCCN)CCC(=O)NCCN)CCC(=O)NCCN]

In view of making the effect of the invention more excellent, another preferred embodiment of the nitrogen-containing compound preferably includes a polymer having an amino group. In this specification, the "amino group" is a concept including a primary amino group, a secondary amino group, and a tertiary amino group. Examples of the secondary amino group include a cyclic secondary amino group such as a pyrrolidino group, a piperidino group, a piperazino group, and a hexahydrotriazino group.

The amino group may be included in any one of a main chain and a side chain of the polymer.

Specific examples of the side chain in the case where the amino group is included in a portion of the side chain are described below. "✱" represents a linking portion to the polymer.

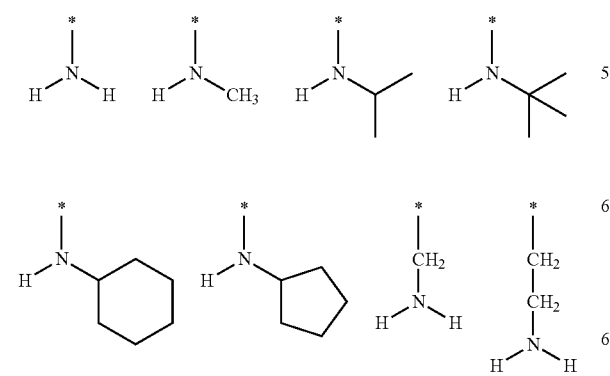

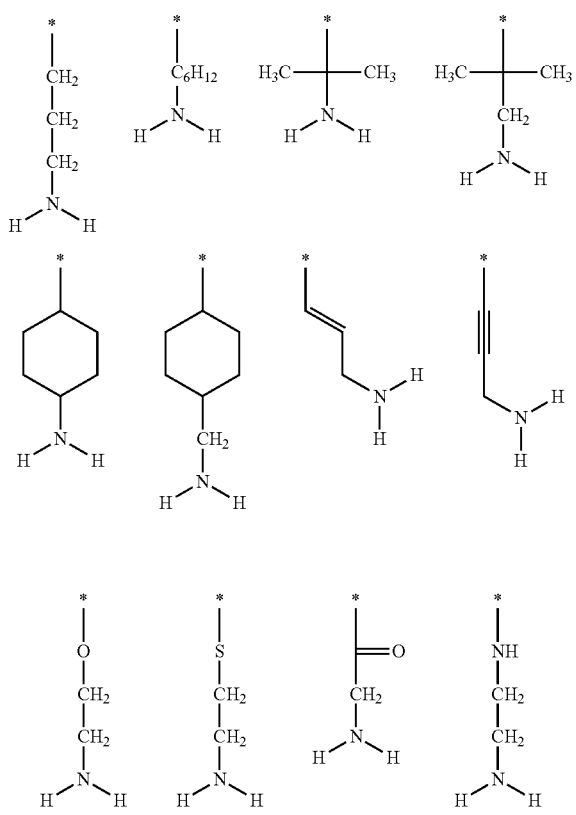

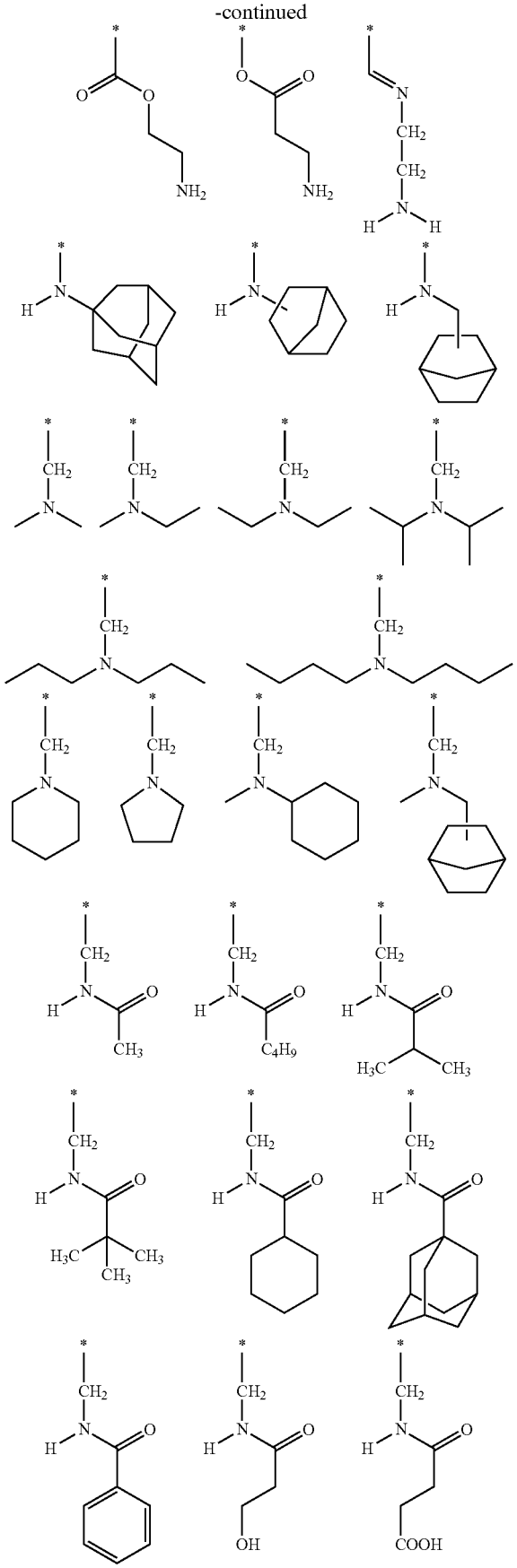

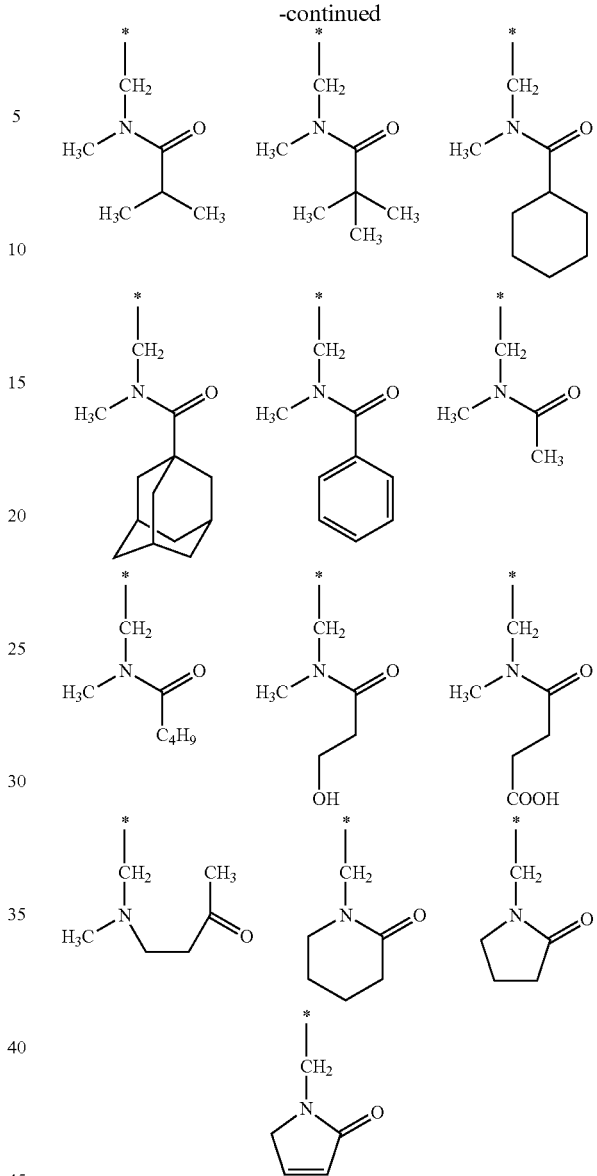

Examples of the polymer having the amino group include polyallylamine, polyethyleneimine, polyvinyl pyridine, polyvinyl imidazole, polypyrimidine, polytriazole, polyquinoline, polyindole, polypurine, polyvinyl pyrrolidone, and polybenzimidazole.

Examples of the preferred form of the basic polymer include polymers having the repeating unit represented by Formula (2).

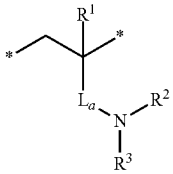

Formula (2)

In Formula (2), $R^1$ represents a hydrogen atom or an alkyl group. The number of carbon atoms included in the alkyl group is not particularly limited, but, in view of making the effect of the invention more excellent, the number of carbon atoms is preferably 1 to 4 and more preferably 1 to 2.

Each of $R^2$ and $R^3$ independently represents a hydrogen atom, an alkyl group that may contain a heteroatom, a cycloalkyl group that may contain a heteroatom, or an aromatic group that may contain a heteroatom.

The numbers of carbon atoms included in the alkyl group and the cycloalkyl group are not particularly limited, but the number of carbon atoms is preferably 1 to 20 and more preferably 1 to 10.

Examples of the aromatic group include an aromatic hydrocarbon, and an aromatic heterocyclic group.

A heteroatom may be included in the alkyl group, the cycloalkyl group, or the aromatic group. The definition and the preferred form of a heteroatom are the same as those of the heteroatom described in Formula (1-1) above.

Substituents (for example, functional group such as hydroxyl group, cyano group, amino group, pyrrolidino group, piperidino group, morpholine group, or oxo group, alkoxy group, or halogen atom) may be included in the alkyl group, the cycloalkyl group, and the aromatic group.

$L_a$ represents a divalent linking group. The definition of the divalent linking group represented by $L_a$ is the same as that of L represented by in Formula (1-2) described above.

Among them, in view of making the effect of the invention more excellent, as $L_a$, an alkylene group, an arylene group, and —COO—, and a group obtained by combining two or more types thereof (-arylene group-alkylene group-, —COO-alkylene group-, and the like) are preferable, and an alkylene group is more preferable.

A substituent (for example, hydroxyl group) may be further substituted with the groups represented by $R^1$ to $R^3$ described above and the divalent linking group represented by $L_a$.

Hereinafter, the repeating unit represented by Formula (2) is exemplified.

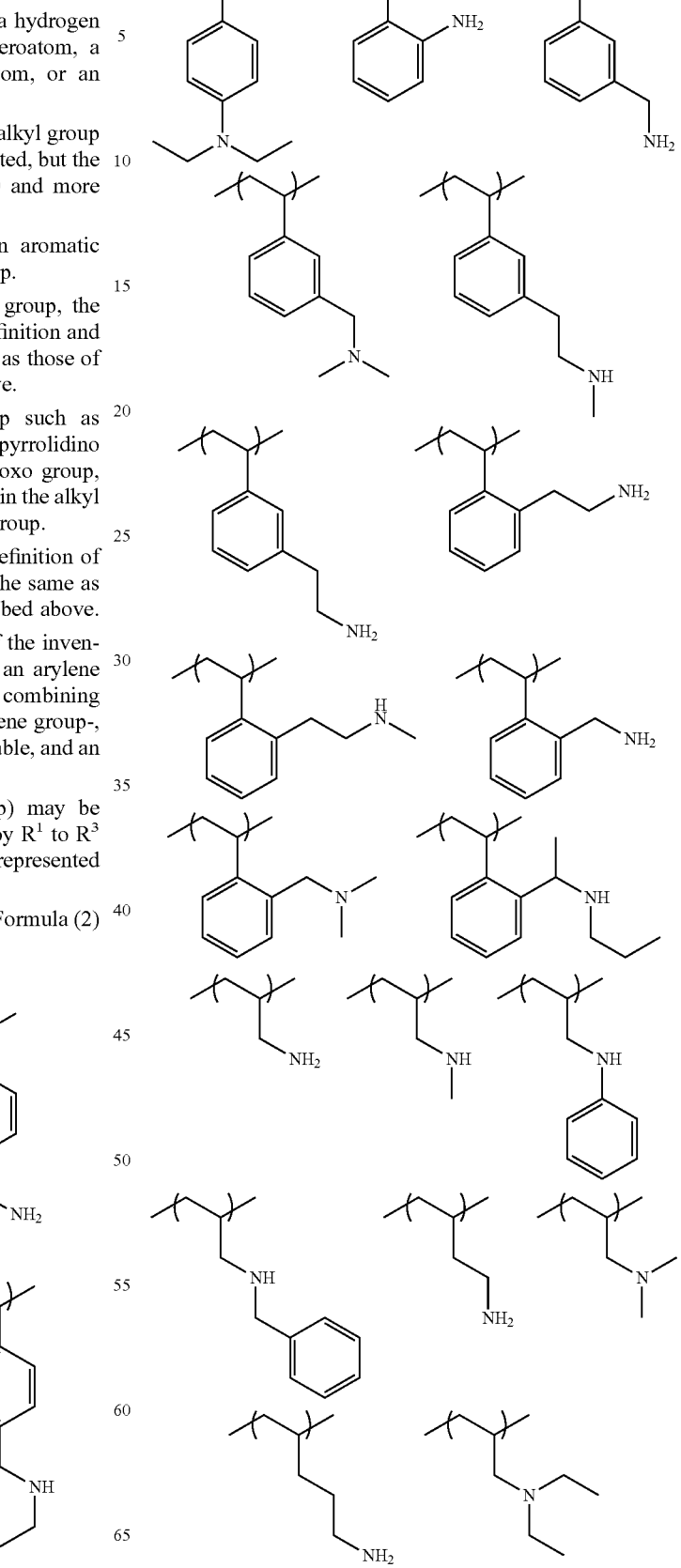

-continued

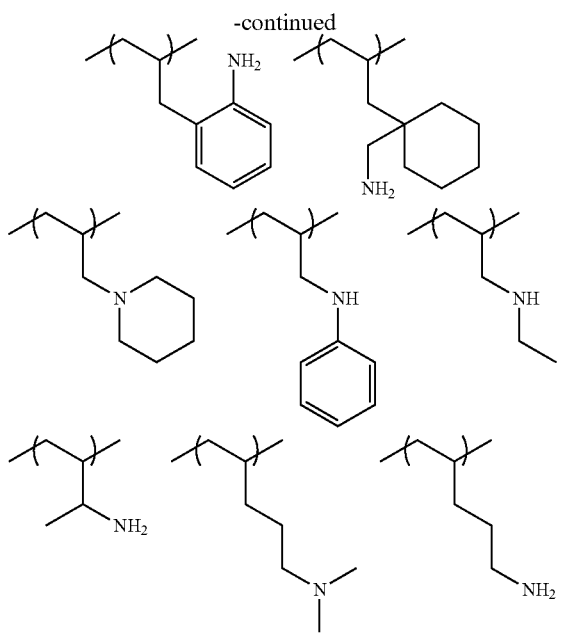

The content of the repeating unit represented by Formula (2) described above in the polymer is not particularly limited, but, in view of making the effect of the invention more excellent, the content is preferably 40 mol % to 100 mol % and more preferably 70 mol % to 100 mol % with respect to the entire repeating units in the polymer.

Another repeating unit in addition to the repeating unit represented by Formula (2) may be included in the polymer.

The weight average molecular weight of the polymer having an amino group is not particularly limited, but, in view of making the effect of the invention more excellent, the weight average molecular weight is preferably 1,000 to 30,000 and more preferably 1,000 to 10,000.

(Phosphorus-Based Compound)

The phosphorus-based compound is a compound including "—P< (phosphorus atom)". An onium salt compound is not included in the phosphorus-based compound. The phosphorus-based compound mainly forms an interaction between the phosphorus atom in the compound and the polar group. For example, in the case where the polar group is a carboxyl group, the polar group interacts with a phosphorus atom in a phosphorus-based compound, to form a salt.

At least one phosphorus atom may be included in the phosphorus-based compound, and plural (two or more) phosphorus atoms may be also included.

The molecular weight of the phosphorus-based compound is not particularly limited, but, in order to make the effect of the invention more excellent, the molecular weight is preferably 70 to 500 and more preferably 70 to 300.

Together with the component (hereinafter, referred to as a component X) such as the nitrogen-containing compound, a component (hereinafter, referred to as a component Y) that suppresses the volatilization of this component X (particularly, a nitrogen-containing compound) may be caused to come into contact with the exposed film obtained in Step (2). If the component Y is used, the volatilization of the component X can be suppressed, such that device contamination can be prevented.

Examples of a method of causing the component Y to come into contact with the exposed film obtained in Step (2) include a method of causing a treating agent including the component X, the component Y, and a solvent that is not substantially dissolved in the exposed film and the exposed film obtained in Step (2) to come into contact with each other.

The component Y is not particularly limited, as long as the component Y is a component that can suppress the volatilization of the component X. However, the component Y is preferably a hydrophobic resin, since the component Y is unevenly distributed on the upper surface of the layer formed when the resist film is coated, and particularly the volatilization of the component X (particularly, the nitrogen-containing compound) is suppressed. In addition, if the component Y is a hydrophobic resin, an advantage in that developing properties (removing properties) of the organic solvent development is favorable can be expected.

Examples of the hydrophobic resin include the hydrophobic resin (D) described above.

[Step (4): Developing Step]

Step (4) is a step of developing the exposed film by using a developer including an organic solvent and removing an area of the film with a small exposure amount, so as to form a pattern. In this step, the area (preferably, an unexposed area) with a small exposure amount is dissolved by the developer, so as to form a so-called negative pattern. The expression "an area with a small exposure amount" means an unexposed area and an area which is exposed only in a degree of being dissolved in a developer including an organic solvent. Examples of the area exposed only in a degree of being dissolved in a developer including an organic solvent include a portion (near an interface of an area that is intended to be exposed) near an area that is intended to be exposed in an area that is not intended to be exposed.

Hereinafter, first, the developer used in this step is described, and a sequence of this step is described thereafter.

In this step, a developer (hereinafter, appropriately referred to as an "organic developer") including an organic solvent is used.

In the developer used in this step, an organic solvent is included as a main component. The main component means that a content of an organic solvent is greater than 50 mass % with respect to a total amount of a developer.

The organic solvent contained in the organic developer is not particularly limited, but examples thereof include polar solvents such as a ketone solvent, an ester solvent, an alcohol solvent, an amide solvent, and an ether solvent, and a hydrocarbon solvent. A solvent obtained by mixing these may be used.

Examples of the ketone solvent include 1-octanone, 2-octanone, 1-nonane, 2-nonane, acetone, 2-heptanone (methyl amyl ketone), 4-heptanone, 1-hexanone, 2-hexanone, diisobutylketone, cyclohexanone, methylcyclohexanone, phenylacetone, methyl ethyl ketone, methyl isobutyl ketone, acetylacetone, acetonylacetone, ionone, diacetonyl alcohol, acetylcarbinol, acetophenone, methyl naphthyl ketone, isophorone, and propylene carbonate.

Examples of the ester solvent include methyl acetate, butyl acetate, ethyl acetate, isopropyl acetate, pentyl acetate, isopentyl acetate, amyl acetate, propylene glycol monomethyl ether acetate, ethylene glycol monoethyl ether acetate, diethylene glycol monobutyl ether acetate, diethylene glycol monoethyl ether acetate, ethyl-3-ethoxypropionate, 3-methoxybutyl acetate, 3-methyl-3-methoxybutyl acetate, methyl formate, ethyl formate, butyl formate, propyl formate, ethyl lactate, butyl lactate, and propyl lactate.

Examples of an alcohol solvent include an alcohol such as methyl alcohol, ethyl alcohol, n-propyl alcohol, isopropyl alcohol, n-butyl alcohol, sec-butyl alcohol, tert-butyl alcohol, isobutyl alcohol, n-hexyl alcohol, n-heptyl alcohol, n-octyl alcohol, and n-decanol, a glycol solvent such as ethyleneglycol, diethyleneglycol, and triethyleneglycol, or a glycol ether solvent such as ethylene glycol monomethyl ether, propylene glycol monomethyl ether, ethylene glycol monoethyl ether, propylene glycol monoethyl ether, diethylene glycol monoethyl ether, triethylene glycol monoethyl ether, and methoxymethyl butanol.

Examples of the ether solvent include dioxane and tetrahydrofuran in addition to the glycol ether solvents described above.

As the amide solvent, for example, N-methyl-2-pyrrolidone, N,N-dimethylacetamide, N,N-dimethylformamide, hexamethylphosphoric triamide, and 1,3-dimethyl-2-imidazolidinone can be used.

Examples of the hydrocarbon solvent include an aromatic hydrocarbon solvent such as toluene and xylene, and an aliphatic hydrocarbon solvent such as pentane, hexane, octane, and decane.

Particularly, the organic developer is preferably a developer that contains at least one type of organic solvent selected from the group consisting of a ketone solvent and an ester solvent, and particularly, a developer including butyl acetate as an ester solvent and methyl amyl ketone (2-heptanone) as a ketone solvent is preferable.

Plural types of the organic solvents may be used in a mixture, or the organic solvents may be used in a mixture with an organic solvent except for the organic solvents described above or water. However, in order to sufficiently exhibit the effect of the invention, the water content ratio in the total developer is preferably less than 10 mass % and it is more preferable that moisture is not substantially contained.

That is, the usage amount of the organic solvent to the organic developer is preferably 90 mass % or greater and 100 mass % or less and more preferably 95 mass % or greater and 100 mass % or less with respect to the total amount of the organic developer.

The vapor pressure of the organic developer is preferably 5 kPa or lower, more preferably 3 kPa or lower, and particularly preferably 2 kPa or lower at 20° C. If the vapor pressure of the organic developer is 5 kPa or lower, evaporation on the substrate of the developer or in the developing cup is suppressed, the evenness in temperature on the wafer surface is enhanced, and resultantly the evenness in dimension on the wafer surface is enhanced.

A proper amount of the surfactant can be added to the organic developer, if necessary.

The surfactant is not particularly limited, but, for example, ionic or nonionic fluorine and/or silicon-based surfactants and the like can be used. Examples of these fluorine and/or silicon-based surfactants include surfactants disclosed in JP1987-36663A (JP-S62-36663A), JP1986-226746A (JP-S61-226746A), JP1986-226745A (JP-S61-226745A), (JP1987-170950A (JP-S62-170950A), JP1988-34540A (JP-S63-34540A), JP1995-230165A (JP-H07-230165A), JP1996-62834A (JP-H08-62834A), JP1997-54432A (JP-H09-54432A), JP1997-5988A (JP-H09-5988A), U.S. Pat. Nos. 5,405,720A, 5,360,692A, 5,529,881A, 5,296,330A, 5,436,098A, 5,576,143A, 5,294,511A, and 5,824,451A, and these fluorine and/or silicon-based surfactants are preferably nonionic surfactants. The nonionic surfactant is not particularly limited, but it is more preferable to use the fluorine-based surfactant or the silicon-based surfactant.

The usage amount of the surfactant is generally 0.001 mass % to 5 mass %, more preferably 0.005 mass % to 2 mass %, and even more preferably 0.01 mass % to 0.5 mass % with respect to the total amount of the developer.

In the pattern forming method according to the invention, in Step (4) (developing step), an organic developer to which a "component" (basic organic compound or the like) described in Step (3) is added may be used. With respect to this embodiment, specifically, JP2013-011833A is referred to.

Meanwhile, in view of making the effect of the invention more secure, it is preferable that the organic developer does not substantially contain a "component" described in Step (3) (specifically, the concentration of the "component" is preferably 0.01 mass % or less).

(Developing Method)

As the developing method in this step, for example, a method of immersing a substrate for a certain period of time in a tank filled with the developer (dipping method), a method of performing development by raising the developer onto the substrate surface by the surface tension and resting the developer for a certain period of time (paddle method), a method of spraying the developer on the substrate surface (spraying method), a method of continuously discharging a developer while scanning a developer discharging nozzle at a certain speed on a substrate rotating at a certain speed (dynamic dispensing method), and the like can be applied.

In the case where the various developing methods above include a step of discharging the developer from a development nozzle of a developing apparatus to a resist film, the discharging pressure of the discharged developer (flow velocity per unit area of the discharged developer) is, for example, preferably 2 mL/sec/mm$^2$ or slower, more preferably 1.5 mL/sec/mm$^2$ or slower, and even more preferably 1 mL/sec/mm$^2$ or slower. The lower limit of the flow velocity is not particularly limited, but, considering the throughput, the flow velocity is preferably 0.2 mL/sec/mm$^2$ or faster.

Details thereof are disclosed in JP2010-232550A, particularly in paragraphs "0022" to "0029".

After the step of performing development by using the developer including the organic solvent, a step of stopping the development while substituting a developer to another solvent may be performed.

[Other Steps]

In the pattern forming method according to the invention, other steps in addition to Steps (1) to (4) described above may be included.

(Step (5): Alkali Developing Step)

For example, between Steps (3) and (4), or after Step (4), Step (5) of developing an exposed film by using an alkali developer may be described. If this step is performed, an area with a large exposure amount is dissolved by the developer. If Steps (4) and (5) are performed, patterns with shorter pitches can be formed.

An alkaline developer used in Step (5) is an aqueous alkaline solution including alkali.

Types of the aqueous alkaline solution are not particularly limited, but examples thereof include aqueous alkaline solutions including quaternary ammonium salt represented by tetramethylammonium hydroxide, inorganic alkali, primary amine, secondary amine, tertiary amine, alcoholamine, and cyclic amine. Among these, an aqueous solution of a quaternary ammonium salt represented by tetramethylammonium hydroxide is preferable.

An appropriate amount of alcohols or a surfactant may be added to the aqueous alkaline solution to be used. Specific examples and usage amounts of the surfactant are the same as the organic developer described above.

The alkaline concentration of the aqueous alkaline solution is generally 0.1 mass % to 20 mass %.

pH of the aqueous alkaline solution is generally 10.0 to 15.0.

The developing sequence of this step is the same as the sequence in Step (4) described above.

(Rinse Treatment)

After Step (4) (or Step (5)), it is preferable to perform washing by using the rinse liquid, if necessary.

The rinse liquid is not particularly limited as long as the rinse liquid does not dissolve the resist film, and liquid including a general organic solvent can be used.

The rinse liquid is preferably a rinse liquid containing at least one type of organic solvents selected from the group consisting of a hydrocarbon solvent, a ketone solvent, an ester solvent, an alcohol solvent, an amide solvent, and an ether solvent, more preferably a rinse liquid containing at least one type of organic solvents selected from the group consisting of a ketone solvent, an ester solvent, an alcohol solvent, and an amide solvent, even more preferably a rinse liquid containing an alcohol solvent or an ester solvent, particularly preferably a rinse liquid containing an monovalent alcohol, and most preferably a rinse liquid containing an monovalent alcohol having 5 or more carbon atoms.

Specific examples of the hydrocarbon solvent, the ketone solvent, the ester solvent, the alcohol solvent, the amide solvent, and the ether solvent are the same as those of the organic developer described above.

Examples of the monovalent alcohol include linear, branched, or cyclic monovalent alcohols, and specific examples thereof include 1-hexanol, 2-hexanol, 4-methyl-2-pentanol, 1-pentanol, and 3-methyl-1-butanol.

The rinse liquid may be rinse liquid containing plural solvents. The rinse liquid may contain organic solvents other than those above.

The water content ratio of the rinse liquid is preferably 10 mass % or less, more preferably 5 mass % or less, and particularly preferably 3 mass % or less. If the water content ratio is 10 mass % or less, more favorable developing characteristics can be obtained.

The vapor pressure of the rinse liquid is preferably 0.05 kPa to 5 kPa, more preferably 0.1 kPa to 5 kPa, and most preferably 0.12 kPa to 3 kPa at 20° C. If the vapor pressure of the rinse liquid is 0.05 kPa to 5 kPa, the evenness in temperature on the wafer surface is enhanced, and further the swelling caused by the penetration of the rinse liquid is suppressed such that the evenness in dimension on the wafer surface is enhanced.

A proper amount of the surfactant may be added to the rinse liquid, to be used. Specific examples and the usage amount of the surfactant are the same as those in the organic developer described above.

In the rinse treatment, the washing treatment is performed on the wafer subjected to the organic solvent development by using the rinse liquid. The method of the washing treatment is not particularly limited, but, for example, a method of continuously discharging the rinse liquid to the substrate rotating at a certain speed (spin coating method), a method of immersing a substrate for a certain period of time in a tank filled with the rinse liquid (dipping method), and a method of spraying a rinse liquid to a substrate surface (spraying method) can be applied. Among them, a method of performing a washing treatment by the spin coating method, rotating the substrate at the number of revolutions of 2,000 rpm to 4,000 rpm after the washing, and removing the rinse liquid from the substrate is preferable. A method of performing a baking treatment (Post Bake) after a rinse treatment is preferable. By the baking treatment, the developer and the rinse liquid remaining between patterns and in a pattern are removed. The baking treatment after the rinse treatment is performed generally at 40° C. to 160° C., preferably at 70° C. to 95° C., generally for 10 seconds to 3 minutes, and preferably for 30 seconds to 90 seconds.

In view of the application to manufacturing of electronic devices, with respect to a resist solvent, a solvent of a treating agent, a developer, and/or a rinse liquid, it is preferable to use ones in which various impurities or metal powder are sufficiently decreased. With respect to metal elements, all concentrations of metal elements such as Na, K, Ca, Fe, Cu, Mg, Mn, Li, Al, Cr, Ni, and Zn are preferably 10 ppm or less and more preferably 5 ppm or less.

In addition, with respect to the resist composition itself and the treating agent itself, it is obvious that impurities and metal powder are decreased in the entire resist composition and the a treating agent by using solvents in which metal powder or the like is decreased and decreasing metal powder or the like derived from other components.

In order to prevent the degradation of the entire components, with respect to a resist solvent, a solvent of a treating agent, a developer, and/or a rinse liquid, the content of peroxide is preferably 0.8 mmol/L or less and it is preferable that peroxide is not substantially included.

The invention also relates to a method for manufacturing an electronic device including the pattern forming method according to the invention described above and an electronic device manufactured by the manufacturing method.

It is preferable that the electronic device according to the invention is mounted on electric and electronic apparatuses (household electrical appliances, OA and media related devices, optical apparatuses, communication equipment, and the like).

The pattern formed by the method according the invention is typically used as a mask in an etching step in the manufacturing of the semiconductor, but the pattern can be used in other uses. Examples of the other uses include the forming of a guide pattern in Directed Self-Assembly (DSA) (see ACS Nano Vol. 4 No. 8 Pages 4815 to 4823), and a use as a so-called a core of a spacer process (see JP1991-270227A (JP-H03-270227A) and JP2013-164509A).

EXAMPLES

Hereinafter, examples are provided, but the invention is not limited thereto.

<Manufacturing of Composition (Composition for Forming Resist Film)>

A composition for forming a resist film was manufactured by dissolving a component shown in Table 1 below in a solvent shown in Table 1. The ratio of solvent in Table 1 below means a mass ratio. In the case where there are descriptions in both sections of "Type 1" and "Type 2" in the section of an "acid generator" and the section of a "basic compound", the descriptions mean that two types are used.

TABLE 1

| Resist | Resin Type | Resin mass/g | Acid generator Type 1 | Acid generator mass/g of Type 1 | Acid generator Type 2 | Acid generator mass/g of Type 2 | Basic compound Type 1 | Basic compound mass/g of Type 1 |
|---|---|---|---|---|---|---|---|---|
| Ar-01 | P-1 | 10 | PAG-1 | 0.5 | | | Q-1 | 0.1 |
| Ar-02 | P-2 | 10 | PAG-2 | 1.2 | | | Q-2 | 0.3 |
| Ar-03 | P-3 | 10 | PAG-3 | 0.35 | PAG-2 | 0.35 | Q-3 | 0.12 |
| Ar-04 | P-4 | 10 | PAG-4 | 1 | | | Q-4 | 0.05 |
| Ar-05 | P-5 | 10 | PAG-5 | 0.7 | | | Q-5 | 0.1 |
| Ar-06 | P-6 | 10 | PAG-6 | 2 | | | Q-1 | 0.2 |
| Ar-07 | P-7 | 10 | PAG-7 | 0.7 | | | Q-2 | 0.05 |
| Ar-08 | P-8 | 10 | PAG-1 | 0.5 | PAG-6 | 1.2 | Q-3 | 0.05 |

| Resist | Basic compound Type 2 | Basic compound mass/g of Type 2 | Additive Type | Additive mass/g | Solvent Type | Solvent Ratio | Solid content concentration/ wt % |
|---|---|---|---|---|---|---|---|
| Ar-01 | | | N-1 | 0.05 | SL-1/SL-2 | 70/30 | 3 |
| Ar-02 | | | N-2 | 0.05 | SL-1/SL-2 | 70/30 | 3 |
| Ar-03 | | | N-3 | 0.05 | SL-1/SL-2 | 70/30 | 3 |
| Ar-04 | | | N-1 | 0.05 | SL-1/SL-2/SL-3 | 70/28/2 | 3 |
| Ar-05 | | | N-1 | 0.05 | SL-1/SL-2/SL-4 | 70/27/3 | 3 |
| Ar-06 | | | N-1 | 0.05 | SL-1/SL-3 | 90/10 | 3 |
| Ar-07 | Q-3 | 0.2 | N-1 | 0.05 | SL-1/SL-3 | 90/10 | 3 |
| Ar-08 | Q-4 | 0.2 | N-1 | 0.05 | SL-1/SL-3 | 70/30 | 3 |

Various components in Table 1 used are collectively shown below.

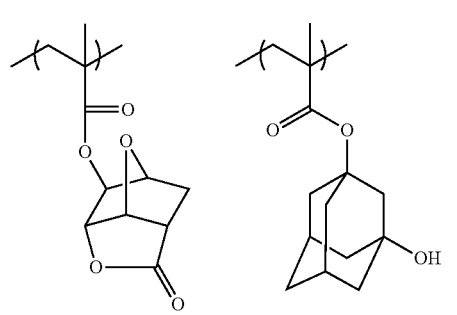

P-1

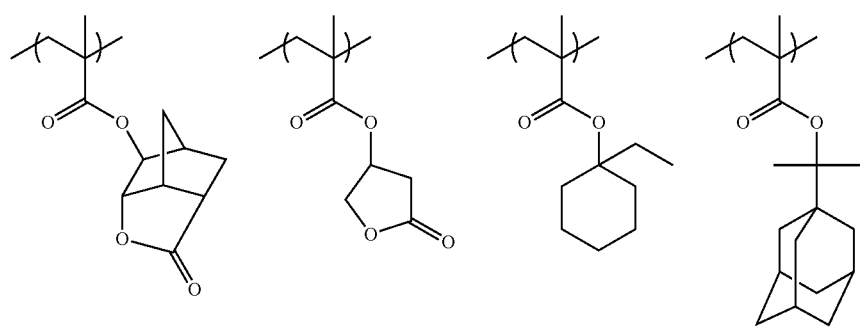

P-2

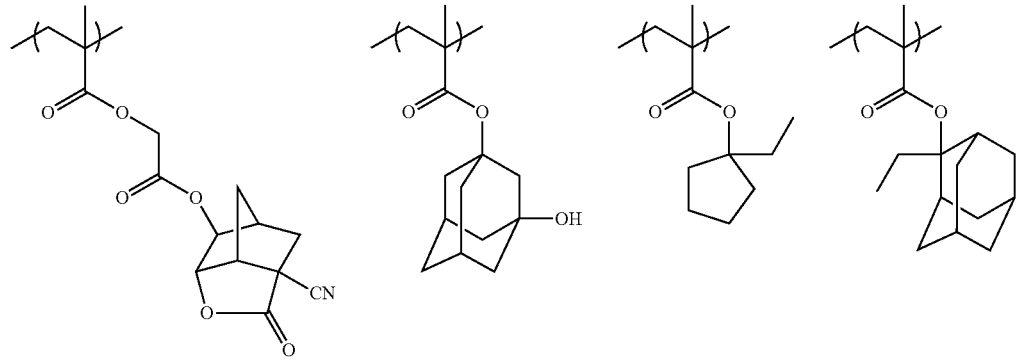
P-3
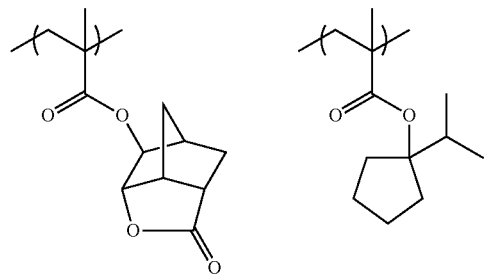
P-4
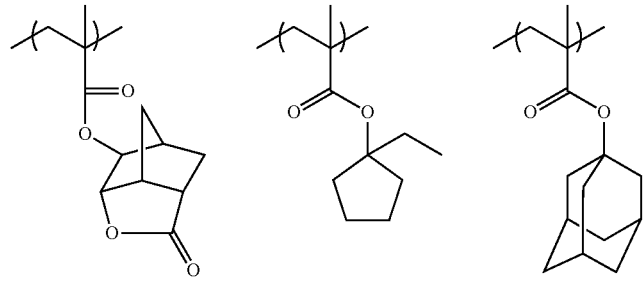
P-5
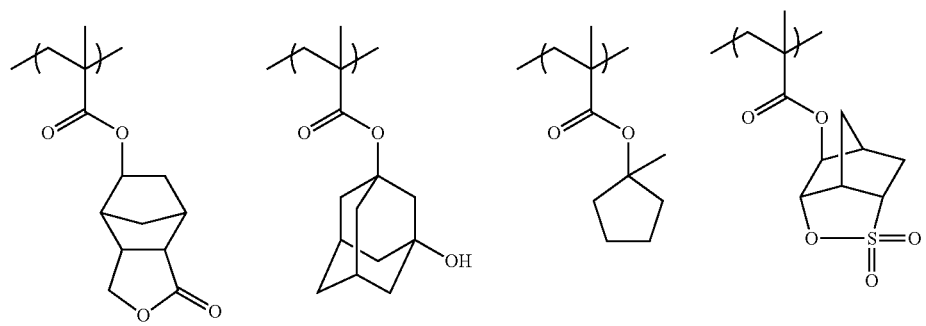
P-6
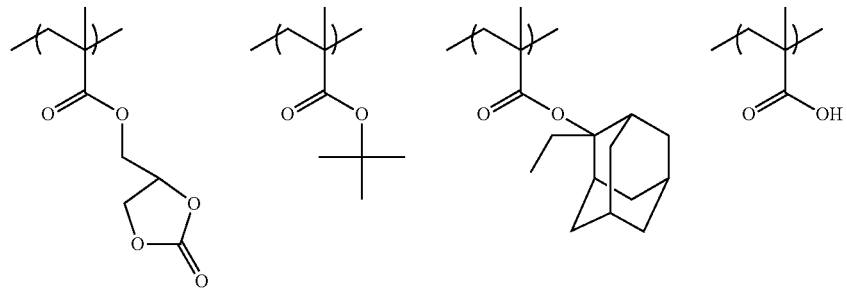
P-7

P-8
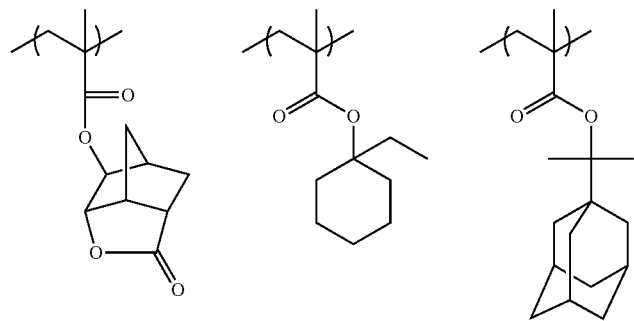
TABLE 2
| Resin | Composition ratio | Mw | Pd(Mw/Mn) |
|---|---|---|---|
| P-1 | 30/10/60 | 12000 | 1.6 |
| P-2 | 20/20/80/10 | 8000 | 1.5 |
| P-3 | 35/20/35/10 | 8000 | 1.7 |
| P-4 | 40/60 | 15000 | 2.0 |
| P-5 | 45/50/5 | 12000 | 2.1 |
| P-6 | 20/10/50/20 | 7000 | 1.5 |
| P-7 | 60/30/5/5 | 12000 | 1.8 |
| P-8 | 40/40/20 | 22000 | 2.2 |
In Table 2, composition ratios indicate molar ratios of repeating unit included in the resin P-1 to P-8 described above, the composition ratios of the repeating units in the chemical formulae above are shown in an order from the left.
PAG-1
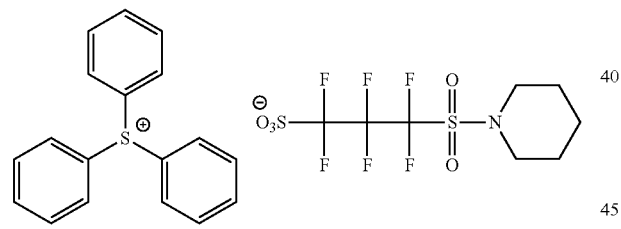
PAG-2
PAG-3
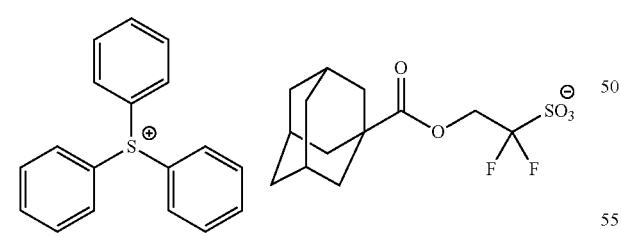
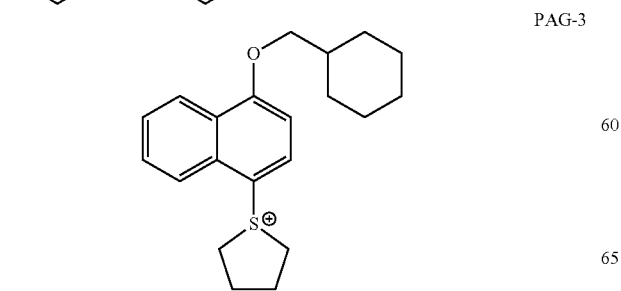
-continued
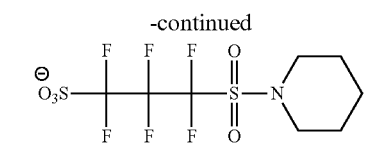
PAG-4
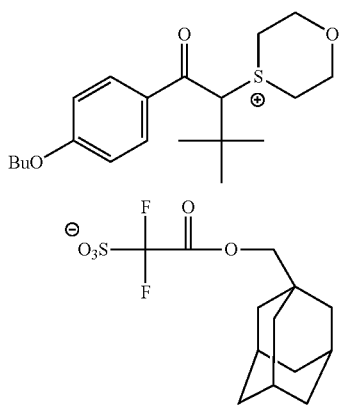
PAG-5
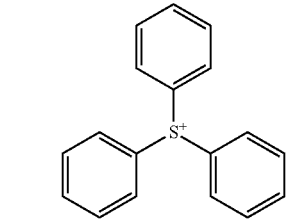
PAG-6

-continued

PAG-7

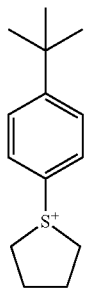 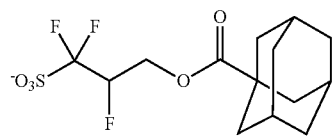

Q-1

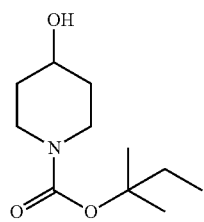

Q-2

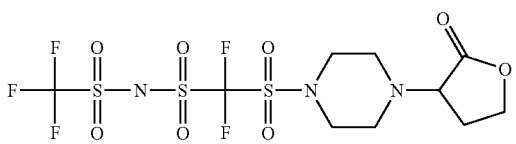

Q-3

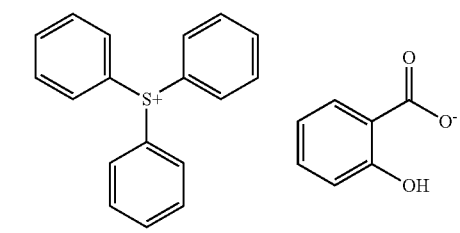

Q-4

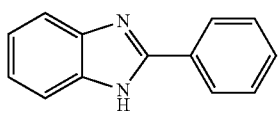

Q-5

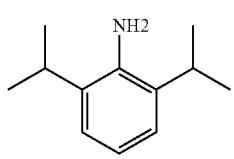

-continued

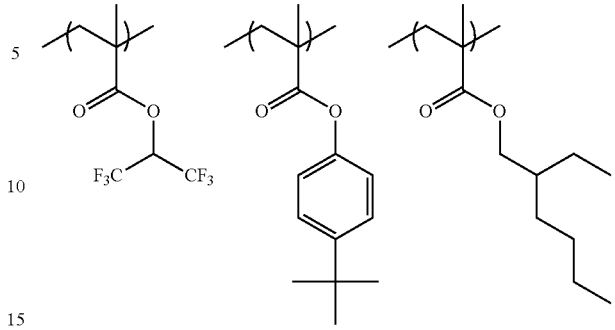

TABLE 3

| Resin | Composition ratio | Mw | Pd(Mw/Mn) |
|---|---|---|---|
| N-1 | 40/20/40 | 4000 | 1.6 |
| N-2 | 50/50 | 6000 | 1.5 |
| N-3 | 30/65/5 | 15000 | 2 |

In Table 3, composition ratios indicate molar ratios of repeating units included in the resins N-1 to N-3 above, the composition ratios of the repeating units in the chemical formulae above are shown in an order from the left.

As the solvent, ones below are used.

SL-1: Propylene glycol monomethylether acetate (PG-MEA)
SL-2: Propylene glycol monomethylether (PGME)
SL-3: Cyclohexanone
SL-4: γ-butyrolactone Examples and Comparative Examples A silicon wafer was coated with an organic antireflection coating material ARC29SR (manufactured by Nissan Chemical Industries, Ltd.), and baking was performed for 60 seconds at 205° C. The coated silicon wafer was coated with a composition for forming a resist film disclosed in Table 1, and baking was performed at 90° C. for 60 seconds. Accordingly, a resist film having a film thickness of 85 nm was formed.

Pattern exposure was performed on the obtained resist film by using an ArF excimer laser liquid immersion scanner (XT1700i manufactured by ASML, NA1.20, C-Quad, outer sigma 0.960, inner sigma 0.709, XY inclination). As a reticle, a 6% halftone mask in which line:space=1:1 was used. As a liquid immersion liquid, ultrapure water was used.

Thereafter, after baking (Post Exposure Bake; PEB) was performed at 90° C. for 60 seconds, cooling was performed to room temperature.

Subsequently, while a substrate on which a resist film was positioned was rotated for 20 seconds at 100 rpm, a treating agent shown in Table 4 was supplied to the resist film, such that the treating agent and the resist film were caused to come into contact with each other. Thereafter, a resist film was developed with n-butyl acetate for 30 seconds. Thereafter, a resist pattern with lines and spaces (L/S) of 1:1 was obtained by rotating the wafer at a rotation speed of 4,000 rpm for 30 seconds.

In the case where treating agents of Comparative Examples R-15 to 17 were used, instead of a step "while a substrate on which a resist film was positioned was rotated for 20 seconds at 100 rpm, a treating agent shown in Table 4 was supplied to the resist film, such that the treating agent and the resist film were caused to come into contact with each other. Thereafter, a resist film was developed with n-butyl acetate for 30 seconds. Thereafter, the wafer was rotated at a rotation speed of 4,000 rpm for 30 seconds," a step "the resist film was subjected to puddle development for 30 seconds by using a treating agent shown in Table 4, and was rinsed with 4-methyl-2-pentanol for 7 seconds. Thereafter, a wafer was rotated for 30 seconds at a rotation speed of 4,000 rpm" was performed. That is, embodiments in which Comparative Examples R-15 to 17 were used correspond to embodiments in which development was performed by using a treating agent, as disclosed in JP50569749B.

In Example 21 described below, a pattern was formed in the sequence below, so as to perform various kinds of evaluation.

Example 21

A silicon wafer was coated with the organic antireflection coating material ARC29SR (manufactured by Nissan Chemical Industries, Ltd.), and baking was performed at 205° C. for 60 seconds. The coated silicon wafer was coated with the composition for forming a resist film shown in Table 1, and baking was performed at 90° C. for 60 seconds. Accordingly, a resist film having a film thickness of 85 nm was formed.

Pattern exposure was performed on the obtained resist film by using an ArF excimer laser liquid immersion scanner (XT1700i manufactured by ASML, NA1.20, C-Quad, outer sigma 0.960, inner sigma 0.709, XY inclination). As a reticle, a 6% halftone mask in which line:space=1:1 was used. As a liquid immersion liquid, ultrapure water was used.

Thereafter, after baking (Post Exposure Bake; PEB) was performed at 90° C. for 60 seconds, cooling was performed to room temperature.

Subsequently, while a substrate on which a resist film was positioned was coated with a treating agent R-14, such that a coating film having a film thickness of 80 nm was formed, such that the treating agent and the resist film were caused to come into contact with each other. Thereafter, a resist film was developed with n-butyl acetate for 30 seconds. Thereafter, a resist pattern with lines and spaces (L/S) of 1:1 was obtained by rotating the wafer at a rotation speed of 4,000 rpm for 30 seconds.

TABLE 4

| Treating agent | Component | Solvent | Component concentration wt % |
|---|---|---|---|
| R-1 | B-1 | S-1 | 2 |
| R-2 | B-2 | S-1 | 2 |
| R-3 | B-3 | S-1 | 2 |
| R-4 | B-4 | S-1 | 2 |
| R-5 | B-5 | S-1 | 2 |
| R-6 | B-6 | S-1 | 2 |
| R-7 | B-7 | S-1 | 2 |
| R-8 | B-3 | S-1 | 5 |
| R-9 | B-3 | S-1 | 10 |
| R-10 | B-3 | S-2 | 2 |
| R-11 | B-3 | S-3 | 2 |
| R-12 | B-8 | S-1 | 2 |
| R-13 | B-3 | S-4 | 2 |
| R-14 | B-3/N-1 | S-1 | 0.3/3 |
| Comparative Example R-15 | B-3 | Butyl acetate | 2 |
| Comparative Example R-16 | B-3 | Butyl acetate | 10 |
| Comparative Example R-17 | B-1 | Butyl acetate | 2 |

N-1 used in R-14 above corresponds to the additive N-1 described above.

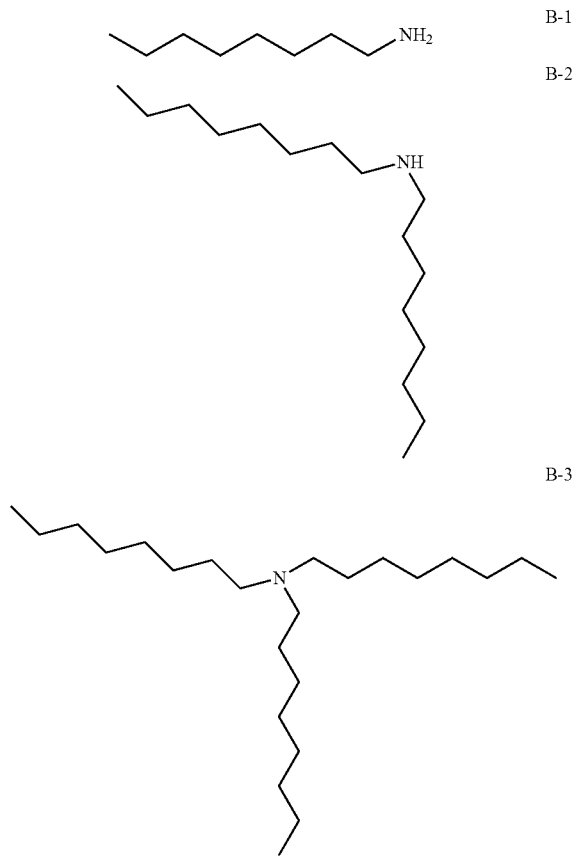

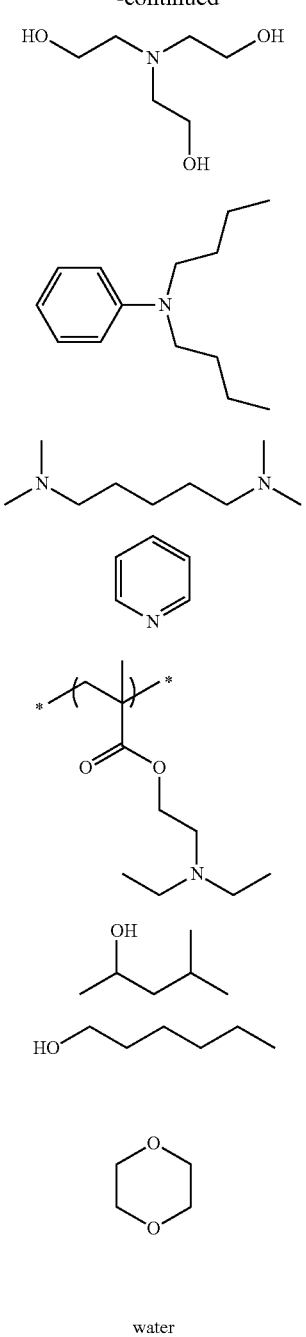

In the respective examples, S-1 to S-4 correspond to solvents that do not substantially dissolve the exposed resist film.

Treating agents R-1 to R-14 are treating agents that do not substantially dissolve the exposed resist film.

<Evaluation>

(Sensitivity)

Line and space patterns which were formed by the pattern forming method were observed by using a length measuring scanning electron microscope SEM; 5-9380II (manufactured by Hitachi, Ltd.), an exposure amount in which the pattern with 50 nm and L/S of 1:1 was formed was set to be an optimum exposure amount, such that this optimum exposure amount was set to be sensitivity ($mJ/cm^2$). As an obtained value is smaller, the obtained value indicates sensitivity higher and thus favorable. Results of respective examples and comparative examples were collectively shown in Table 5.

In the "examples and comparative examples", line and space patterns formed when exposure was performed in the optimum exposure amount were observed by using a length measuring scanning electron microscope SEM; S-9380II (manufactured by Hitachi, Ltd.), fluctuation widths from the line width of 50 nm were evaluated, and values thereof were close to 0.

The fluctuation widths were calculated by measuring line widths at arbitrary 50 points or more in the formed pattern and subtracting 50 from values obtained by arithmetically averaging these line widths.

(Lithography Performances after Developer Preservation (Preservation Stability))

Patterns were formed in the same sequence as those of "examples and comparative examples" except for using the treating agents disclosed in Table 4 after being preserved in a thermostat tube of 60° C. for two weeks. At this point, line and space patterns formed when exposure was performed in the optimum exposure amount which was calculated in the evaluation above were observed by using a length measuring scanning electron microscope SEM; S-9380II (manufactured by Hitachi, Ltd.), fluctuation widths from the line width of 50 nm were evaluated. As values thereof were close to 0, the values indicate that preservation stability of the treating agent is higher and favorable. Results of respective examples and comparative examples are collectively shown in Table 5.

The fluctuation widths were calculated by measuring line widths at arbitrary 50 points or more in the formed pattern and subtracting 50 from values obtained by arithmetically averaging these line widths.

(Developing Time Dependency Evaluation)

Patterns were formed in the same sequence as those of "examples and comparative examples" except for changing developing time in n-butyl acetate from 30 seconds to 10 seconds. At this point, line and space patterns formed when exposure was performed in the optimum exposure amount which was calculated in the evaluation above were observed by using a length measuring scanning electron microscope SEM; S-9380II (manufactured by Hitachi, Ltd.), fluctuation widths from the line width of 50 nm were evaluated. As values thereof are close to 0, the line width changes caused by developing time fluctuation are smaller and favorable. Results of respective examples and comparative examples are collectively shown in Table 5.

The fluctuation widths were calculated by measuring line widths at arbitrary 50 points or more in the formed pattern and subtracting 50 from values obtained by arithmetically averaging these line widths.

In the case where treating agents of Comparative Examples R-15 to 17 were used, patterns were formed in the same sequence as above except for changing puddle development for 30 seconds to puddle development for 10 seconds, so as to evaluate the fluctuation widths.

The evaluation results above were collectively shown in Table 5 below.

TABLE 5

| Examples and comparative examples | Type of composition | Type of treating agent | Sensitivity | Preservation stability (Δnm) | Developing time dependency (Δnm) |
|---|---|---|---|---|---|
| 1 | Ar-02 | R-1 | 35 | <0.5 | 2.5 |
| 2 | Ar-02 | R-2 | 34 | <0.5 | 1.8 |
| 3 | Ar-02 | R-3 | 32 | <0.5 | 1.0 |
| 4 | Ar-02 | R-4 | 34 | <0.5 | 1.8 |
| 5 | Ar-02 | R-5 | 35 | <0.5 | 1.8 |
| 6 | Ar-02 | R-6 | 31 | <0.5 | 0.7 |
| 7 | Ar-02 | R-7 | 34 | <0.5 | 2.5 |
| 8 | Ar-02 | R-8 | 31 | <0.5 | 0.7 |
| 9 | Ar-02 | R-9 | 29 | <0.5 | 0.8 |
| 10 | Ar-02 | R-10 | 34 | <0.5 | 1.8 |
| 11 | Ar-02 | R-11 | 35 | <0.5 | 2.0 |
| 12 | Ar-01 | R-1 | 33 | <0.5 | 1.9 |
| 13 | Ar-03 | R-2 | 36 | <0.5 | 2.2 |
| 14 | Ar-04 | R-4 | 32 | <0.5 | 1.0 |
| 15 | Ar-05 | R-5 | 34 | <0.5 | 1.8 |
| 16 | Ar-06 | R-7 | 32 | <0.5 | 1.2 |
| 17 | Ar-07 | R-9 | 28 | <0.5 | 0.8 |
| 18 | Ar-08 | R-10 | 31 | <0.5 | 1.0 |
| 19 | Ar-02 | R-12 | 31 | <0.5 | 0.7 |
| 20 | Ar-02 | R-13 | 35 | <0.5 | 2.5 |
| 21 | Ar-02 | R-14 | 36 | <0.5 | 2.2 |
| Comparative Example 1 | Ar-02 | Comparative Example R-15 | 35 | 5 | 4.0 |
| Comparative Example 2 | Ar-02 | Comparative Example R-16 | 33 | 7 | 6.7 |
| Comparative Example 3 | Ar-02 | Comparative Example R-17 | 37 | 4 | 5.0 |

In Table 5, the expression "<0.5" means less than 0.5 nm.

As shown in Table 5, according to the pattern forming method of the invention, it was confirmed that desired effects were able to be obtained. Particularly, as understood from the comparison of Examples 1 to 3, as amine included in the treating agent, it was confirmed that excellent effects were able to be obtained in the sequence of tertiary amine, secondary amine, and primary amine. According to comparison of Examples 1 and 6, it was confirmed that more excellent effects were able to be obtained compared to the use of the polyvalent amine compound. According to comparison between Examples 5 and 7, it was conformed that more excellent effects were able to be obtained compared to the use of an alkylamine-based compound. As understood from Example 19, it was confirmed that more excellent effects were able to be obtained in the case where a polymer having a repeating unit represented by Formula (2) was used.

Meanwhile, in Comparative Examples 1 to 3 which were different from the pattern forming according to the invention, desired effects were not able to be obtained.

Example 22

A silicon wafer was coated with the organic antireflection coating material ARC29SR (manufactured by Nissan Chemical Industries, Ltd.), and baking was performed at 205° C. for 60 seconds. The coated silicon wafer was coated with a composition Ar-01 for forming a resist film shown in Table 1, and baking was performed at 90° C. for 60 seconds. Accordingly, a resist film having a film thickness of 85 nm was formed.

Pattern exposure was performed on the obtained resist film by using an ArF excimer laser liquid immersion scanner (XT1700i manufactured by ASML, NA1.20, C-Quad, outer sigma 0.960, inner sigma 0.709, XY inclination). As a reticle, a 6% halftone mask in which a pitch is 60 nm, and line:space=1:1 was used. As a liquid immersion liquid, ultrapure water was used.

Thereafter, after baking (Post Exposure Bake; PEB) was performed at 90° C. for 60 seconds, cooling was performed to room temperature. Subsequently, development was performed for 10 seconds by using a 2.38 mass % tetramethylammonium hydroxide (TMAH) aqueous solution and rinse was performed for 30 seconds.

Subsequently, the treating agent R-1 shown in Table 4 was caused to come into contact for 20 seconds by the spin coating method, and development was performed with n-butyl acetate for 30 seconds. Thereafter, a resist pattern with a half pitch of 30 nm and lines and spaces (L/S) of 1:1 was obtained by rotating the wafer at a rotation speed of 4,000 rpm for 30 seconds.

An exposure amount in which the line and space patterns with 30 nm and 1:1 were formed was set to be an optimum exposure amount, such that this optimum exposure amount was set to be sensitivity (mJ/cm$^2$). Line and space patterns formed when exposure was performed in the optimum exposure amount were observed by using a length measuring scanning electron microscope SEM; S-9380II (manufactured by Hitachi, Ltd.), fluctuation widths from the line width of 30 nm were evaluated, and values thereof were close to 0.

Subsequently, evaluation was performed by (lithography performances (preservation stability) after developer preservation) and (developing time dependency evaluation) described above. Results thereof were shown in the table below.

With respect to the preservation stability and the developing time dependency, fluctuation widths from the line width of 30 nm were evaluated.

The fluctuation widths were calculated by measuring line widths at arbitrary 50 points or more in the formed pattern and subtracting 30 from values obtained by arithmetically averaging these line widths.

TABLE 6

| Example (Double development) | Type of composition | Type of treating agent | Sensitivity | Preservation stability (Δnm) | Developing time dependency (Δnm) |
|---|---|---|---|---|---|
| | | | | Evaluation result | |
| 22 | Ar-02 | R-1 | 24 | <0.5 | 1.0 |

Example 23

A silicon wafer was coated with the organic antireflection coating material ARC29SR (manufactured by Nissan Chemical Industries, Ltd.), and baking was performed at 205° C. for 60 seconds. The coated silicon wafer was coated with a composition Ar-01 for forming a resist film shown in Table 1, and baking was performed at 90° C. for 60 seconds. Accordingly, a resist film having a film thickness of 85 nm was formed.

Pattern exposure was performed on the obtained resist film by using an ArF excimer laser liquid immersion scanner (XT1700i manufactured by ASML, NA1.20, C-Quad, outer sigma 0.960, inner sigma 0.709, inclination). As a reticle, a 6% halftone mask in which line:space=1:1 was used. As a liquid immersion liquid, ultrapure water was used.

Subsequently, the treating agent R-1 shown in Table 4 was caused to come into contact for 20 seconds by the spin coating method, and baking was performed at 100° C. for 60 seconds. Thereafter, development was performed with n-butyl acetate for 30 seconds. Thereafter, a resist pattern with lines and spaces (US) of 1:1 was obtained by rotating the wafer at a rotation speed of 4,000 rpm for 30 seconds.

Subsequently, the obtained patterns were evaluated by (lithography performances (preservation stability) after developer preservation) and (developing time dependency evaluation) described above. Results thereof were shown in the table below.

TABLE 7

| Example (with baking) | Type of composition | Type of treating agent | Sensitivity | Preservation stability (Δnm) | Developing time dependency (Δnm) |
|---|---|---|---|---|---|
| | | | | Evaluation result | |
| 23 | Ar-02 | R-1 | 33 | <0.5 | 2.0 |

In the above, examples are described, but the invention is not limited thereto. For example, with respect to the respective examples, the objects of the invention can be achieved in an embodiment in which the exposure by the ArF excimer laser was substituted with EUV exposure, an embodiment in which the resins (resins containing aromatic groups) exemplified as "the resins which can be suitably used at the time of EUV exposure or electron beam exposure" are used as the resin in the composition for forming a resist film.

EXPLANATION OF REFERENCES

10: substrate
12: film
14: pattern

What is claimed is:

1. A pattern forming method comprising, in this order:
   a step (1) of forming a film on a substrate by using an actinic ray-sensitive or radiation-sensitive resin composition containing at least a resin having a group that is decomposed due to an action of an acid so as to generate a polar group;
   a step (2) of exposing the film;
   a step (3) of causing the exposed film to come into contact with a component that performs any one interaction of an ionic bond, a hydrogen bond, a chemical bond, and a dipole interaction with a polar group generated in the exposed film without substantially dissolving the exposed film; and
   a step (4) of forming a pattern by developing the exposed film by using a developer including an organic solvent and removing an area of the film having a small exposure amount,
   wherein the area of the film having a small exposure is the area of an unexposed area and an area which is exposed only in a degree of being dissolved in a developer including an organic solvent.

2. The pattern forming method, according to claim 1, wherein the step (3) is a step of causing a treatment fluid including the component and a solvent that does not substantially dissolve the exposed film to come into contact with the exposed film.

3. The pattern forming method according to claim 2, wherein the solvent in the treatment fluid contains an alcohol-based solvent.

4. The pattern forming method according to claim 1, wherein the component is a basic organic compound.

5. The pattern forming method according to claim 1, wherein the component is a compound represented by Formula (3),

Formula (3)

wherein, in Formula (3), A represents a single bond or an n-valent organic group,
wherein B represents a single bond, an alkylene group, a cycloalkylene group, or an aromatic group, and the alkylene group, the cycloalkylene group, and the aromatic group may have substituents, wherein each of Rz's independently represents a hydrogen atom, an alkyl group that may include a hetero atom, a cycloalkyl group that may include a hetero atom, or an aromatic group that may include a hetero atom, wherein n represents an integer of 2 to 8, and wherein the plurality of B's may be identical to or different from each other, there is no case where both of A and B are single bonds, and the alkyl group, the cycloalkyl group, and the aromatic group may have substituents.

6. The pattern forming method according to claim 1, further comprising:

a step (5) of developing the exposed film by using an alkali developer between the step (3) and the step (4) or after the step (4).

7. A method for manufacturing an electronic device, comprising:

the pattern forming method according to claim 1.

8. The pattern forming method according to claim 1, wherein the component is a basic organic compound, and the pKa of its conjugate acid is 4 or greater.

* * * * *